United States Patent
Landry et al.

(10) Patent No.: US 8,263,861 B2
(45) Date of Patent: *Sep. 11, 2012

(54) FIBER DISTRIBUTION HUB WITH OUTSIDE ACCESSIBLE GROUNDING TERMINALS

(75) Inventors: Edward T. Landry, Brooklyn Park, MN (US); Craig M. Standish, Waconia, MN (US); Steve Anderson, Shakopee, MN (US); Joshua A. Zabel, Lester Prairie, MN (US); Ronald A. Beck, St. Paul, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/900,129

(22) Filed: Oct. 7, 2010

(65) Prior Publication Data

US 2011/0242735 A1    Oct. 6, 2011

Related U.S. Application Data

(63) Continuation of application No. 11/544,951, filed on Oct. 6, 2006, now Pat. No. 7,816,602, and a continuation-in-part of application No. 11/354,286, filed on Feb. 13, 2006, now Pat. No. 7,720,343.

(60) Provisional application No. 60/783,818, filed on Mar. 17, 2006.

(51) Int. Cl.
*H02G 3/08*    (2006.01)
*H05K 5/00*    (2006.01)

(52) U.S. Cl. ........... 174/50; 174/520; 174/17 R; 174/59; 220/3.2; 220/4.02; 361/601; 361/679.01; 361/752; 312/223.1

(58) Field of Classification Search .................... 174/50, 174/520, 17 R, 559, 51, 53, 57, 58, 500, 533, 174/535, 556; 220/3.2, 3.3, 3.8, 4.02; 361/600, 361/601, 679.01, 790, 797, 724, 730, 752, 361/796, 799, 753, 827, 800, 624, 637, 648, 361/807, 641; 312/223.1, 223.2, 223.3, 223.6
See application file for complete search history.

(56) References Cited

U.S. PATENT DOCUMENTS

| | | | |
|---|---|---|---|
| 4,736,100 | A | 4/1988 | Vastagh |
| 4,747,020 | A | 5/1988 | Brickley et al. |
| 4,792,203 | A | 12/1988 | Nelson et al. |

(Continued)

FOREIGN PATENT DOCUMENTS

DE    103 07 944 A1    9/2004

(Continued)

OTHER PUBLICATIONS

Second Office Action from Chinese Patent Application No. 20070005187.2; 10 pages.

(Continued)

*Primary Examiner* — Angel R Estrada
(74) *Attorney, Agent, or Firm* — Merchant & Gould P.C.

(57) ABSTRACT

The present disclosure relates to a telecommunications distribution hub having a cabinet that defines a primary compartment. The cabinet also includes one or more main doors for accessing the primary compartment. Telecommunications equipment is mounted within the primary compartment. The distribution hub further includes a secondary compartment that can be accessed from an exterior of the cabinet without accessing the primary compartment. A grounding interface is accessible from within the secondary compartment.

20 Claims, 38 Drawing Sheets

U.S. PATENT DOCUMENTS

| | | | |
|---|---|---|---|
| 4,824,196 | A | 4/1989 | Bylander |
| 4,861,134 | A | 8/1989 | Alameel et al. |
| 4,900,123 | A | 2/1990 | Barlow et al. |
| 4,948,220 | A | 8/1990 | Violo et al. |
| 4,995,688 | A | 2/1991 | Anton et al. |
| 5,023,646 | A | 6/1991 | Ishida et al. |
| 5,069,636 | A | 12/1991 | Shimirak et al. |
| 5,073,042 | A | 12/1991 | Mulholland et al. |
| 5,076,688 | A | 12/1991 | Bowen et al. |
| 5,136,463 | A | 8/1992 | Webster |
| 5,142,598 | A | 8/1992 | Tabone |
| 5,202,538 | A | 4/1993 | Skirpan |
| 5,214,735 | A | 5/1993 | Henneberger et al. |
| 5,233,674 | A | 8/1993 | Vladic |
| 5,274,729 | A | 12/1993 | King et al. |
| 5,274,731 | A | 12/1993 | White |
| 5,317,663 | A | 5/1994 | Beard et al. |
| 5,333,221 | A | 7/1994 | Briggs et al. |
| 5,333,222 | A | 7/1994 | Belenkiy et al. |
| 5,359,688 | A | 10/1994 | Underwood |
| 5,367,598 | A | 11/1994 | Devenish, III et al. |
| 5,402,515 | A | 3/1995 | Vidacovich et al. |
| 5,408,557 | A | 4/1995 | Hsu |
| RE34,955 | E | 5/1995 | Anton et al. |
| 5,420,958 | A | 5/1995 | Henson et al. |
| 5,442,726 | A | 8/1995 | Howard et al. |
| 5,448,015 | A | 9/1995 | Jamet et al. |
| 5,469,526 | A | 11/1995 | Rawlings |
| 5,497,444 | A | 3/1996 | Wheeler |
| 5,511,144 | A | 4/1996 | Hawkins et al. |
| 5,542,015 | A | 7/1996 | Hultermans |
| 5,602,723 | A | 2/1997 | Takahashi et al. |
| 5,647,043 | A | 7/1997 | Anderson et al. |
| 5,708,751 | A | 1/1998 | Mattei |
| 5,717,810 | A | 2/1998 | Wheeler |
| 5,734,774 | A | 3/1998 | Morrell |
| 5,734,776 | A | 3/1998 | Puetz |
| 5,758,003 | A | 5/1998 | Wheeler et al. |
| 5,764,844 | A | 6/1998 | Mendes |
| 5,774,612 | A | 6/1998 | Belenkiy et al. |
| 5,823,646 | A | 10/1998 | Arizpe et al. |
| 5,825,955 | A | 10/1998 | Ernst et al. |
| 5,883,995 | A | 3/1999 | Lu |
| 5,930,425 | A | 7/1999 | Abel et al. |
| 5,945,633 | A | 8/1999 | Ott et al. |
| 5,956,444 | A | 9/1999 | Duda et al. |
| 5,969,294 | A | 10/1999 | Eberle et al. |
| 6,027,252 | A | 2/2000 | Erdman et al. |
| 6,044,193 | A | 3/2000 | Szentesi et al. |
| 6,061,492 | A | 5/2000 | Strause et al. |
| 6,079,881 | A | 6/2000 | Roth |
| 6,149,315 | A | 11/2000 | Stephenson |
| 6,160,946 | A | 12/2000 | Thompson et al. |
| 6,169,249 | B1 | 1/2001 | Teachout et al. |
| 6,188,687 | B1 | 2/2001 | Mussman et al. |
| 6,188,825 | B1 | 2/2001 | Bandy et al. |
| 6,208,796 | B1 | 3/2001 | Williams Vigliaturo |
| 6,227,717 | B1 | 5/2001 | Ott et al. |
| 6,234,683 | B1 | 5/2001 | Waldron et al. |
| 6,236,795 | B1 | 5/2001 | Rodgers |
| 6,240,229 | B1 | 5/2001 | Roth |
| 6,271,484 | B1 | 8/2001 | Tokutsu |
| 6,278,829 | B1 | 8/2001 | BuAbbud et al. |
| RE37,489 | E | 1/2002 | Anton et al. |
| 6,347,888 | B1 | 2/2002 | Puetz |
| 6,356,697 | B1 | 3/2002 | Braga et al. |
| 6,359,217 | B1 | 3/2002 | Thompson et al. |
| 6,363,200 | B1 | 3/2002 | Thompson et al. |
| 6,385,381 | B1 | 5/2002 | Janus et al. |
| 6,411,767 | B1 | 6/2002 | Burrous et al. |
| 6,424,781 | B1 | 7/2002 | Puetz et al. |
| 6,425,694 | B1 | 7/2002 | Szilagyi et al. |
| 6,431,762 | B1 | 8/2002 | Taira et al. |
| 6,434,313 | B1 | 8/2002 | Clapp, Jr. et al. |
| 6,452,925 | B1 | 9/2002 | Sistanizadeh et al. |
| 6,453,033 | B1 | 9/2002 | Little et al. |
| 6,464,402 | B1 | 10/2002 | Andrews et al. |
| D466,087 | S | 11/2002 | Cuny et al. |
| 6,480,487 | B1 | 11/2002 | Wegleitner et al. |
| 6,483,977 | B2 | 11/2002 | Battey et al. |
| 6,496,640 | B1 | 12/2002 | Harvey et al. |
| 6,535,682 | B1 | 3/2003 | Puetz et al. |
| 6,539,147 | B1 | 3/2003 | Mahony |
| 6,539,160 | B2 | 3/2003 | Battey et al. |
| 6,542,688 | B1 | 4/2003 | Battey et al. |
| 6,554,485 | B1 | 4/2003 | Beatty et al. |
| 6,556,763 | B1 | 4/2003 | Puetz et al. |
| 6,577,595 | B1 | 6/2003 | Counterman |
| 6,591,051 | B2 | 7/2003 | Solheid et al. |
| 6,597,670 | B1 | 7/2003 | Tweedy et al. |
| 6,614,980 | B1 | 9/2003 | Mahony |
| 6,621,975 | B2 | 9/2003 | Laporte et al. |
| 6,625,375 | B1 | 9/2003 | Mahony |
| 6,631,237 | B2 | 10/2003 | Knudsen et al. |
| 6,654,536 | B2 | 11/2003 | Battey et al. |
| 6,657,123 | B2 | 12/2003 | Moore |
| 6,661,961 | B1 | 12/2003 | Allen et al. |
| 6,668,127 | B1 | 12/2003 | Mahony |
| 6,760,531 | B1 | 7/2004 | Solheid et al. |
| 6,778,752 | B2 | 8/2004 | LaPorte et al. |
| 6,788,786 | B1 | 9/2004 | Kessler et al. |
| 6,792,190 | B2 | 9/2004 | Xin et al. |
| 6,792,191 | B1 | 9/2004 | Clapp, Jr. et al. |
| 6,815,612 | B2 | 11/2004 | Bloodworth et al. |
| 6,831,226 | B2 | 12/2004 | Allen, Jr. |
| 6,850,685 | B2 | 2/2005 | Tinucci et al. |
| 6,870,734 | B2 | 3/2005 | Mertesdorf et al. |
| 6,925,241 | B2 | 8/2005 | Bohle et al. |
| 6,945,616 | B2 | 9/2005 | Webster et al. |
| 6,980,725 | B1 | 12/2005 | Swieconek |
| 6,983,095 | B2 | 1/2006 | Reagan et al. |
| 7,088,899 | B2 | 8/2006 | Reagan et al. |
| 7,103,255 | B2 | 9/2006 | Reagan et al. |
| 7,139,461 | B2 | 11/2006 | Puetz et al. |
| 7,146,089 | B2 | 12/2006 | Reagan et al. |
| 7,149,398 | B2 | 12/2006 | Solheid et al. |
| 7,171,102 | B2 | 1/2007 | Reagan et al. |
| 7,200,317 | B2 | 4/2007 | Reagan et al. |
| 7,298,952 | B2 | 11/2007 | Allen et al. |
| 7,310,234 | B2 | 12/2007 | Miller et al. |
| 7,324,332 | B1 | 1/2008 | Shelton |
| 7,333,707 | B2 | 2/2008 | Puetz et al. |
| 7,369,741 | B2 | 5/2008 | Reagan et al. |
| 7,400,816 | B2 | 7/2008 | Reagan et al. |
| 7,471,869 | B2 | 12/2008 | Reagan et al. |
| 7,619,160 | B2 | 11/2009 | Grunwald et al. |
| 7,816,602 | B2 * | 10/2010 | Landry et al. ............... 174/50 |
| 2002/0034290 | A1 | 3/2002 | Pershan |
| 2003/0174996 | A1 | 9/2003 | Henschel et al. |
| 2004/0074852 | A1 | 4/2004 | Knudsen et al. |
| 2004/0228598 | A1 | 11/2004 | Allen et al. |
| 2004/0264873 | A1 | 12/2004 | Smith et al. |
| 2005/0002633 | A1 | 1/2005 | Solheid et al. |
| 2005/0013768 | A1 | 1/2005 | Malhotra et al. |
| 2005/0128722 | A1 | 6/2005 | Miller et al. |
| 2005/0129379 | A1 | 6/2005 | Reagan et al. |
| 2005/0135768 | A1 | 6/2005 | Rapp et al. |
| 2005/0281526 | A1 | 12/2005 | Vongseng et al. |
| 2006/0003637 | A1 | 1/2006 | Neumetzler et al. |
| 2006/0093301 | A1 | 5/2006 | Zimmel et al. |
| 2006/0177190 | A1 | 8/2006 | Vongseng et al. |
| 2006/0228086 | A1 | 10/2006 | Holmberg et al. |
| 2006/0269205 | A1 | 11/2006 | Zimmel |
| 2006/0269206 | A1 | 11/2006 | Zimmel |
| 2007/0047893 | A1 | 3/2007 | Kramer et al. |
| 2008/0008436 | A1 | 1/2008 | Reagan et al. |
| 2008/0031585 | A1 | 2/2008 | Solheid et al. |
| 2008/0042535 | A1 | 2/2008 | Guzzo et al. |
| 2008/0042536 | A1 | 2/2008 | Guzzo et al. |

FOREIGN PATENT DOCUMENTS

| | | |
|---|---|---|
| EP | 0 788 002 A1 | 8/1997 |
| EP | 0 871 047 A1 | 10/1998 |
| EP | 0 975 180 A1 | 1/2000 |
| EP | 1 045 267 A1 | 10/2000 |
| JP | 63-229409 | 9/1988 |
| JP | 2005-222749 | 8/2005 |

| WO | WO 93/15426 | 8/1993 |
| WO | WO 98/53347 | 11/1998 |
| WO | WO 00/75706 A2 | 12/2000 |
| WO | WO 02/103429 A2 | 12/2002 |

OTHER PUBLICATIONS

Brochure from Amphenol Corp. entitled "Amphenol® 954 Series one piece SC Connector," 2 pgs. (1990).

AMP Inc. catalog entitled "Fiber Optic Products," front and back covers and p. 59, (4 pgs.) (© 1991).

HRS catalog entitled "Optical Fibre Connectors," front and back covers and pp. 16, 17 and 49 (5 pages) (Mar. 1991).

AT&T Network Systems catalog entitled "Fiber Optic Products Innovation for wide ranging applications," front and back covers and pp. 6-1 through 6-16 (18 pages) (© 1995).

NTT Int'l Fiber Termination Module (FTM) & Premises Optical Distribution Cabinets (PODC) product brochure, 3 pages (Applicants admit as prior art as of Feb. 13, 2006).

ADC Telecommunications, Inc.'s Outside Plant, Fiber Cross-Connect Solutions Products Brochure; front cover, Table of Contents, pp. 1-48, and back cover; revised Jun. 2002, Item No. 1047.

ADC Telecommunications, Inc.'s 6*th* Edition of Next Generation Frame (NGF) Product Family Ordering Guide; front cover, Table of Contents, pp. 1-41, and back cover; revised Feb. 2003, Item No. 820.

ADC Telecommunications, Inc.'s Fiber Optic, Cable Assemblies and Accessories Brochure; front cover, Table of Contents, pp. 1-23, and back cover; revised Apr. 2003, Item No. 100300.

ADC Telecommunications, Inc.'s OMX™ 600, Optical Distribution Frame Brochure; front cover, Table of Contents, pp. 1-14, and back cover; revised Feb. 2000, Item No. 854.

Iwano, S. et al., "MU-type Optical Fiber Connector System," *NTT Review*, vol. 9, No. 2, pp. 63-71 (Mar. 1997).

Sugita, E. et al., "SC-Type Single-Mode Optical Fiber Connectors," *Journal of Lightwave Technology*, vol. 7, No. 11, pp. 1689-1696 (Nov. 1989).

FONS Corporation's MDC Series Rack or Wall Mount Enclosures product sheet, 3 pages, (2002).

FONS Corporation's Modular Distribution Cabinets Rack Mount Enclosures, Model MDC-7, product sheet, 2 pages (2005) (shows the same device as shown in Exhibit L).

FONS Corporation's Technical Drawing No. 11669, Rev. D, of Distribution Cabinet Assembly MFDC-7, 1 page (technical drawing depicting the device shown in Exhibit M) (2005).

ADC Telecommunications, Inc.'s Secure Fiber Entrance Terminal (SFET) Brochure; front cover, pp. 2-7, and back cover; revised May 1998, Item No. 1005.

ADC Telecommunications, Inc.'s 2*nd* Edition of Fiber Panel Products; front cover, Table of Contents, pp. 1-111, and back cover; revised Jul. 1996, Item No. 846.

*OmniReach™ ACE-214V Cabinet Fiber Distribution Terminal User Manual*, ADC Telecommunications, Inc., ADCP-96-062, Issue 1, Aug. 2005 (47 pages).

*Fiber Distribution Terminal ACE-142S/142V Cabinet With Splitter Connector Panel—User Manual*, ADC Telecommunications, Inc., ADCP-96-023, Issue 1, Aug. 2004 (55 pages).

Office Action issued Dec. 4, 2009 for European Patent Application No. 07750166.6-2216, which is related to the present application (4 pages).

Office Action issued Sep. 25, 2009 for Chinese Patent Application No. 200780005187.2, which is related to the present application (10 pages).

Notice of Allowance issued Dec. 31, 2009 for U.S. Appl. No. 11/354,286, to which the present application claims priority.

* cited by examiner

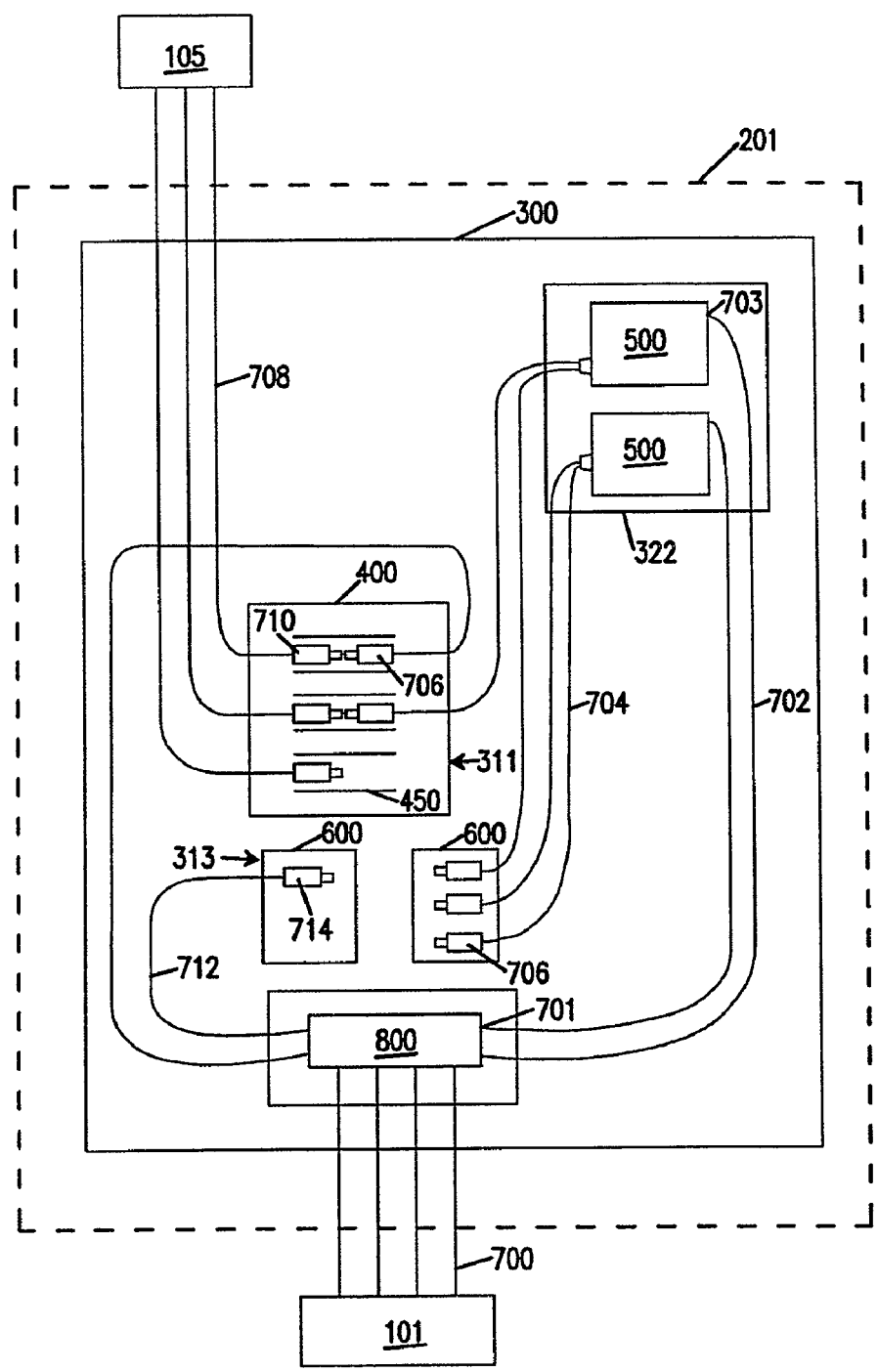

FIBER DISTRIBUTION HUB WITH OUTSIDE ACCESSIBLE GROUNDING TERMINALS

CROSS REFERENCE TO RELATED APPLICATIONS

This application is a continuation of application Ser. No. 11/544,951, filed Oct. 6, 2006, now U.S. Pat. No. 7,816,602, which application claims the benefit of provisional application Ser. No. 60/783,818 filed on Mar. 17, 2006, and is also a continuation-in-part of application Ser. No. 11/354,286 filed on Feb. 13, 2006 now U.S. Pat. No. 7,720,343, which applications are incorporated herein by reference in their entirety.

BACKGROUND

Passive optical networks are becoming prevalent in part because service providers want to deliver high bandwidth communication capabilities to customers. Passive optical networks are a desirable choice for delivering high-speed communication data because they may not employ active electronic devices, such as amplifiers and repeaters, between a central office and a subscriber termination. The absence of active electronic devices may decrease network complexity and/or cost and may increase network reliability.

FIG. 1 illustrates a network 100 deploying passive fiber optic lines. As shown, the network 100 can include a central office 101 that connects a number of end subscribers 105 (also called end users 105 herein) in a network. The central office 101 can additionally connect to a larger network such as the Internet (not shown) and a public switched telephone network (PSTN). The network 100 can also include fiber distribution hubs (FDHs) 103 having one or more optical splitters (e.g., 1-to-8 splitters, 1-to-16 splitters, or 1-to-32 splitters) that generate a number of individual fibers that may lead to the premises of an end user 105. The various lines of the network 100 can be aerial or housed within underground conduits.

The portion of the network 100 that is closest to central office 101 is generally referred to as the F1 region, where F1 is the "feeder fiber" from the central office 101. The portion of the network 100 closest to the end users 105 can be referred to as an F2 portion of network 100. The network 100 includes a plurality of break-out locations 102 at which branch cables are separated out from the main cable lines. Branch cables are often connected to drop terminals 104 that include connector interfaces for facilitating coupling of the fibers of the branch cables to a plurality of different subscriber locations 105.

Splitters used in an FDH 103 can accept a feeder cable F1 having a number of fibers and may split those incoming fibers into, for example, 216 to 432 individual distribution fibers that may be associated with a like number of end user locations. In typical applications, an optical splitter is provided prepackaged in an optical splitter module housing and provided with a splitter output in pigtails that extend from the module. The splitter output pigtails are typically connectorized with, for example, SC, LC, or LX.5 connectors. The optical splitter module provides protective packaging for the optical splitter components in the housing and thus provides for easy handling for otherwise fragile splitter components. This modular approach allows optical splitter modules to be added incrementally to FDHs 103 as required.

It is common for F1 and F2 cables to be routed underground. When underground construction or other activity is to be undertaken in areas where underground cables are buried, it is necessary to mark the locations of the buried cables before the activity is undertaken. In the case of shielded/armored cables, a field technician can transmit a locator signal (e.g., an RF signal) through the metal shielding of the cables, and then use an above ground sensor (e.g., an RF detector) to detect the signal along the length of the cable and thereby identify the location of the cable. As the cable is detected, the technician can apply a spray paint line to the ground surface so that the location of the underlying cable is identified. By marking the ground surface, the likelihood for the cable to be broken or otherwise damaged during the underground activity is reduced.

In the case of shielded/armored cables, the cables are preferably grounded for safety. In a typical configuration, a grounding plate having grounding pins is provided within the interior of a fiber distribution hub cabinet. The shields of the F1 and F2 cables are electrically connected to the pins of the grounding plate by wires. One of the pins is electrically connected to ground (e.g., a metal rod, post or other member driven into the ground). In this type of hub arrangement, for the field technician to mark the F1 and F2 lines, it is necessary for the field technician to gain access to the interior of the cabinet. Once the cabinet is open, the technician can disconnect the cable of interest from ground and transmit the locator signal through the shielding of the cable. After the location of the cable has been marked, the shield of the cable is reconnected to ground.

Field technicians responsible for marking underground cable are often not employed by the service provider that owns and operates the fiber distribution hub. Furthermore, field technicians responsible for marking cable are typically not trained with respect to the telecommunications equipment typically housed within a fiber distribution hub. Therefore, it can be undesirable for the field technician to have access to the interior of the fiber distribution hub. Moreover, the cabling and other components within a fiber distribution hub can often block access to the grounding plate and/or make the grounding plate difficult to find. Therefore, it is desirable to have a fiber distribution hub having a configuration which allows a field technician to access the grounding plate without having to open the primary cabinet of the fiber distribution hub.

SUMMARY

Certain aspects of the disclosure relate to fiber optic cable systems.

In example systems, a fiber distribution system includes one or more fiber distribution hubs (FDHs) that provide an interface between the central office and the subscribers.

Certain aspects of the disclosure relate to cable routing configurations.

Other aspects of the disclosure relate to enhanced access and scalability through the use of modular subscriber termination components and modular splitters.

Certain additional aspects of the present disclosure relate to fiber distribution hub configurations that allow a field technician to quickly and easily access grounding terminations of the fiber distribution hub without having to enter the interior of the main cabinet of the fiber distribution hub. In certain embodiments, the cabinet of the fiber distribution hub is provided with a secondary pocket or compartment where the grounding terminations can be accessed. In certain embodiments, a grounding pin corresponding to a selected underground cable desired to be located is disconnected from the ground by merely turning a nut mounted on the grounding pin a few turns.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

FIG. 3 is a schematic diagram showing an example cable routing scheme for the fiber distribution hub of FIG. 2A;

DETAILED DESCRIPTION

Figure 1:
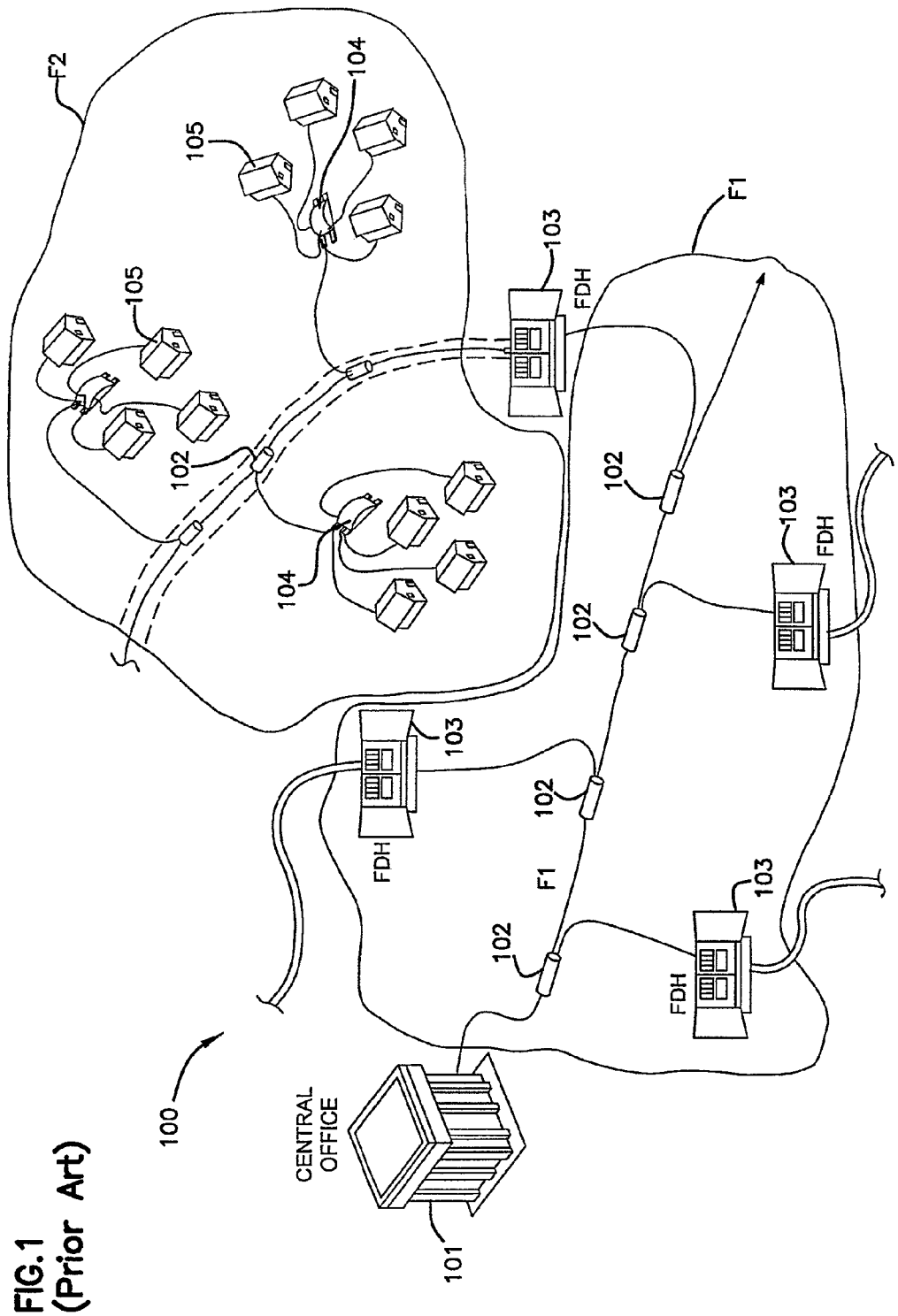
FIG. 1 shows a passive fiber optic network.

Referring now to FIGS. 2-7, an example fiber distribution hub (FDH) 200 in accordance with the principles of the present disclosure is shown. The FDH 200 includes a cabinet 201 that houses internal components. The cabinet 201 includes openings through which a feeder cable (e.g., or F1 cable) 700 and a subscriber cable 708 enter and exit the cabinet 201 (see FIG. 2C). A swing frame 300 is pivotably mounted on hinges 355 within the cabinet 201. The swing frame 300 includes bulkhead 301 that divides the swing frame 300 into a front portion 302 (see FIG. 4) and a back portion 304 (see FIG. 2C). The bulkhead 301 includes a main panel 310 having a termination region 311 and a storage region 313. Generally, at least one termination module 400 (see FIGS. 13A and 13B) is provided at the termination region 311 and at least one storage module 600 (see FIG. 9) is provided at the storage region 313. In some embodiments, the bulkhead 301 also includes a secondary panel 315 positioned adjacent the main panel 310 and configured for cable management. One or more feeder cable interfaces 800 can be positioned within the rear portion of the swing frame 300. At least one splitter module housing 322 accommodating one or more splitter modules 500 is positioned at the top of the swing frame 300.

FIG. 3 is a schematic diagram showing an example cable routing scheme for the FDH 200. The FDH 200 generally administers connections at a termination panel between incoming fiber and outgoing fiber in an Outside Plant (OSP) environment. As the term is used herein, "a connection" between fibers includes both direct and indirect connections. Examples of incoming fibers include the feeder cable fibers that enter the cabinet and intermediate fibers (e.g., connectorized pigtails extending from splitters and patching fibers/jumpers) that connect the feeder cable fiber to the termination panel. Examples of outgoing fibers include the subscriber cable fibers that exit the cabinet and any intermediate fibers that connect the subscriber cable fibers to the termination panel. The FDH 200 provides an interconnect interface for optical transmission signals at a location in the network where operational access and reconfiguration are desired. For example, as noted above, the FDH 200 can be used to split the feeder cables and terminate the split feeder cables to distribution cables routed to subscriber locations. In addition, the FDH 200 is designed to accommodate a range of alternative sizes and fiber counts and support factory installation of pigtails, fanouts and splitters.

Figure 2A:
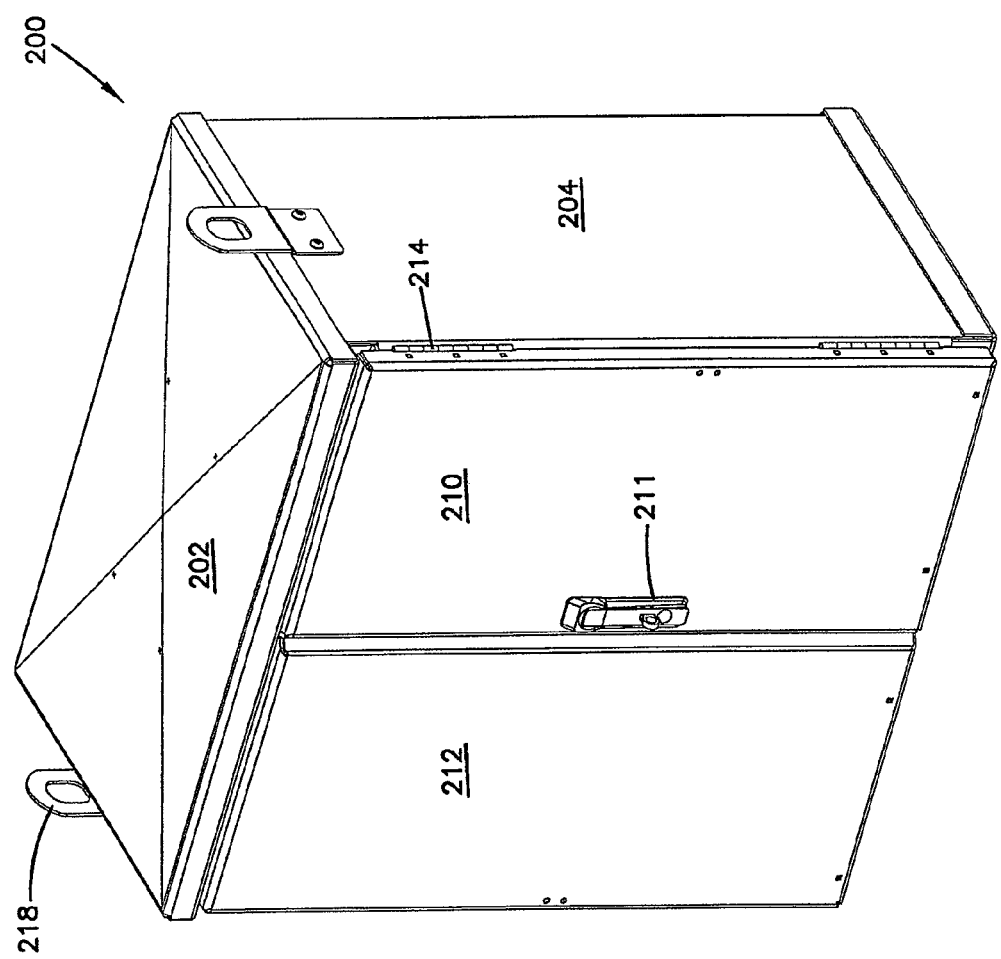
FIG. 2A is a front perspective view of an example fiber distribution hub having a cabinet with front doors shown in a closed position.
Figure 2B:
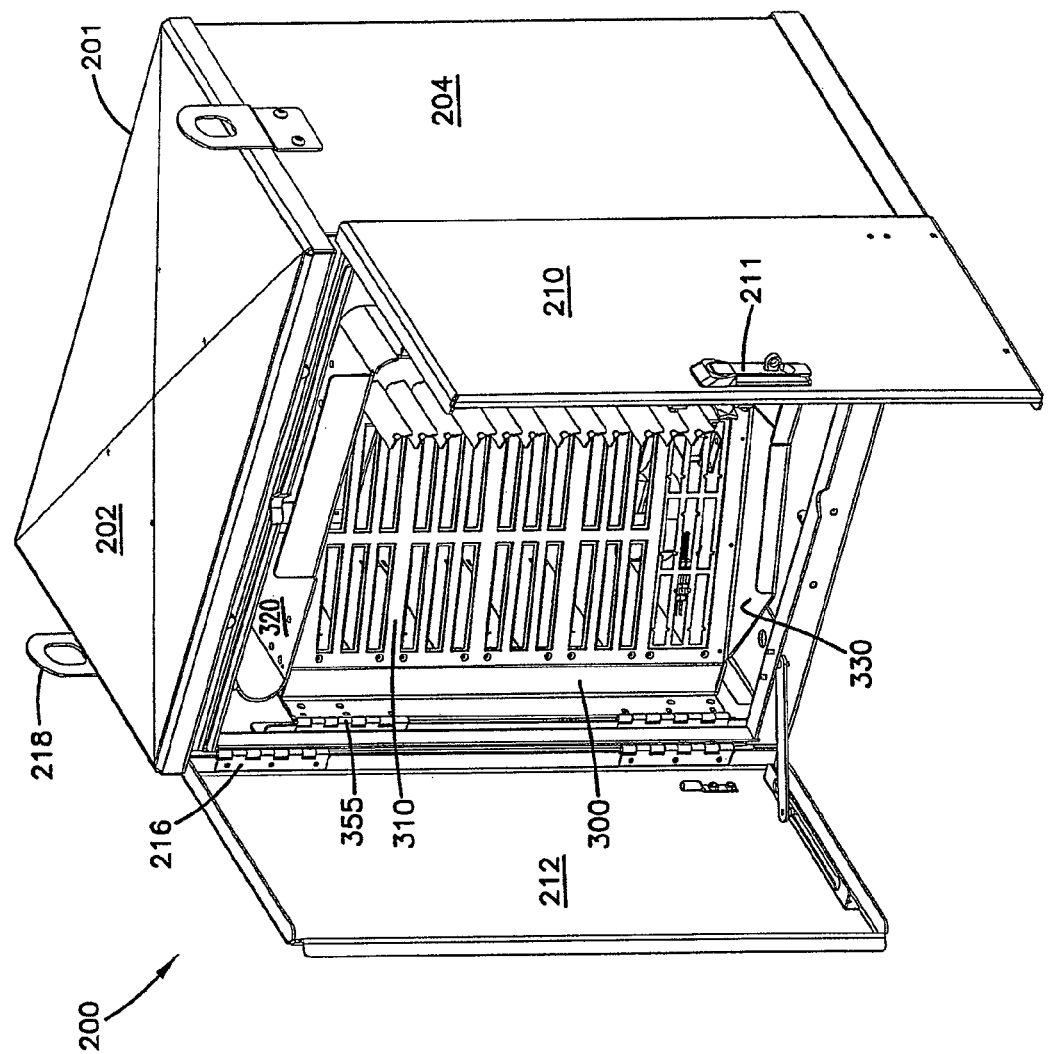
FIG. 2B is a front perspective view of the fiber distribution hub of FIG. 2A with the cabinet doors shown in an open position.
Figure 2C:
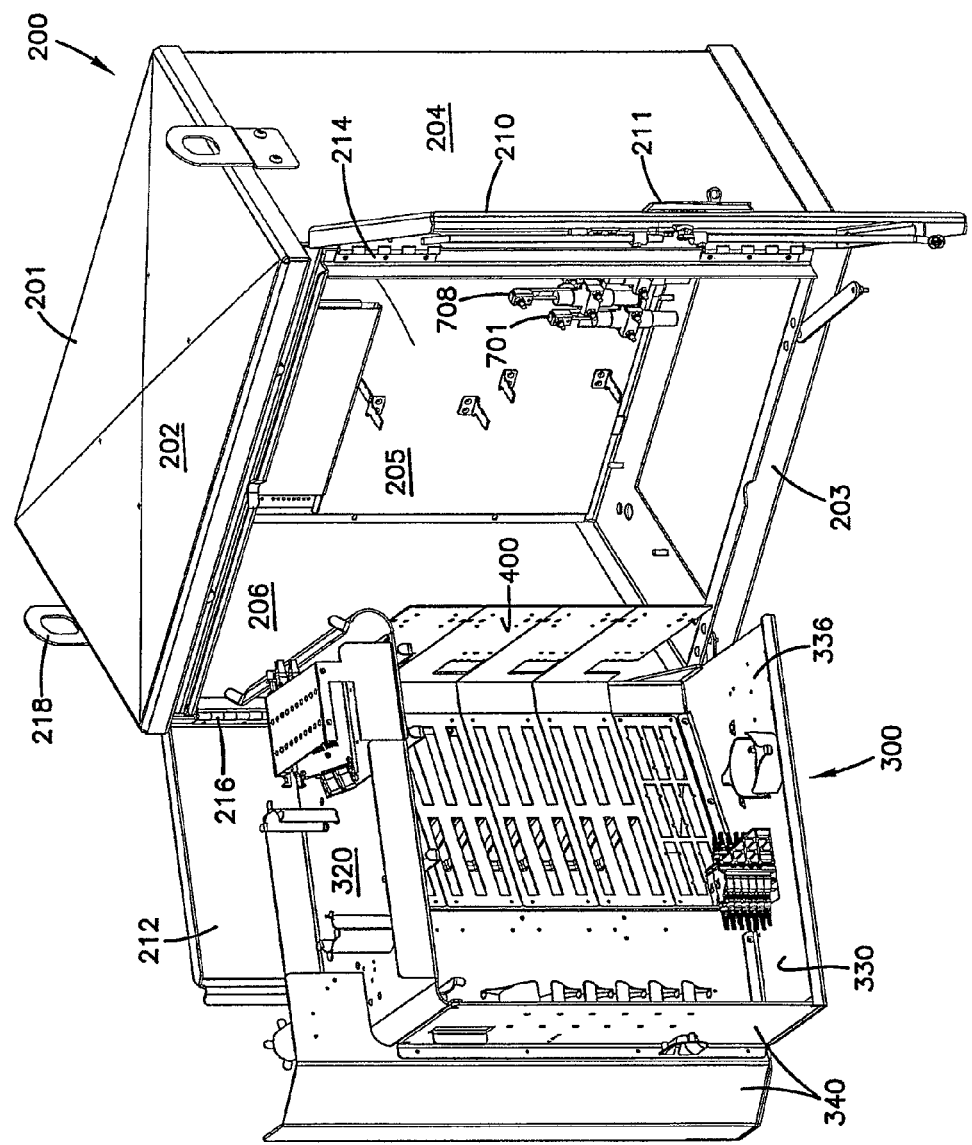
FIG. 2C is a front perspective view of the fiber distribution hub of FIG. 2A with a swing frame swung out of the cabinet.

As shown at FIG. 3, a feeder cable 700 is initially routed into the FDH 200 through the cabinet 201 (e.g., typically through the back or bottom of the cabinet 201 as shown in FIG. 2C). In certain embodiments, the fibers of the feeder cable 700 can include ribbon fibers. An example feeder cable 700 may include twelve to forty-eight individual fibers connected to a service provider central office 101. In some embodiments, after entering the cabinet 201, the fibers of the feeder cable 700 are routed to a feeder cable interface 800 (e.g., fiber optic adapter modules, a splice tray, etc.). At the feeder cable interface 800, one or more of the fibers of the feeder cable 700 are individually connected to separate splitter input fibers 702. The splitter input fibers 702 are routed from the feeder cable interface 800 to the splitter module housing 322. At the splitter module housing 322, the splitter input fibers 702 are connected to separate splitter modules 500, wherein the input fibers 702 are each split into multiple pigtails 704, each having connectorized ends 706. In other embodiments, however, the fibers of the feeder cable 700 can be connectorized and can be routed directly to the splitter modules 500 thereby bypassing or eliminating the need for an intermediate feeder cable interface 800.

When the pigtails 704 are not in service, the connectorized ends 706 can be temporarily stored on a storage module 600 that is mounted at the storage region 313 of the swing frame 300. When the pigtails 704 are needed for service, the pigtails 704 are routed from the splitter modules 500 to a termination module 400 that is provided at the termination region 311 of the swing frame 300. At the termination module 400, the pigtails 704 are connected to the fibers of a distribution cable 708. The termination panel is the dividing line between the incoming fibers and the outgoing fibers. A typical distribution cable 708 forms the F2 portion of a network (see FIG. 1) and typically includes a plurality of fibers (e.g., 144, 216 or 432 fibers) that are routed from the FDH 200 to subscriber locations 709.

In some embodiments, one or more of the fibers of the feeder cable 700 are not connected to any of the splitter modules 500. Rather, these fibers of the feeder cable 700 are connected to pass-through fibers 712 having connectorized ends 714. The pass-through fibers 712 are connected to the termination modules 400, without first connecting to the splitter modules 500. By refraining from splitting a fiber 712, a stronger signal can be sent to one of the subscribers. The connectorized ends 714 of the pass-through fibers 712 can be stored at the storage region 313 when not in use.

Referring back to FIGS. 2A-2C, the cabinet 201 of the FDH 200 includes a top panel 202, a bottom panel 203, a right side panel 204, a left side panel 206, a back panel 205, and at least one front door. In some embodiments, the at least one front door includes a right door 210 and a left door 212. In one embodiment, the front doors 210, 212 include a lock 211. The at least one front door is pivotally mounted to the cabinet 201 using hinges 214, 216 to facilitate access to the components mounted within the cabinet 201.

In general, the cabinet 201 of the FDH 200 is configured to protect the internal components against rain, wind, dust, rodents and other contaminants. However, the cabinet 201 remains relatively lightweight for easy installation, and breathable to prevent accumulation of moisture in the unit. In some embodiments, an aluminum construction with a heavy powder coat finish also provides for corrosion resistance. In one example embodiment, the cabinet 201 is manufactured from heavy gauge aluminum and is NEMA-4X rated. In other embodiments, however, other materials can also be used.

In accordance with example embodiments, the FDH 200 is provided in pole mount or pedestal mount configurations. For example, as shown in FIG. 2, loops 218 can be provided on the cabinet 201 for facilitating deployment of the cabinet 201 at a desired location. The loops 218 can be used to position the cabinet using a crane. In particular, the crane can lower the cabinet 201 into an underground region. In some embodiments, the loops 218 are removable or can be adjusted to not protrude from the top cabinet panel 202.

Figure 4:
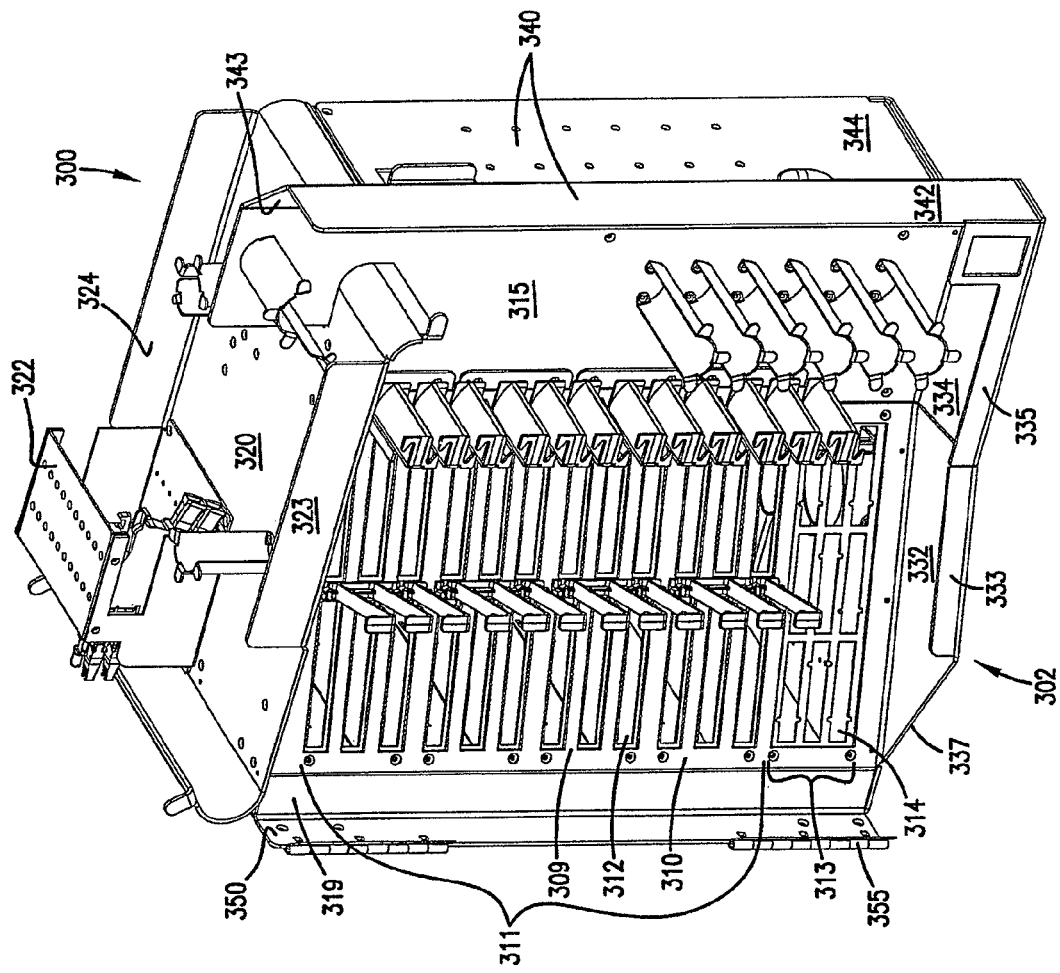
FIG. 4 is a front perspective view of the swing frame of FIG. 2C isolated from the fiber distribution hub.

Still referring to FIGS. 2B-2C, the swing frame 300 of the FDH 200 includes a top panel 320, a bottom panel 330, a right side panel 340, and a left side 341. A hinge-mounting strip 350 is positioned at the left side 341 of the swing frame 300. As depicted at FIG. 4, the bulkhead 301 further includes a connecting panel 319 that connects the main panel 310 to the hinge-mounting strip 350. As shown best at FIG. 4, a portion 325 of the secondary panel 315 extends upwardly past the top panel 320 of the swing frame 300. The bulkhead 301 extends vertically between the top and bottom panels 320, 330, and laterally between the right side panel 340 and the left side 341.

In some embodiments, the hinge-mounting strip 350 of the swing frame 300 is mounted to the cabinet 201 of the FDH 200 using one or more hinges 355. The hinges 355 enable the entirety of the swing frame 300, including the termination modules 400, the storage modules 600, the feeder cable interface device 800, and the splitter modules 500, to be swung out of the front doors 210, 212 of the cabinet 201 to enable access to optical components in the rear portion 304 of the swing frame 300 for cleaning, testing, maintenance, additions, etc. Pivoting the swing frame 300 out of the cabinet 201 causes the right side panel 340 of the swing frame 300 to move away from the interior volume of the cabinet 201. In some example embodiments, the swing frame 300 can be pivoted ninety degrees or more out of the cabinet 201.

In some embodiments, the hinges 355 of the swing frame 300 are positioned to provide a single point of flex for the fiber cable routed to the swing frame 300. This hinge point is constructed to control the fiber bend. In particular, the hinges 355 and cable management devices, which are discussed in greater detail herein, are designed to ensure that manufacture recommended bend radii are maintained when the swing frame 300 is opened or closed. In one embodiment, the cabinet 201 can be configured at a factory, or plant, so as to have cable bundles dressed around the hinges 355. Preconfiguring the cabinet 201 reduces the chance that cabling will be done incorrectly.

When the swing frame 300 is in the open position, as shown in FIG. 2C, components in the rear portion 304 of the swing frame 300 are accessible. For example, a rear side of the main panel 310 and a rear side of the secondary panel 315 are accessible. In addition, the splitter modules 500 located in the splitter module housing 322 (see FIG. 4) are accessible through the open top of the swing frame 300 when the swing frame 300 is swung out of the cabinet 201. In contrast, when the swing frame 300 is in the closed position (see FIG. 2B), only components on the front portion 302 of the swing frame 300 are readily accessible.

In example embodiments, the swing frame 300 includes a release latch (not shown) that locks the swing frame 300 in a closed position within the cabinet 201 of the FDH 200 until the latch is actuated. Once the latch is actuated, the swing frame 300 can be pivoted out of the cabinet 201. In addition, a pivoting locking member (not shown) can be mounted to rear side 304 of the swing frame 300 to hold the swing frame 300 in the open position.

Figure 5:
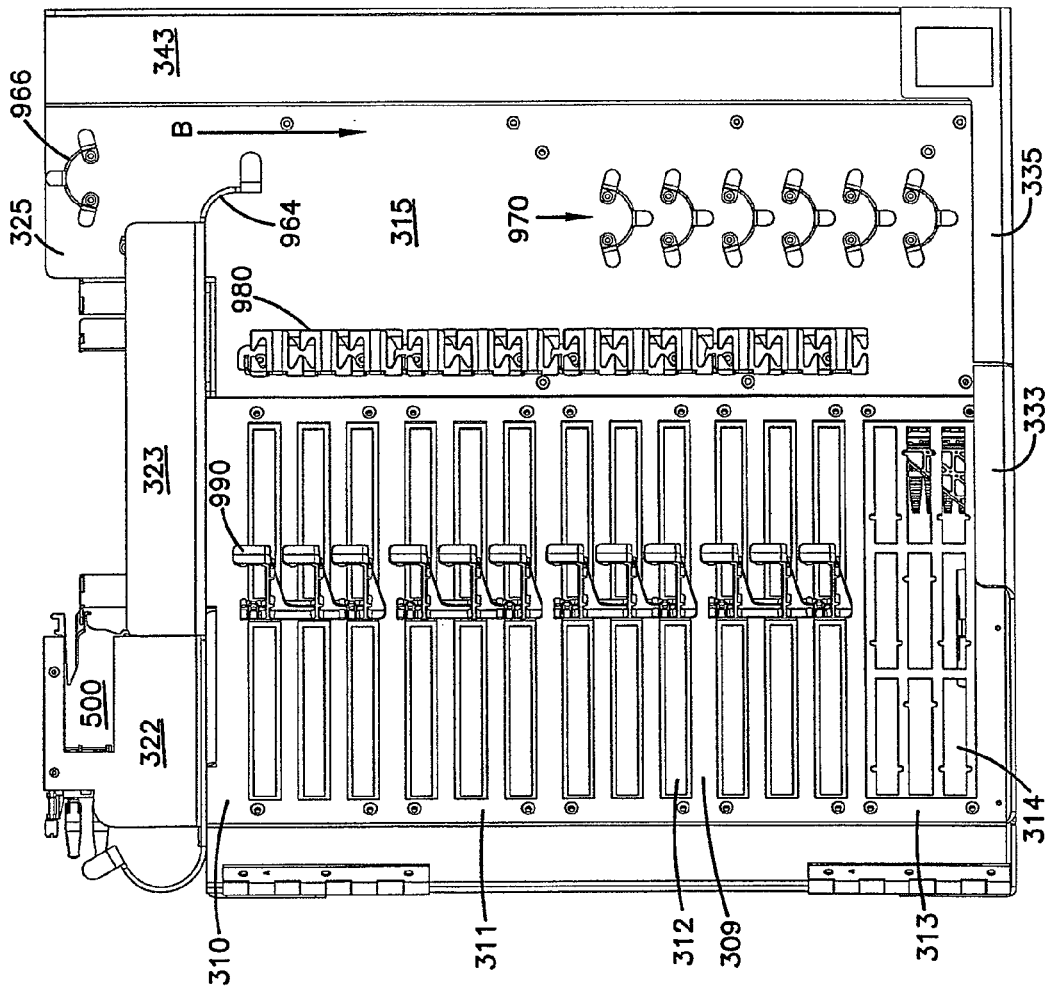
FIG. 5 is a front side view of the swing frame of FIG. 4.

Referring to FIGS. 4-5, the storage region 313 of the swing frame 300 is located below the termination region 311. In other embodiments, however, the storage region 313 can be above or adjacent to the termination region 311. In general, the termination region 311 defines at least one rectangular opening 312 through which adapters 450 (see FIGS. 13A-13B) from a termination module 400 extend. The termination modules 400 are described in greater detail herein. In the embodiment shown in FIG. 4, the termination region 311 includes two columns of openings 312 with each column including twelve elongated slots. Strips 309 separate the openings 312 of each column and provide surface area for adhering labeling information (e.g., connector designation). The storage region 313 also defines one or more openings 314 into which storage modules 600 (see FIG. 9) are mounted. The storage modules 600 are described in greater detail herein.

Figure 14:
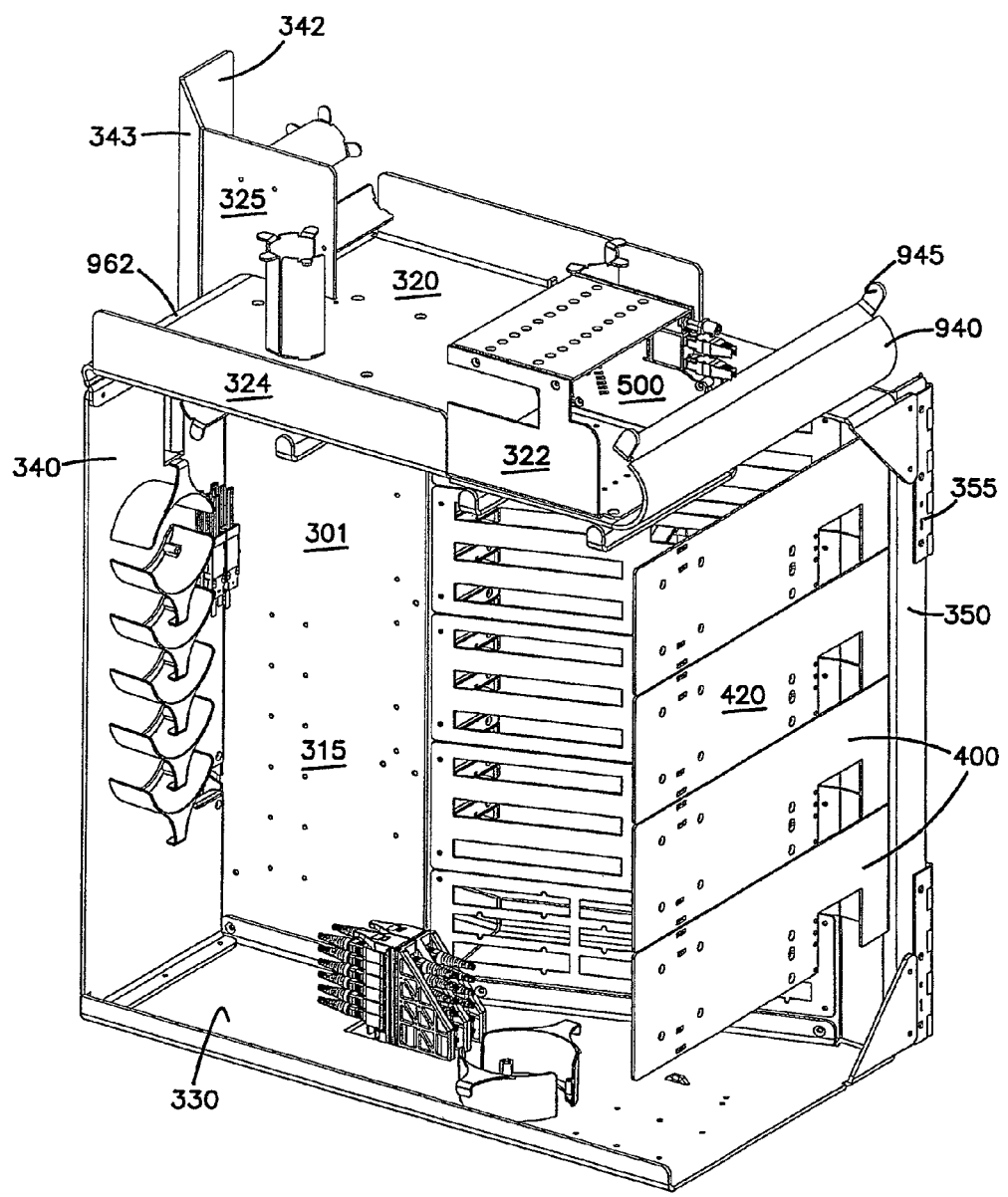
FIG. 14 is another perspective view of the swing frame of FIG. 4.

The bulkhead 301 bifurcates the bottom panel 330 into a front portion 331 (see FIG. 4) and a rear portion 336 (see FIG. 2C and 14). In general, the front portion 331 of the bottom panel 330 projects forwardly from the bulkhead 301. In some embodiments, the front portion 331 is further divided into a first front portion 332 and a second front portion 334. Each front portion 332, 334 includes a flange 333, 335, respectively, that protrudes substantially perpendicular from the bottom panel 330. The front portion 331 of the bottom panel 330 thereby forms a trough configured to retain slack or excess fiber from the storage region 313 or from the secondary panel 315. Edge 337 of the first front portion 332 is angled to allow the swing frame 300 to pivot open without interference from the trough.

Figure 6:
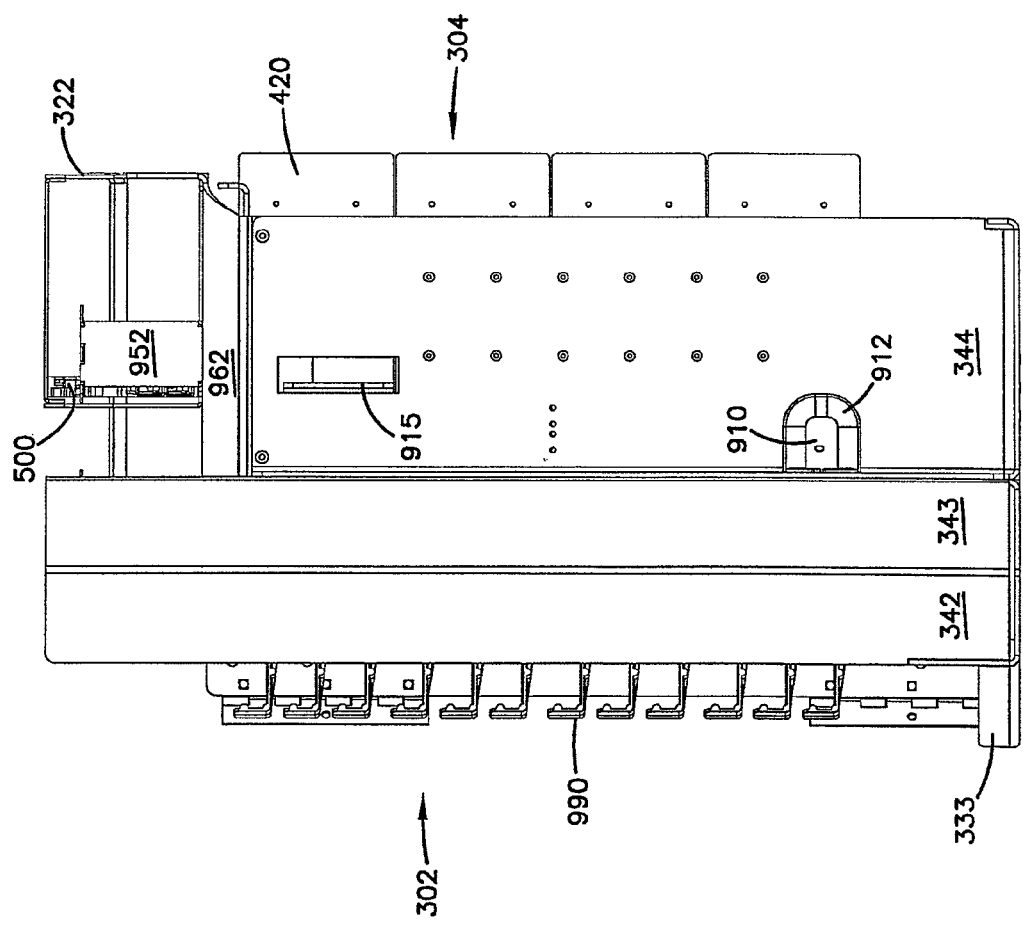
FIG. 6 is a right side view of the swing frame of FIG. 4.

As best shown in FIGS. 4 and 6, the bulkhead divides the side panel 340 into front and rear flanges 342, 344, respectively. The front flange 342 extends forwardly from the secondary panel 315 and the rear flange 344 extends rearwardly from the secondary panel 315. The rear flange 344 extends from the bottom panel 330 to a bend limiter 962 extending from the top panel 320. The front flange 342 extends from the bottom panel 330 past the top panel 320 to the protruding portion 325 of the secondary panel 315. In some embodiments, the front flange 342 includes a forward portion 344 substantially parallel to the rear flange 344 and an angled portion 343 extending between the protruding portion 325 of the secondary panel 315 and the forward portion 344.

Figure 7:
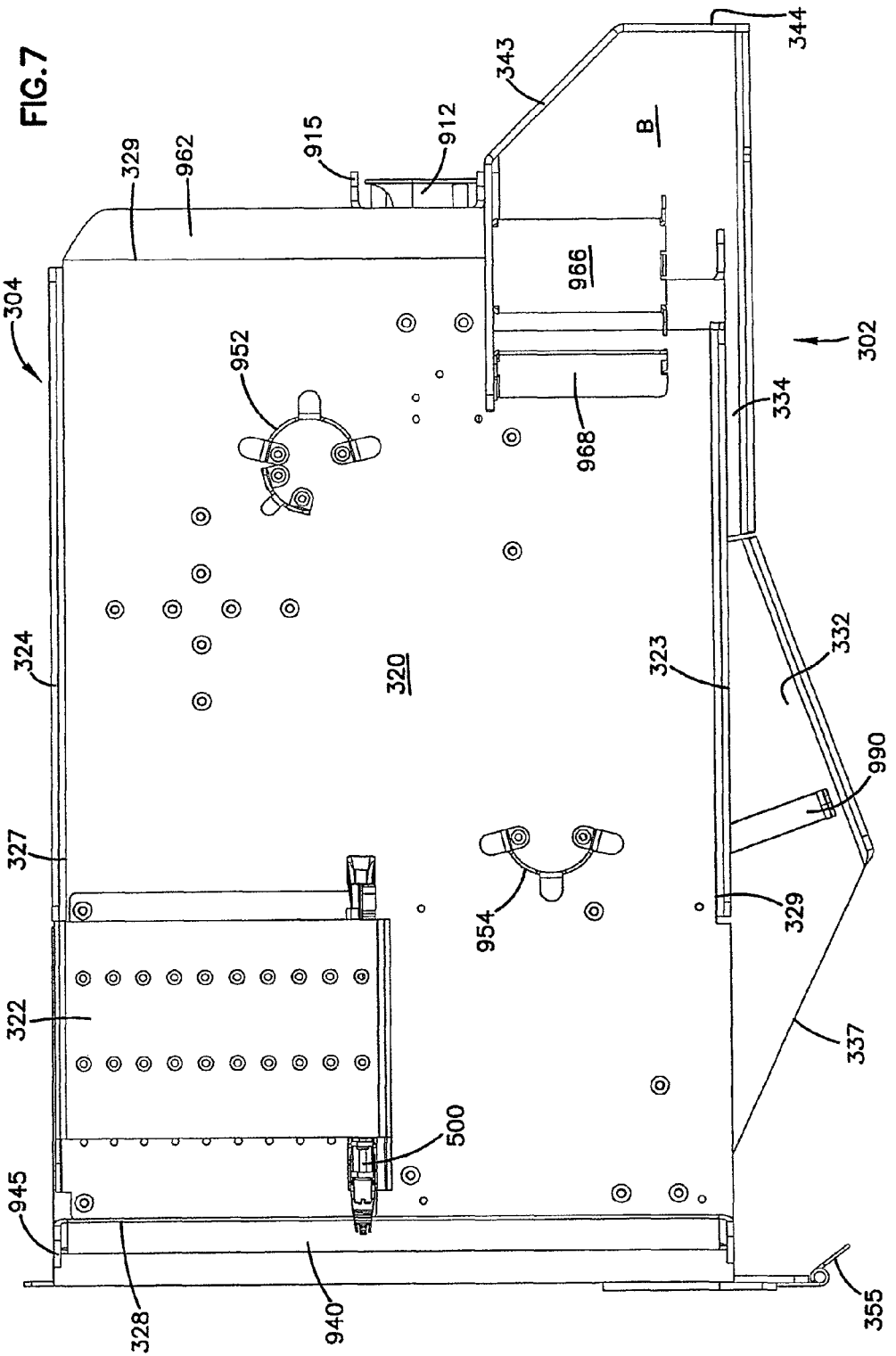
FIG. 7 is a top view of the swing frame of FIG. 4.

As best shown in FIG. 7, the top panel 320 of the swing frame 300 is substantially rectangular. The top panel 320 includes front and back edges 326, 327. Flanges 323, 324 (see FIG. 4) protrude upward from the edges 326, 327, respectively. The top panel 320 also has a first end 328 adjacent side 341 and a second, opposite end 329 adjacent the side panel 340. A bend radius limiter 940 extends upward from the first end 328. In some embodiments, a portion of the end 329 of the top panel 320 defines a width of a channel B with the front flange 342 of the side panel 340. The portion of the end 329 defining the channel B terminates before reaching the remaining portion of the end 329. The depth of the channel B extends from the secondary panel 315 to the flange 335 of the second front portion 33 of the bottom panel 330.

The splitter module housing 322 of the FDH 200 is positioned on the top panel 320 adjacent the first end 328. The splitter module housing 322 serves to protect, organize, and secure the splitter modules 500 of the FDH 200. The splitter module housing 322 can be constructed in various sizes to accommodate different numbers of splitter modules 500. The splitter module housing 322 is generally rectangular and defines one or more locations within the open interior sized to accept one or more optical splitter modules 500. To accommodate the splitter modules 500, the module housing 322 includes structure for supporting/securing the splitter modules 500. In example embodiments, the splitter modules 500 are designed to snap into the splitter module housing 322. In one embodiment, the splitter modules 500 are loaded into the splitter module housing 322 from front to back (i.e., from the side facing end 329 to the side facing end 328). The module housing 322 is further configured to enable the splitter modules 500 to receive an input fiber, such as fiber 702 of FIG. 3, on one end of the splitter module 500 and to output multiple fibers, such as pigtails 704 of FIG. 3, from the opposing end of the splitter 500.

Figure 8A:
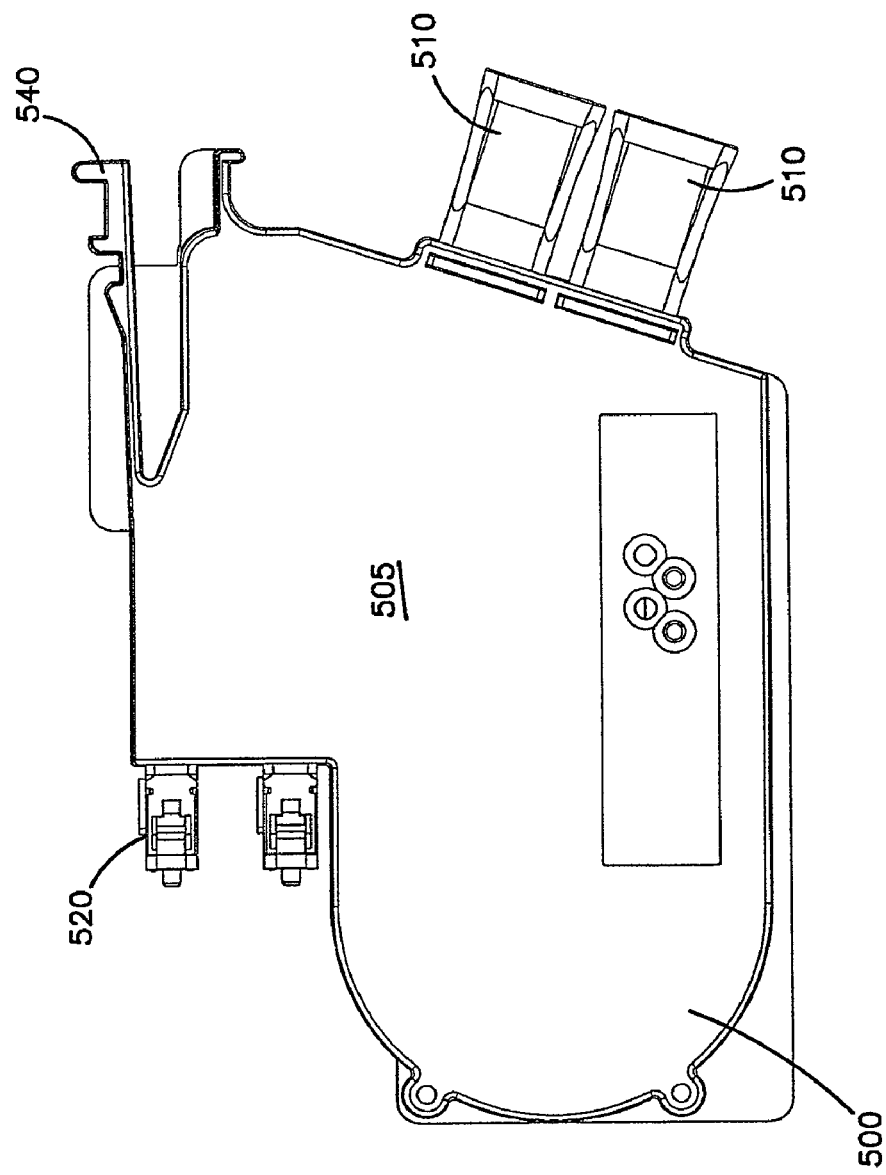
FIGS. 8A-8C show one example of a splitter module of the distribution hub of FIG. 2A.
Figure 8B:
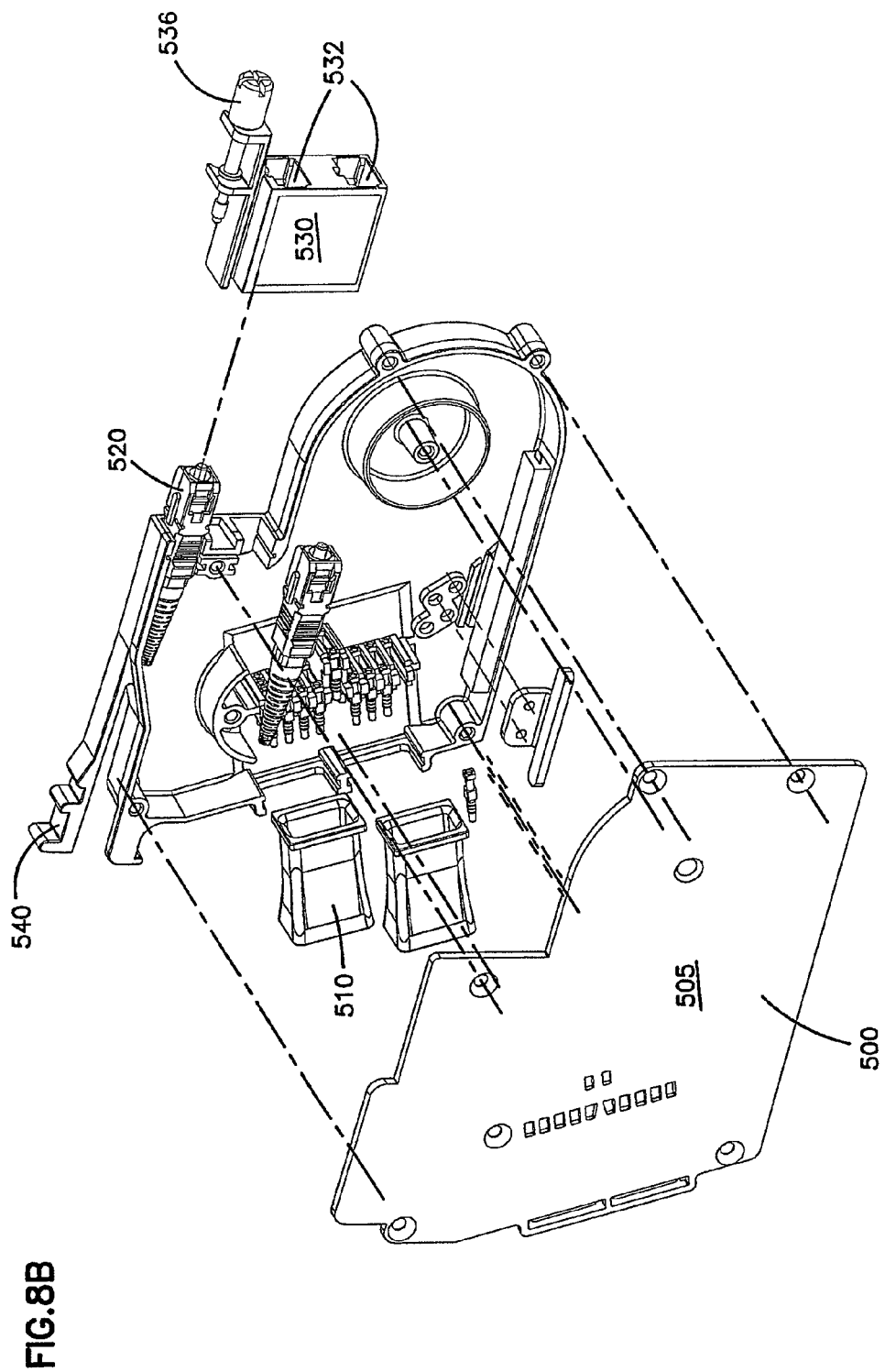
Figure 8C:
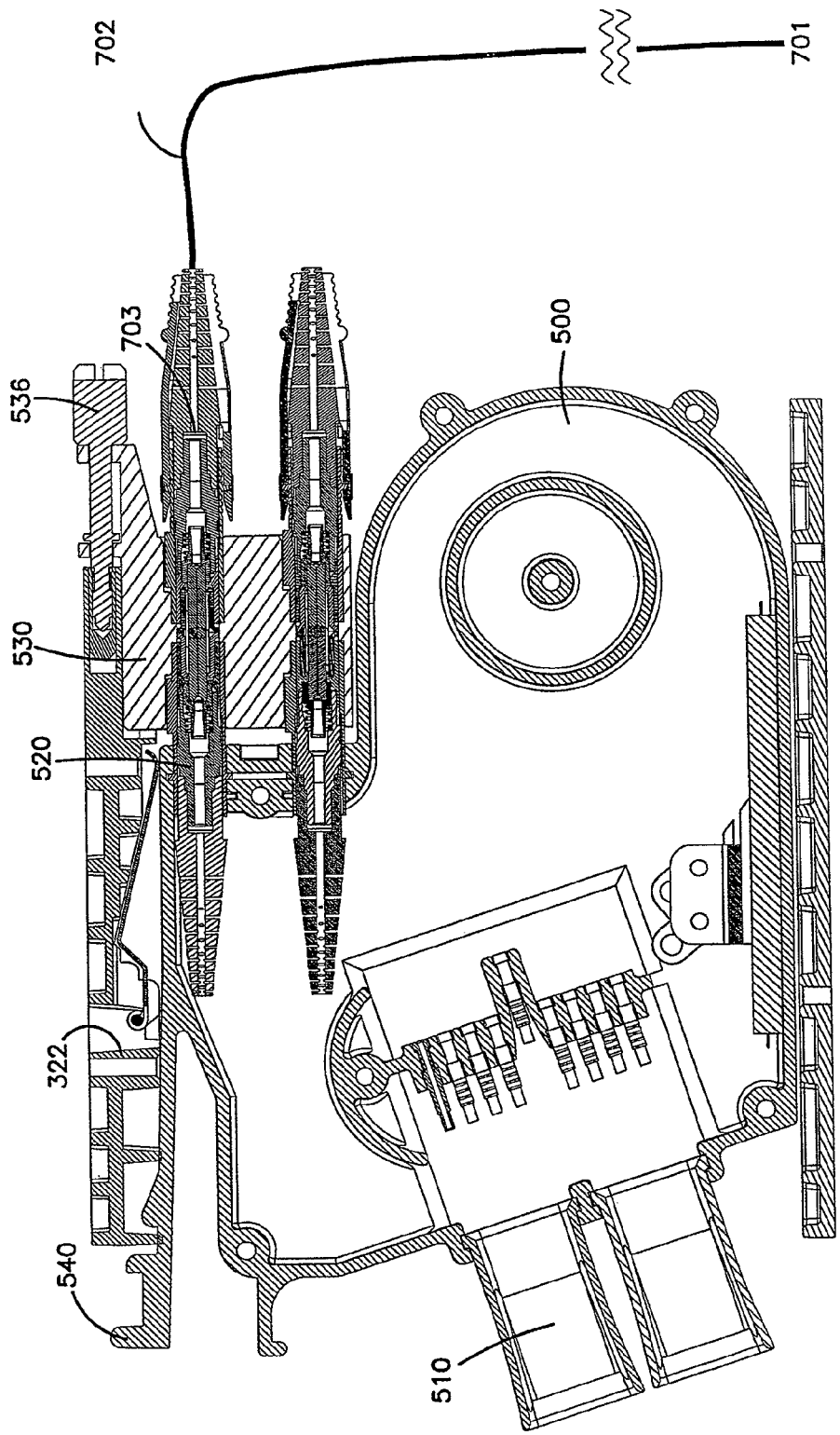

Referring now to FIGS. 8A-8C, one type of splitter module 500 that can be mounted in the splitter module housing 322 is a splitter having an integral connector. FIG. 8A is a left side view of such a splitter module 500. The splitter module 500 includes a housing 505 having at least one protective boot 510 protruding frontwardly and at least one integral connector 520 protruding rearwardly. In the embodiment shown, two boots 510 protrude from the front and two integral connectors 520 protrude rearwardly from the splitter housing 505. In one example embodiment (not shown), each splitter has four integral connectors 520. In some embodiments, a handle 540 also protrudes from the front end of the splitter housing 505. FIG. 8B is an exploded view of the splitter module 500 of FIG. 8A showing the internal components of the splitter module 500.

FIG. 8C shows a cross-section of the splitter module 500 of FIG. 7A inserted in the splitter module housing 322. An adapter assembly 530 is secured to the splitter module housing 322 using a fastener 536. In one embodiment, adapter assemblies 530 are mounted at the backside of the splitter module housing 322. The adapter assembly 530 is configured to receive the connectors 520 of the splitter module 500 when the splitter module 500 is inserted into the splitter module housing 322. As shown, the adapter assembly 530 is further configured to receive an opposing connector associated with the feeder cable 700. In some embodiments, the adapter assembly 530 receives a connector 703 terminating a splitter input fiber 702. In other embodiments, the adapter assembly 530 receives a connector 701 terminating the feeder cable 700 itself. In this way, the feeder cable fibers 700 can be readily coupled to the splitter modules 500.

Other embodiments of splitter modules 500 do not include integral connectors 520. In such embodiments, adapter assemblies 530 are not mounted at the splitter module housing 322 and the feeder cables 700 cannot be plugged directly into the splitter modules 500. Rather, input pigtails (not shown) pass through the splitter housing 505 and enter the splitter module 500. The opposing ends of the input pigtails can be connectorized or unconnectorized. If the ends 701 terminate in connectors (not shown), then the input fibers 702 are interfaced with the feeder cable 700 using an adapter module 810 (see FIG. 18). If the ends 701 are unconnectorized, then the input fibers 702 are spliced with the feeder cable 700 using a splice tray 808 (see FIG. 19).

Typically, each splitter module 500 receives between one and four fibers and outputs between two and sixteen fibers 704 for every input fiber. In one example embodiment, four input fibers 702 enter a splitter module 500 and thirty-two pigtail fibers 704 exit the splitter module 500. Further information regarding the splitter module 500 can be found in U.S. patent application Ser. No. 11/354,297, filed Feb. 13, 2006, entitled "Fiber Optic Splitter Module", which is hereby incorporated by reference. Additional information on other types of splitter modules can be found at U.S. application Ser. No. 10/980,978, filed Nov. 3, 2004, entitled "Fiber Optic Module And System Including Rear Connectors;" U.S. application Ser. No. 11/138063, filed May 25, 2005, entitled "Fiber Optic Splitter Module;" U.S. application Ser. No. 11/215837, filed Aug. 29, 2005, entitled "Fiber Optic Splitter Module With Connector Access;" and U.S. application Ser. No. 11/321696, filed Dec. 28, 2005, entitled "Splitter Modules For Fiber Distribution Hubs," the disclosures of which are hereby incorporated by reference.

Figure 9:
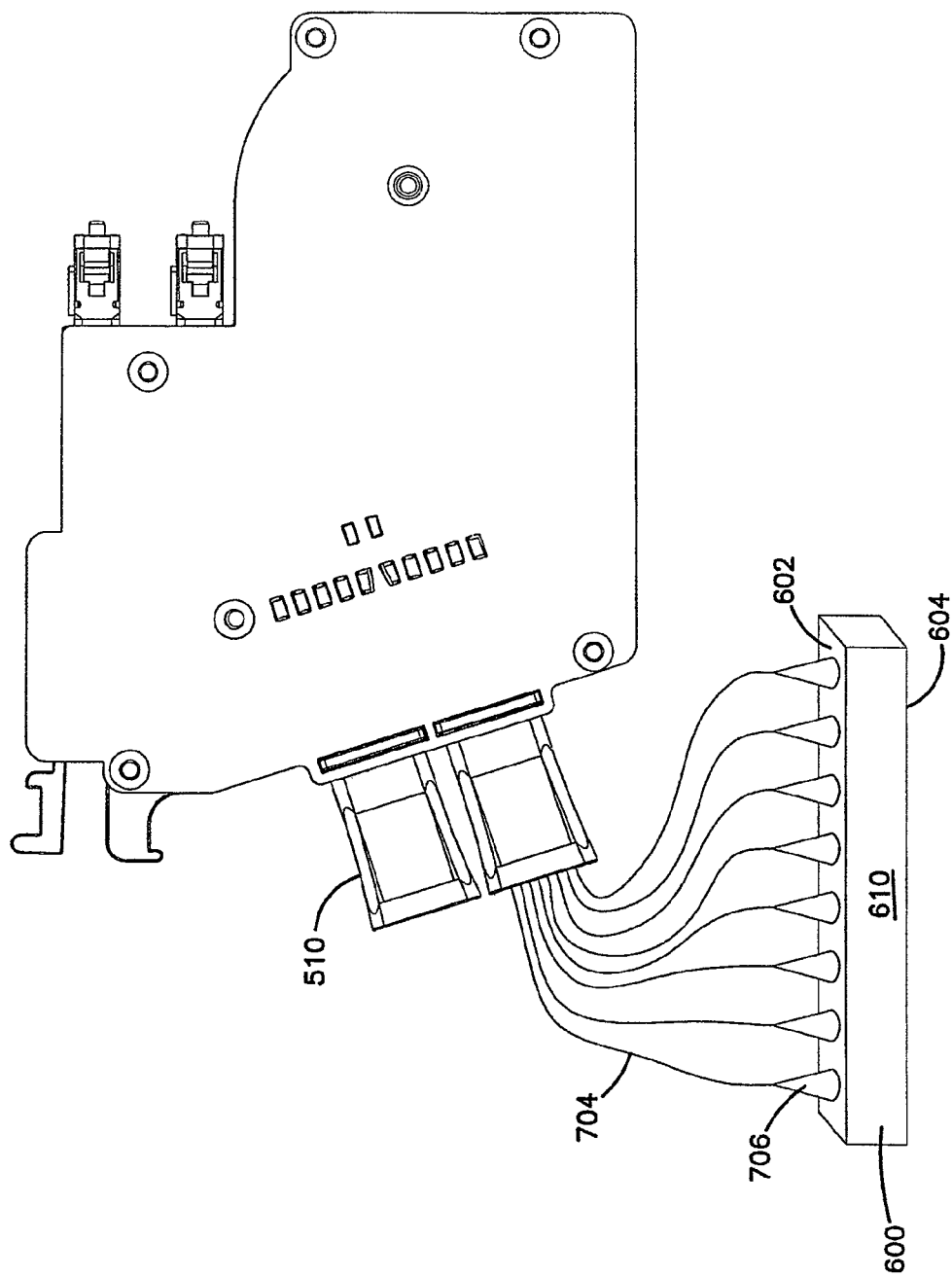
FIG. 9 shows an example splitter module having eight output fibers including connectorized ends secured to a storage module.
Figure 10:
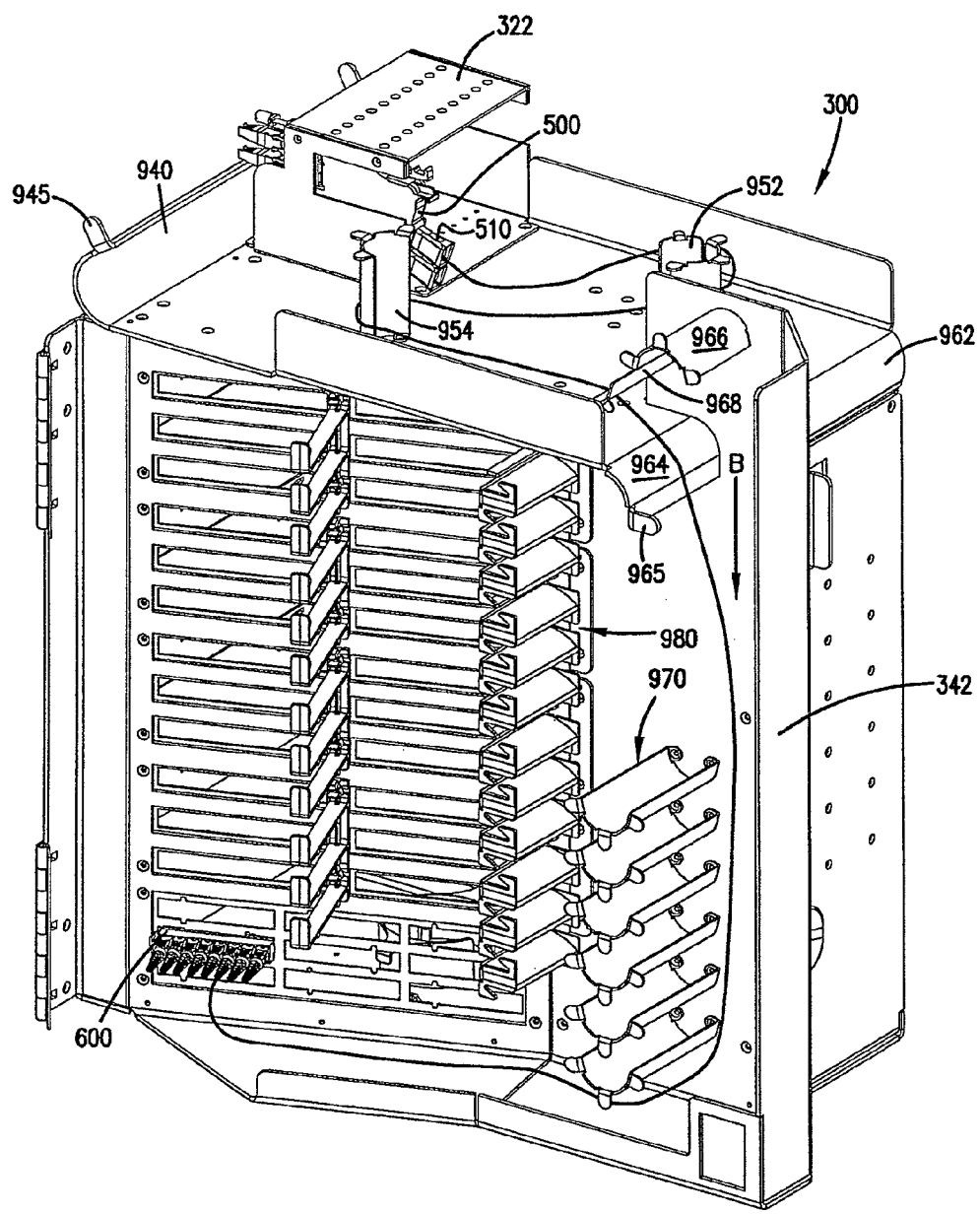
FIG. 10 depicts one example cable/fiber route from a splitter module mounted on a swing frame to a storage module mounted on the swing frame.

Referring now to FIGS. 9-10, the splitter modules 500 and storage modules 600 can be incrementally added to the swing frame 300. FIG. 9 illustrates a splitter module 500 having multiple connectorized pigtails 704 exiting from a protective boot 510 on the splitter module 500. The connectorized pigtails 704 are typically stored in one or more storage modules 600 prior to installation on the swing frame 300. In some embodiments, the connector 706 of each pigtail 704 is secured in a storage module 600 before the splitter module 500 leaves the factory. Typically, the connectorized pigtails 704 of each splitter module 500 are routed to four storage modules 600 each holding eight connectors.

The storage module 600 includes a body 610 having a front side 602 and a rear side 604. The body 610 is configured to hold at least one fiber connector 706. Typically, the body 610 is configured to hold about eight connectors 706. In some embodiments, the body 610 is arranged to retain the fiber connectors 706 in a single row configuration. In other embodiments, the body 610 can be arranged to hold the connectors 706 in a square pattern or in any other desired configuration. More information regarding the storage modules 600 can be found in U.S. application Ser. No. 10/610,325, filed on Jun. 30, 2003, entitled "Fiber Optic Connector Holder and Method"; U.S. application Ser. No. 10/613,764, filed on Jul. 2, 2003, entitled "Telecommunications Connection Cabinet;" and U.S. application Ser. No. 10/871,555, filed on Jun. 18, 2004, entitled "Multi-position Fiber Optic Connector Holder and Method," the disclosures of which are hereby incorporated by reference.

In some embodiments, the body 610 is designed to snap into one of the openings 314 defined in the storage region 313 of the main panel 310. The openings 314 can be arranged in any desired configuration within the storage region 313 of the main panel 310. In the example shown in FIG. 10, the storage region 313 of the main panel 310 defines nine openings 314 in a rectangular pattern. Each opening 314 is configured to receive a storage module body 610 arranged to retain eight fiber connectors 706 in a row.

As shown in FIG. 10, when the splitter module 500 is loaded into the splitter module housing 322 during installation, the corresponding storage modules 600 are loaded onto the storage region 313 of the main panel 310. For ease in viewing, only one splitter 500 having one pigtail 704 and one storage module 600 is illustrated. The pigtail 704 extending from the splitter module 500 to the storage module 600 is routed from the protective boot 510, across the top panel 320, down through the channel B on the front side of the secondary panel 315, and across the bottom panel 330 of the swing frame 300.

To accomplish this routing, the top panel 320 and secondary panel 315 include cable management arrangements. In some embodiments, the cable management arrangements on the top panel 320 include a first spool 952 positioned between the splitter housing 322 and the bend radius limiter 962 and a second spool 954 positioned between the bend limiter 940 and the front flange 342. Pigtails 704 output from the splitter 500 are first wrapped around the first spool 952 and then around the second spool 954.

A bend radius limiter 964 having tabs 965 and extending downward from the top panel 320 partially defines the channel B. From the second spool 954, some of the pigtails 704 are routed over the bend limiter 964 and into the channel B. In some embodiments, a partial fiber spool 966 is mounted to extend from the protruding portion 325 of the secondary panel 315 and is also oriented to route fiber into the channel B. To avoid excessive weight or entanglement of the fibers 704, some of the fibers 704 can be routed into channel B over the partial spool 966 instead of bend limiter 964. Extra slack can also be taken up by routing the pigtails 704 over spool 966 instead of over bend limiter 964. A bend limiter 968 can also be mounted on the protruding portion 325 of the secondary panel 315 and oriented to route fiber up to the partial spool 966.

The front of the secondary panel 315 includes at least one row of partial spools 970 and at least one row of radius limiters 980. In one example embodiment, the partial spools 970 are oriented to enable fiber routed down channel B to wrap at least partially around one of the spools 970. The fiber can travel from the partial spools 970 either along the bottom panel 330 to the storage modules 600 or over the limiters 980 to the termination modules 400. The limiters 980 are oriented to enable fiber routed from the partial spools 970 to travel to the termination modules 400 without excessive bending.

Figure 11:
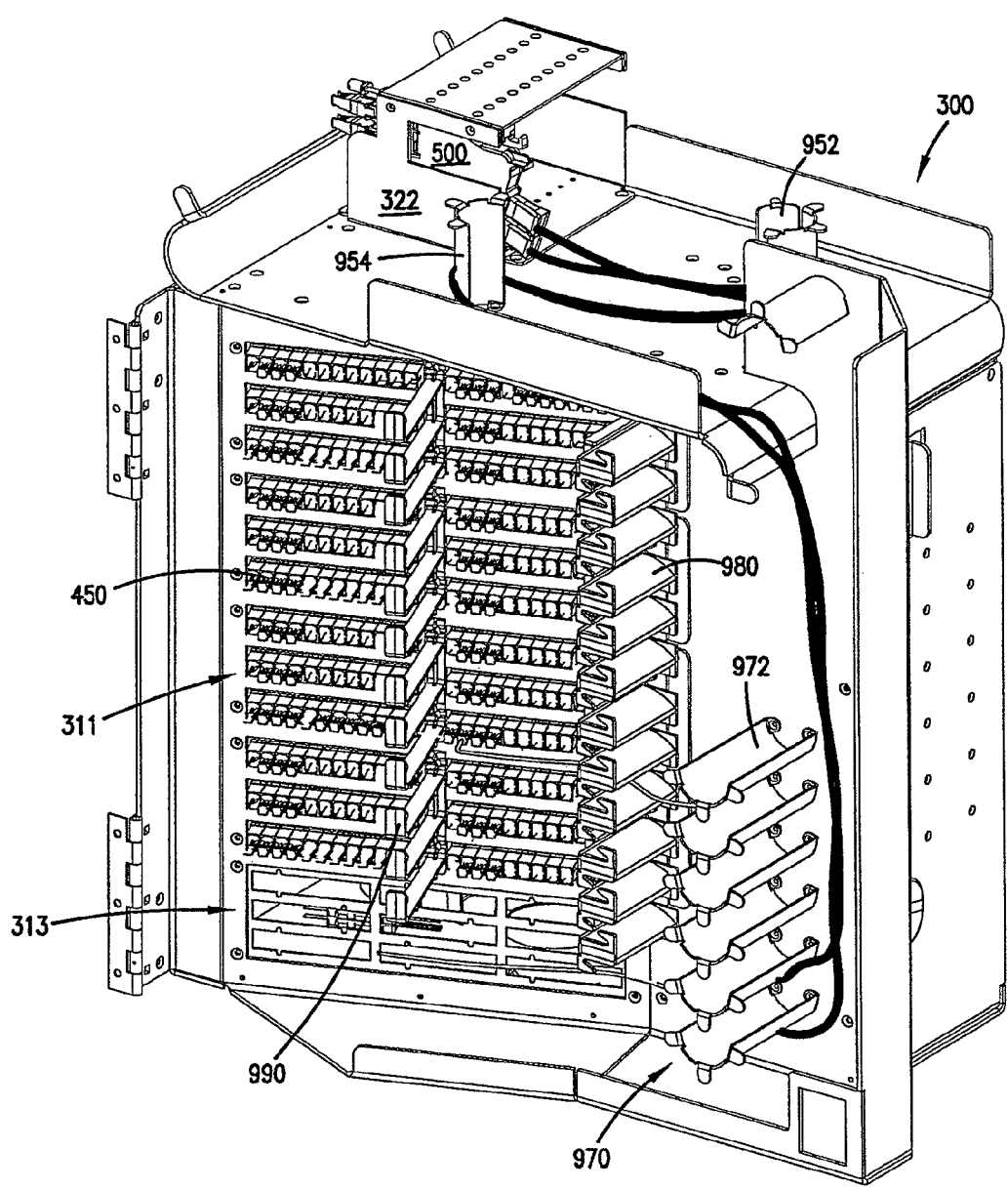
FIG. 11 depicts on example cable/fiber route from a splitter module mounted on a swing frame to a termination module mounted on the swing frame.

Referring now to FIG. 11, when a pigtail 704 retained in a storage module 600 should be connected to a subscriber distribution line 708, the corresponding connector 706 is removed from the storage module 600 and transferred to the appropriate adapter 450 on a termination module 400. During this transfer process, the fiber may need to be rewound around a different partial spool 970, such as partial spool 972, in order to reach the adapter 450. From the partial spool 972, the fiber can be routed around a suitable limiter 980 to avoid excessive bending before reaching the adapter 450. In some embodiments, the fiber is also fed through support fingers 990 extending from the termination section 311 of the main panel 310 before plugging into the adapter 450. When all of the fibers 704 originally secured in the storage module 600 have been routed to subscriber termination modules 400, the empty storage modules 600 can be removed to make room for a new splitter module 500 and new storage modules 600.

Figure 12A:
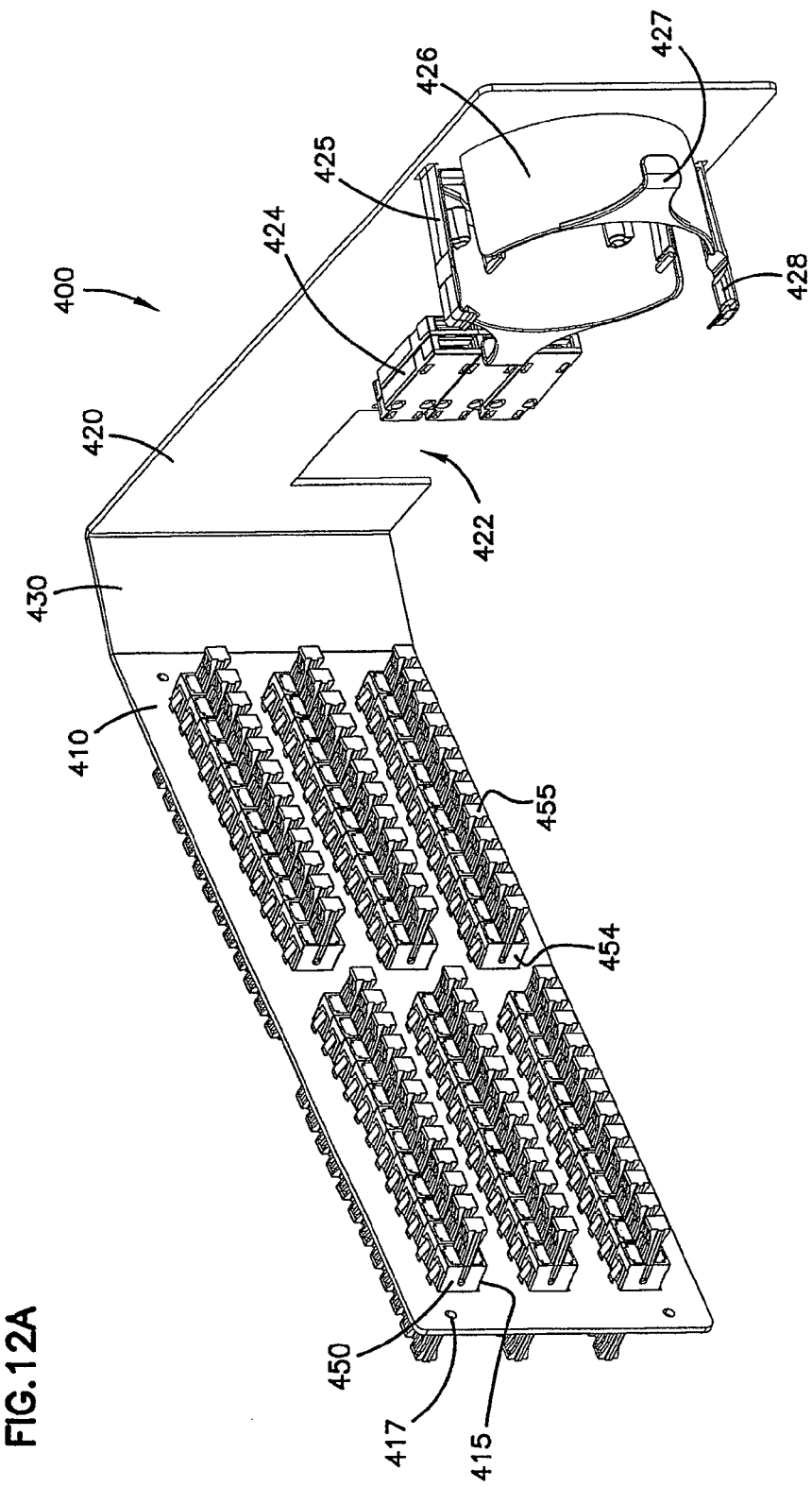
FIGS. 12A and 12B are front and rear perspective views of an example termination module of the distribution hub of FIG. 2A.
Figure 12B:
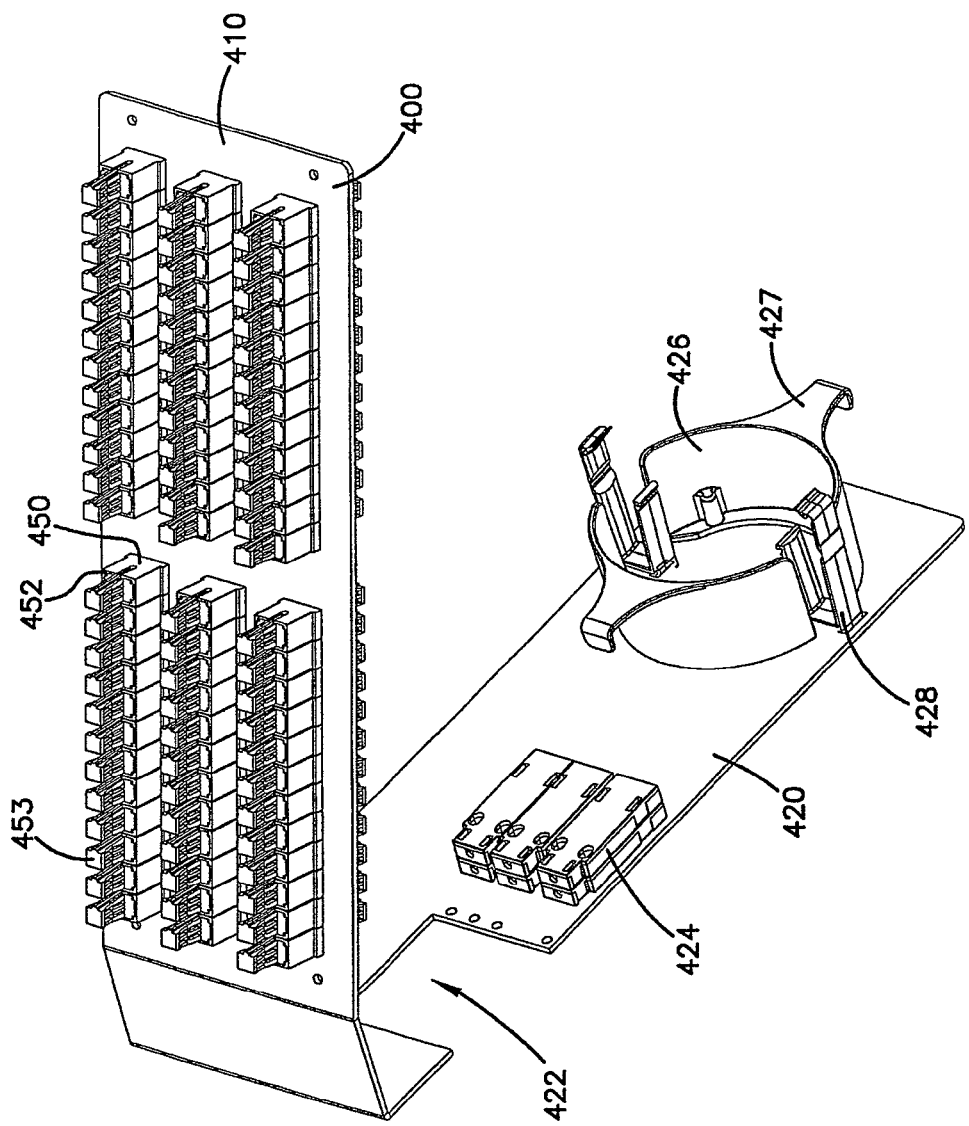

Referring now to FIGS. 12A-12B, as time passes and the number of subscribers increases, a user can add termination modules 400 to the swing frame 300. FIGS. 12A and 12B show one example of a termination module 400. The termination module 400 includes a termination leg 410 and a management leg 420 arranged in a substantially L-shaped configuration. In some embodiments, a linking section 430 connects the termination leg 410 to the management leg 420. In other embodiments, the linking section 430 is monolithically formed with either the termination leg 410 or the management leg 420. In still other embodiments, the termination leg 410, the management leg 420, and the linking section 430 are monolithically formed (e.g., are constructed as a single piece of bent sheet metal).

In some embodiments, a front side of the termination leg 410 of the termination module 400 (shown in FIG. 12B) mounts to the rear side of the main panel 310. In one embodiment, the termination leg 410 mounts to the main panel 310 using screws 417. In other embodiments, however, other fasteners such as bolts, rivets, nails, and other such devices can be used to connect the module 400 to the main panel 310. In still other embodiments, the module 400 can be attached to the main panel 310 using adhesive.

Each termination module 400 includes at least one row of fiber optic adapters 450 for connecting the fibers of the main cable 700 to the fibers of the distribution cable 708. Each adapter 450 has a front end 452 and a rear end 454. The front end 452 of each adapter 450 is configured to retain a connector 714 of a fiber 712 interfaced with the main line 700, or the connector 706 of a fiber 704 split from the main line 700. The rear end 454 of each adapter 450 is configured to retain a connector 710 of a fiber of the distribution cable 708. The adapters 450 protrude through the termination leg 410 so that the connectors 706 enter the front ends 452 of the adapters 450 from a front side of the main panel 310 and the connectors 710 of the distribution cable 708 enter the adapters 450 from a rear side of the main panel 310.

In the depicted embodiment, each module 400 includes six horizontal rows of adapters 450 that cooperate to define two side-by-side banks of adapters. When the module 400 is mounted to the main panel 310, the front side of the leg 410 abuts against the backside of the main panel 310, and the rows of adapters 450 project forwardly through the corresponding horizontal slots 314 defined by the panel 310.

The management leg 420 extends rearwardly from the termination leg 410. Each management leg 420 includes an appropriate number of fanouts 424 to accommodate the number of adapters 450 on the module 400. For example, in one embodiment, the termination leg 410 of a module 400 includes six rows of adapters 450, each row having twelve adapters 450, and the management leg 420 includes six 12:1 fanouts 424. As the term is used herein, a 12:1 fanout is a fanout configured to receive twelve optical fibers and to output a single cable ribbon containing the twelve fibers. In another embodiment, nine 8:1 fanouts or three 24:1 fanouts could be provided instead of the 12:1 fanouts. In still other embodiments, fanouts can be used to upjacket the fiber.

In some embodiments, the termination module 400 is pre-cabled at the factory to include a connectorized distribution fiber 708 coupled to each adapter 450. Dust caps 453 are generally provided on the front ends 452 of the adapters 450 to protect the terminated distribution fibers 708 from dust, dirt, and other contaminants. The connector 710 of each distribution fiber 708 is mounted within the rear end 454 of an adapter 450 and the distribution fibers 708 are routed from the connector 710 to the fanouts 424 provided on the management leg 420 of the termination module 400. In still other embodiments, the termination module 400 is not precabled and dust caps 455 are also provided on the rear ends 454 of the adapters 450 to protect the adapters 450.

In some embodiments, the management leg 420 of the termination module 400 also includes at least one cable management device 425 for managing excess fiber length of the distribution fibers 708. Generally, in such systems, the fibers 708 are routed first to the cable management device 425 and then to the fanouts 424. Examples of cable management devices 425 include a fiber spool, one or more radius bend limiters, one or more fiber clips, and other such devices. In the example shown, the management leg 420 includes a fiber spool 426 formed from two radius bend limiters. Each radius bend limiter includes a flange 427 for retaining the fiber on the spool 426. In some embodiments, one or more fiber cable clips 428 for retaining fiber cables can be spaced between the radius bend limiters of the spool 426.

Figure 13:
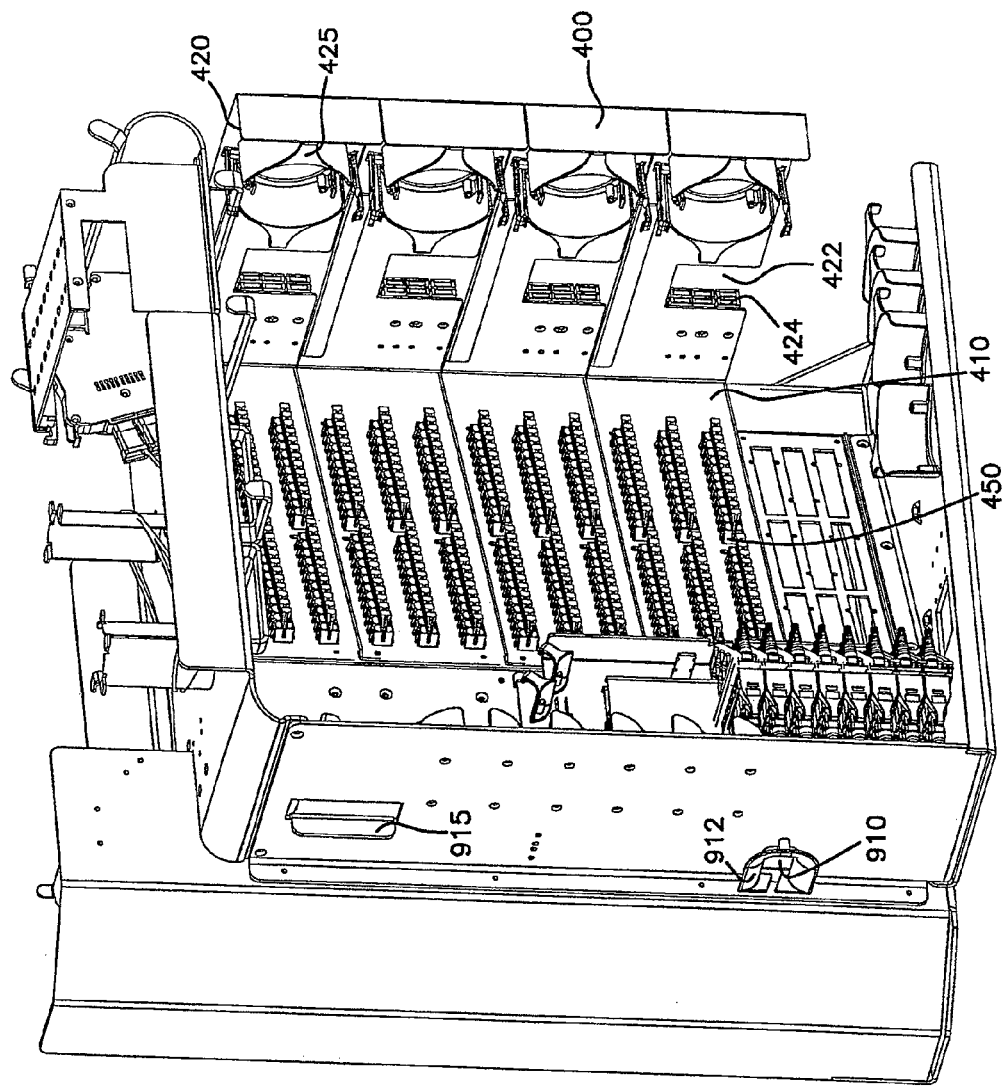
FIG. 13 is a rear perspective view of the swing frame of FIG. 4.

Referring now to FIG. 13, the management leg 420 of the termination module 400 includes an opening 422 through which the fibers are routed from the cable management devices 425 to the fanouts 424. Upon exiting the fanouts 424, the ribbon fibers are routed to a cabinet fanout (not shown) or other cable interface device. In other embodiments, the fanouts 424 are provided on the same side of the management leg 420 as the cable management device 425. In such embodiments, the ribbon fibers are routed from the fanouts 424 through the openings 422 and to the cabinet fanout. The cabinet fanout is mounted to the interior of the cabinet 201 and is not attached to the swing frame 300. The cabinet fanout can be used to reduce the ribbon fibers into a single jacketed stub cable that exits the FDH 200. The stub cable is spliced to a subscriber distribution cable outside of the FDH 200. In various embodiments, the stub cable ranges in length from about 25 feet to about 300 feet. In other embodiments, the distribution cable 708 can be routed into the cabinet 201 and spliced or otherwise connected to the fiber 708.

Referring now to FIG. 14, the rear side 304 of the swing frame 300 forms an open chamber adapted to house at least one termination module 400. The open chamber is defined by the bulkhead 301, the top panel 320, the bottom panel 330, and the side panel 340. FIG. 14 is a rear perspective view of four termination modules 400 mounted in the open chamber. The adapters 450 have been removed for ease in viewing. In other embodiments, any desired number of termination modules 400 can be mounted on the swing frame 300. The termination modules 400 are configured to mount to the rear side of the termination region 311 of the main panel 310.

Figure 15:
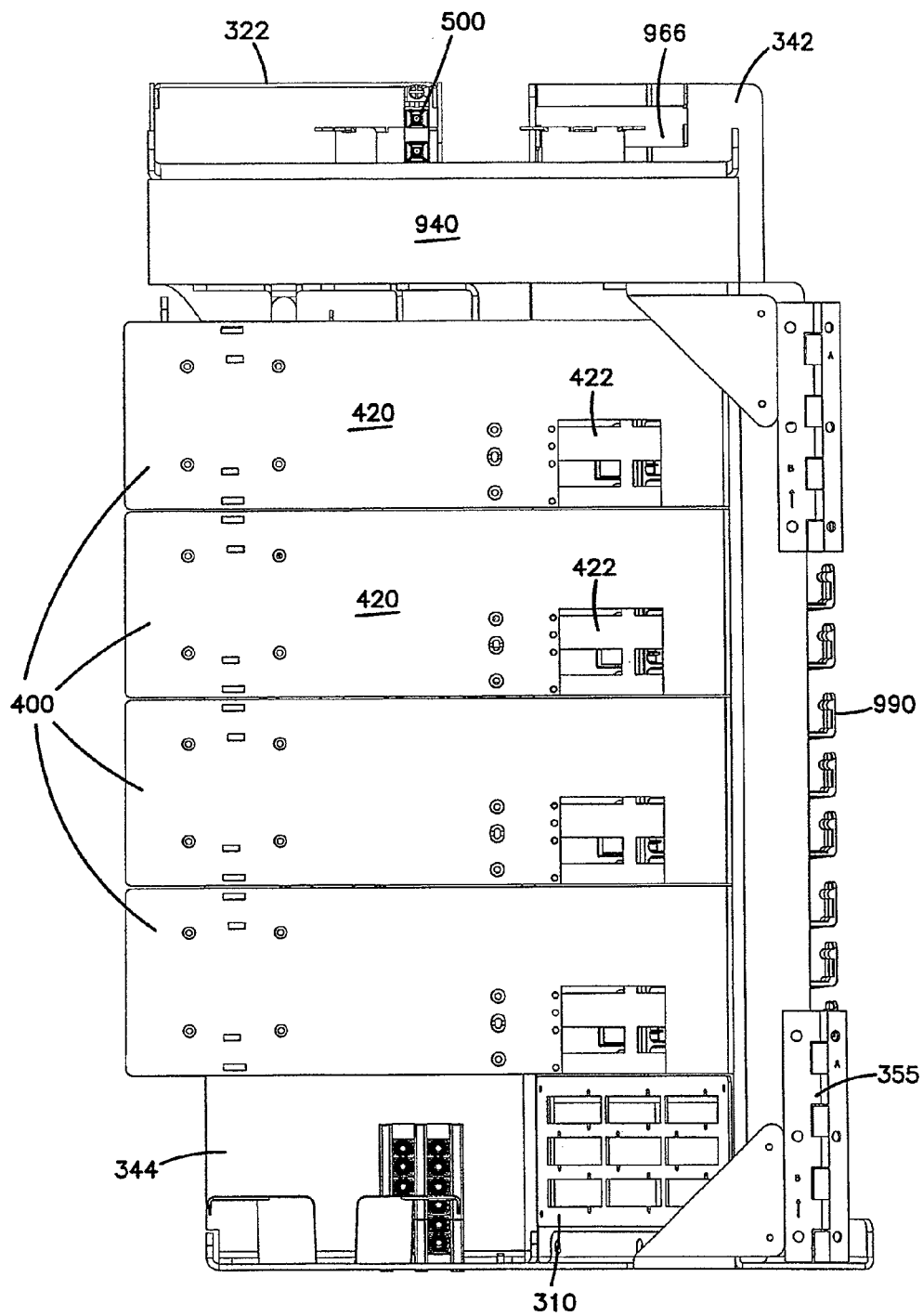
FIG. 15 is a left side view of the swing frame of FIG. 4.

FIG. 15 shows a left side view of a swing frame 300 having four termination modules 400 mounted therein. When multiple termination modules 400 are mounted to the rear side of the main panel 310, the management legs 420 of the termination modules 400 form a partial side panel opposing the side panel 340. In some embodiments, the management legs 420 of the modules 400 are secured to one another or to the swing frame 300. In other embodiments, shown in FIG. 15, the modules 400 are secured to the swing frame 300 only at the termination leg 410 and the management legs 420 are free floating.

Referring now to FIGS. 16-19, the swing frame 300 can be configured with different interface devices 800 (see FIG. 3) and cable management devices to create multiple fiber pathways between the incoming feeder cable 700 and the distribution lines 708. The interface devices 800 and management devices used in a particular configuration will depend on whether it is desirable to split the feeder cable 700 and what type of splitter module 500 is utilized.

In some embodiments, the feeder cable 700 connects to one or more splitter input fibers 702. In one such embodiment, a first end 701 of a splitter input fiber 702 is connectorized. In another such embodiment, the first end 701 is unconnectorized. The opposite end 703 of the input fiber 702 can either interface with an integral connector 520 on the splitter module 500, such as when using the splitter module depicted in FIGS. 8A-8C, or can penetrate the splitter housing 505. In other embodiments, however, the feeder cable 700 has connectors configured to interface with integral connectors 520 of the splitter module 500.

Figure 16:
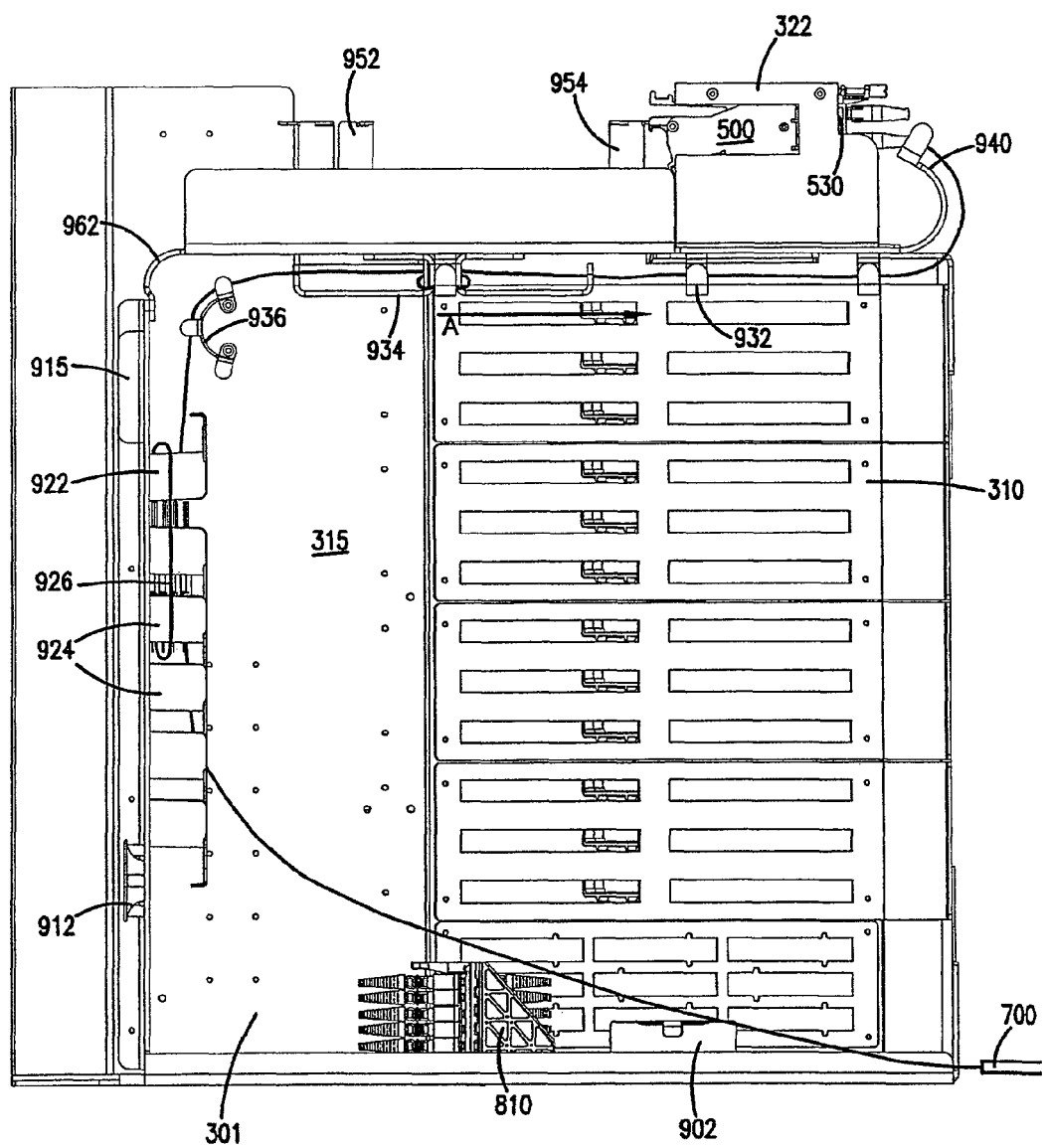
FIG. 16 is a rear view of a swing frame including example interface devices and cable management devices mounted at the rear side of a swing frame.

FIG. 16 is a rear view of the swing frame 300 adapted to interface a connectorized feeder cable 700 with a splitter module 500. To accomplish this interface, the cable management devices are arranged according to a configuration C1. In configuration C1, a cable storage spool 922 and one or more partial storage spools 924 are mounted to the side panel 340 of the swing frame 300. A fanout device 926 is mounted adjacent the spools 922, 924. A radius limiter 936 is mounted from the secondary panel near the corner formed by the top panel 320 and side panel 340. Support fingers 932 projecting downward from the top panel 320 form a path A along which fibers can be routed from one end 329 of the top panel 320 to the other end 328. In some embodiments, the support fingers 932 include a multi-pronged clip 934 having at least two fingers 932, each finger 932 extending in a different direction. In one example embodiment, the multi-pronged clip 934 includes four fingers 932 positioned orthogonally relative to one another. Any excess fiber length can be taken up by winding the pigtails 702 around the multi-pronged clip 934. A limiter 940 having tabs 945 extends from the top panel.

To connect the feeder cable 700 to the splitter 500, the cable 700 is first routed around spools 922, 924 and then to the fanout device 926. The fanout device 926 separates the fibers of the feeder cable 700 into individual input fibers. Any excess length of the individual fibers of the feeder cable 700 can be stored by wrapping the fibers around the spools 922, 924. The fibers of the feeder cable 700 are next routed around the limiter 936 and along the path A using the support fingers 932 projecting downward from the top panel 320. The feeder cable 700 is next curved around the limiter 940 extending from the top panel 320 and plugged directly into at least one of the adapter assemblies 530 secured to the splitter module housing 322. The fibers of the feeder cable 700 can be protected while being routed within the swing frame 300 by loose buffer tubes.

Figure 17:
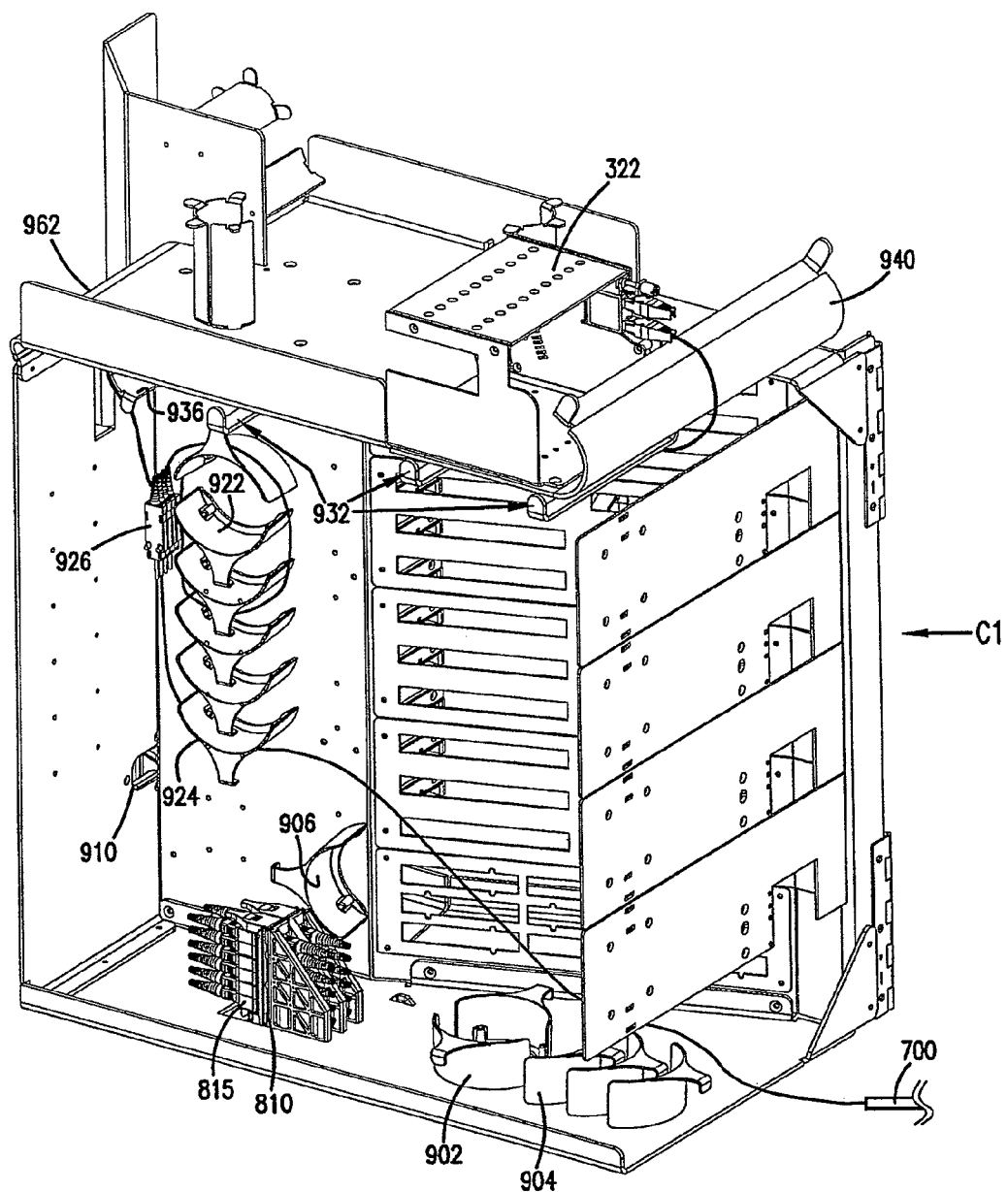
FIG. 17 is a rear perspective view depicting one example configuration of interface devices and cable management devices on a swing frame.

FIG. 17 is a rear perspective view of the swing frame 300 adapted to interface a connectorized feeder cable 700 to a splitter module 500. The cable management devices are arranged according to a variation of configuration C1. The storage spools 922, 924 and fanout device 926 are mounted to the rear side of the secondary panel 315 rather than the side panel 340. In other embodiments (not shown), the storage spools 922, 924 and fanout device 926 could be mounted to the bottom panel 330. Regardless of the location of the spools 922, 924 and fanout device 926, the feeder cable 700 is still routed from the fanout device 926 to the bend limiter 936, along path A, over the bend limiter 940 and to the adapter assembly 530 mounted on the splitter module housing 322.

Figure 18:
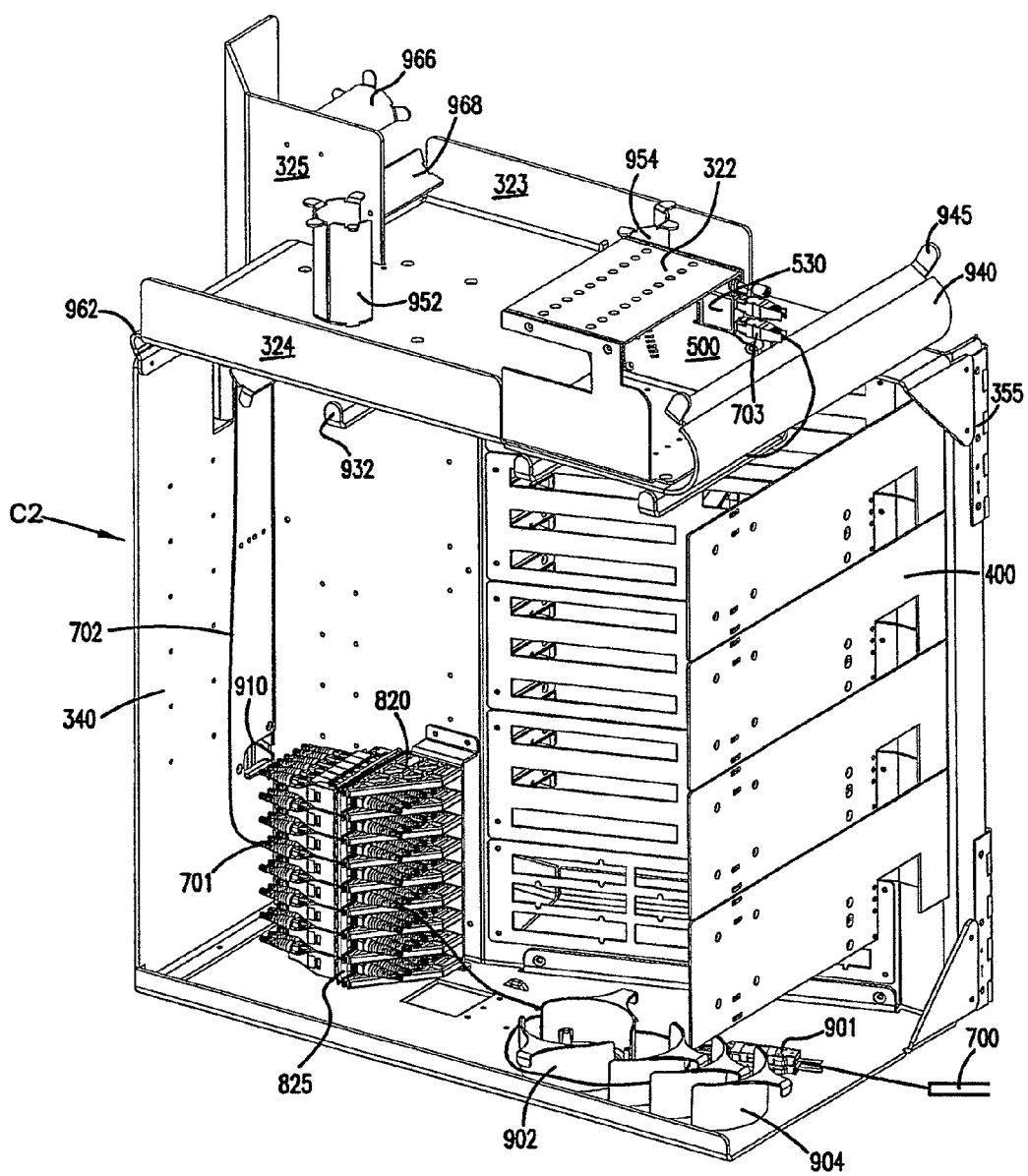
FIG. 18 is a rear perspective view depicting another example configuration of interface devices and cable management devices.
Figure 19:
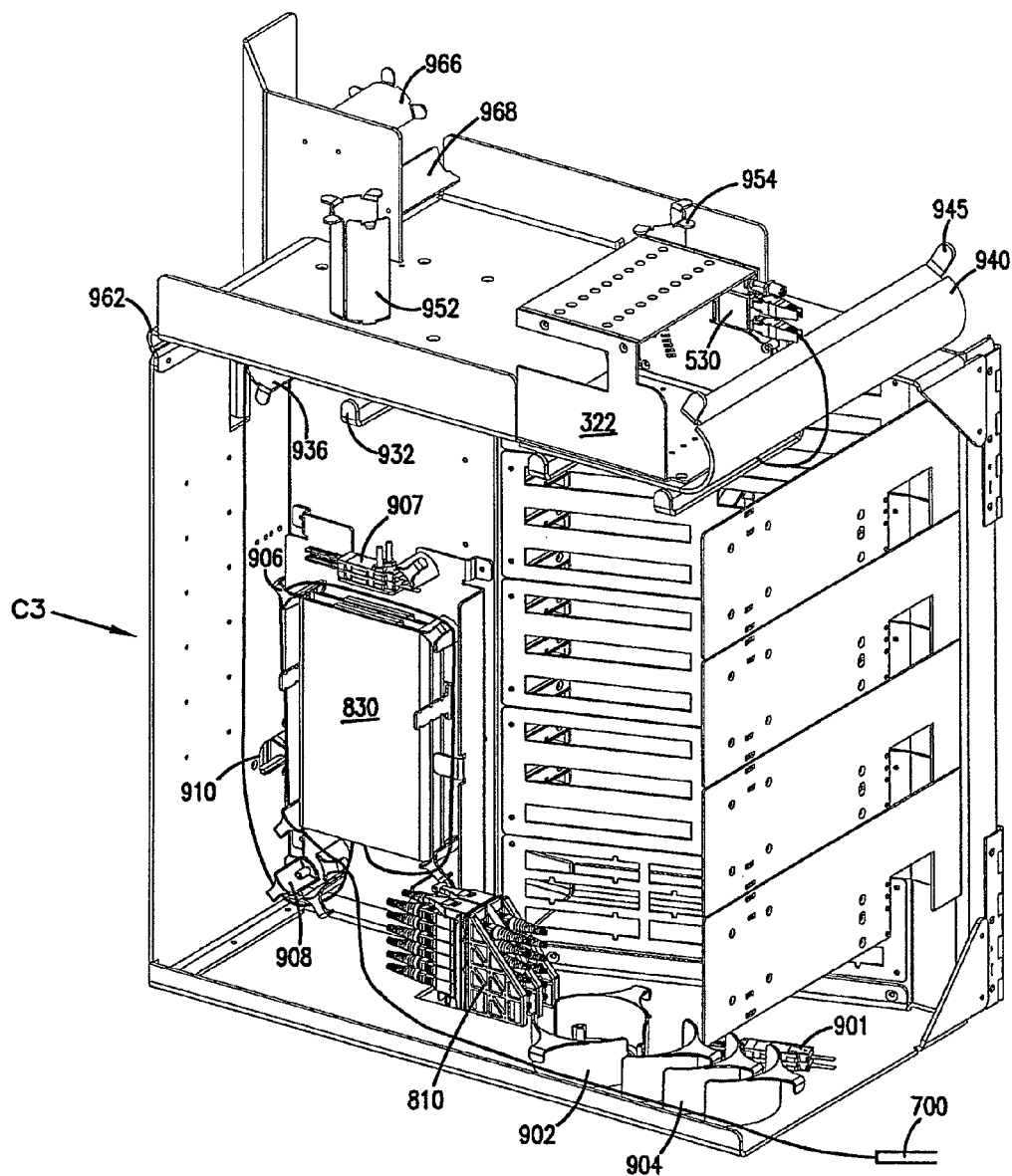
FIG. 19 is a rear perspective view depicting yet another example configuration of interface devices and cable management devices.

Referring now to FIGS. 18-19, the feeder cable 700 can be interfaced with splitter inputs 702 using at least one interface device 800 rather than connecting directly to the splitter 500. FIG. 18 is a rear perspective view of the swing frame 300 configured to interface a connectorized feeder cable 700 with a splitter module 500 through intermediate splitter input fibers 702. Each splitter input fibers 702 has a first connectorized end 703 that plugs into one of the adapter assemblies 530 opposite the integral connectors 520 of the splitters 500. In other embodiments not using a splitter having an integral connector, however, the splitter input 702 is a pigtail that penetrates the splitter housing 505 rather than plugging into an adapter assembly 530. Each splitter input fibers 702 also has a second connectorized end 701 that interfaces with a connectorized end of a fiber of the feeder cable 700.

Such input pigtails 702 are routed from the adapter assembly 530 over the bend radius limiter 940 and underneath the top panel 320 as shown in FIG. 16. In particular, the input pigtails 702 are routed along the path A towards the side panel 340 using the support fingers 932 and then around the radius bend limiter 936. The ends 701 of the input pigtails are then connected to the feeder cable 700 using a first adapter module 820. In some embodiments, the first adapter module is mounted to the secondary panel 315 adjacent the bottom panel 330. In other embodiments, however, the first adapter module 820 can be secured to the bottom panel 330 or the side panel 340. The first adapter module 820 includes multiple adapters 825 arranged in one or more rows. In some embodiments, each row includes about six adapters 825. Additional information regarding the adapter module 820 can be found in U.S. application Ser. No. 11/095,033, filed Mar. 31, 2005, and entitled "Adapter Block Including Connector Storage;" and U.S. Pat. Nos. 5,497,444; 5,717,810; 5,758,003; and 6,591,051, the disclosures of which are hereby incorporated by reference.

In order to connect the feeder cable 700 to the first adapter module 820, additional cable management devices are provided according to a second configuration C2. The second configuration C2 includes a fanout device 901 and one or more full or partial slack storage fiber spools 902, 904, respectively. In the example shown, the fanout device 901 and storage spools 902, 904 are mounted to the bottom panel 330.

The feeder cable 700 is first routed to the fanout device 901, which separates the fibers of the ribbon cable 700 into individual fibers. Any excess length of the individual fibers of the feeder cable 700 can be stored in the slack storage spool 902 and partial slack storage spools 904. The fibers of the feeder cable 700 are next routed to the first adapter module 820. The connectorized ends of the feeder cable 700 are mounted into one end of the adapters 825 of the first adapter module 820. The connectorized ends 701 of the input fibers 702 are routed from the radius limiter 936 to the opposite end of the adapters 825 of the first adapter module 820. The adapters 825 provide an interface between the connectors of the feeder cable fibers 700 and the connectors 701 of the input fibers 702.

FIG. 19 is a rear perspective view of the swing frame 300 configured for use with a splitter module and a feeder cable 700 having unconnectorized ends. The feeder cable 700 is spliced to splitter input fibers 702 having unconnectorized second ends 701. In order to connect the feeder cable 700 to the unconnectorized fiber inputs 702, a splice tray 830 is provided at the rear side 304 of the swing frame 300.

In order to connect the feeder cable 700 to the splice tray 830, additional cable management devices are provided according to a third configuration C3. The third configuration C3 includes a fanout device 907 and one or more radius bend limiters 906 mounted around the splice tray 830. Additionally, at least one radius bend limiter 908 is positioned adjacent the splice tray 830. Each limiter 906 includes a tab 907 to maintain the fibers in a loop around the limiters 906. The limiters 906 are oriented to prevent fiber from catching on the corners of the splice tray 830. In some embodiments, the splice tray 830 and limiters 906 are positioned on the back of the secondary panel 315. In other embodiments, however, the splice tray 830 and limiters 906 can be positioned in any desired location at the rear side 304 of the swing frame 300.

The unconnectorized ends of the feeder cable 700 are routed around the limiters 906 and to the splice tray 808. Any excess length of the individual fibers of the feeder cable 700 can be stored by wrapping the fibers around the splice tray 830. The input fibers 702 from the splitter module 500 are routed from the radius limiter 936 around the limiter 908 and into the splice tray 830. The unconnectorized ends of the feeder cable 700 are then spliced with the unconnectorized ends 701 of the input fibers 702.

Still referring to FIGS. 16-19, in some embodiments, it may be desirable not to split one or more of the feeder cables 700 to enable transmission of a stronger or more reliable signal to a subscriber. In some embodiments, therefore, the swing frame 300 is further configured to enable at least one fiber (referred to as a pass-through fiber) 712 to interface with a fiber from the feeder cable 700. The pass-through fiber 712 bypasses the splitter modules 500 and proceeds to the front of the swing frame 300 to interface with a distribution line 708.

To accomplish such a routing, the swing frame 300 includes an opening 910 in the rear flange 344 of the side panel 340. In some embodiments, the opening 910 includes a radius limiter 912 (best seen in FIG. 13) extending outward from the outside surface of flange 344 to prevent excessive bending of a fiber routed through the opening 910. A tab 915 can also be pressed outward in rear flange 344 to define a channel up the outer side of the rear flange 344. A radius bend limiter 962 links the rear flange 344 of the side panel 340 to the top panel 320. Additional cable management devices are provided based on the configuration C1, C2, C3 with which the swing frame 300 is set up.

Referring to FIG. 17, if the swing frame 300 is arranged according to configuration C1, then the connectorized fibers of the feeder cable 700 are connected to the input fibers 702 using a second adapter module 810. The adapter module 810 includes multiple fiber optic adapters 815 configured to accept connectorized fibers from either end. The swing frame 300 also includes additional cable management in the form of a bend radius limiter 906 and slack storage spools 902, 904.

To bypassing the splitter modules 500, the feeder cable 700 is still routed around spools 922, 924 to the fanout device 926. From the fanout device 926, however, the feeder cable fibers 700 are routed back around spools 922, 924, around bend limiter 926 and then around spools 902, 904. From the spools 902, 904, the connectorized ends of the fibers 700 are secured to the adapter module 810. The adapter module 810 connects the fibers 700 with connectorized ends of pass-through fibers 712 that are routed out the opening 910, up the side panel 340, over the limiter 962, and onto the top panel 320. From the top panel 320, the pass-through fibers 712 are routed towards the termination modules 400 as described above with reference to FIGS. 10 and 11.

Referring to FIG. 18, pass-through fibers 712 can also be used with the second configuration C2. The feeder cable 700 is still routed first to the fanout device 901 and then to one end of the adapter module 820 with any slack being stored in spools 902, 904. However, instead of splitter pigtails 702 connecting to the other end of the adapter module 820, the pass-through pigtails 712 are plugged into the adapter module 820. The pass-through pigtails 712 then follow the same routing pattern as discussed in the previous paragraph.

Referring to FIG. 19, the pass-through pigtails 712 can also be spliced to unconnectorized ends of the feeder cable 700. If such a configuration is desired, then the swing frame 300 is provided with the second adapter module 810 discussed above with reference to FIG. 17. The feeder cable 700 is still routed around limiters 906 and up to the splice tray 830 according to the configuration C3. Any excess length of the individual fibers of the feeder cable 700 can be stored by wrapping the fibers around the limiters 906. However, the fibers of the feeder cable 700 are spliced to connectorized pigtails 711 rather than to the splitter inputs 702. From the splice tray 830, the connectorized pigtails 711 are routed around the storage spools 902, 904 and then plugged into the second adapter module 810. The second adapter module 810 connects the pigtails 711 with the pass-through connectorized fibers 712 that are routed out of the opening 910, up the side panel 340 to the limiter 962, and onto the top panel 320.

The pass-through fibers 712 bypass the splitter module 500 and are routed around the second fiber spool 954 of the top panel 320 and into the channel B via either the limiter 964 or the partial spool 966. The routing of the pass-through fiber 712 along the front side 302 of the swing frame is substantially the same as the routing of the splitter pigtails 704 discussed above with reference to FIGS. 10 and 11. Typically, a pass-through fiber 712 is immediately connected to a subscriber line 708 via an adapter 450 on a termination module 400. In some embodiments, however, the pass-through fibers 712 can be stored in empty locations on the storage modules 600.

FIGS. 20-29 show alternative fiber distribution hubs (FDH) having features in accordance with the principles of the present disclosure. One example FDH 200' is shown in FIGS. 20-23. The fiber distribution hub 200' includes a cabinet 201' housing the same components previously described with respect to the fiber distribution hub 200. For example, the cabinet 201' defines a primary compartment 230 that can be accessed by opening front doors 210, 212. Swing frame 300 is pivotally mounted within the primary compartment 230. A termination region and a storage region are provided on the swing frame. Splitters are also provided on the spring frame. Further details regarding the internal components of the primary compartment 230 can be found by referring to the detailed description pertaining to the fiber distribution hub 200.

The fiber distribution hub 200' has been modified to include a secondary compartment 232 that can be accessed from the backside of the cabinet 201'. The secondary compartment 232 can also be referred to as a pocket, recess, inset region, chamber, or like terms. The secondary compartment 232 can be accessed by opening a secondary door 234. The secondary door 234 is located on the outside of the cabinet 200'. When the secondary door 234 is open, access is provided to the secondary compartment 232, but no access is provided to the primary compartment 230 of the cabinet 201'. Therefore, a field technician can quickly find and enter the secondary compartment 232 without disturbing any of the internal telecommunications components of the fiber distribution hub 200'.

Figure 22:
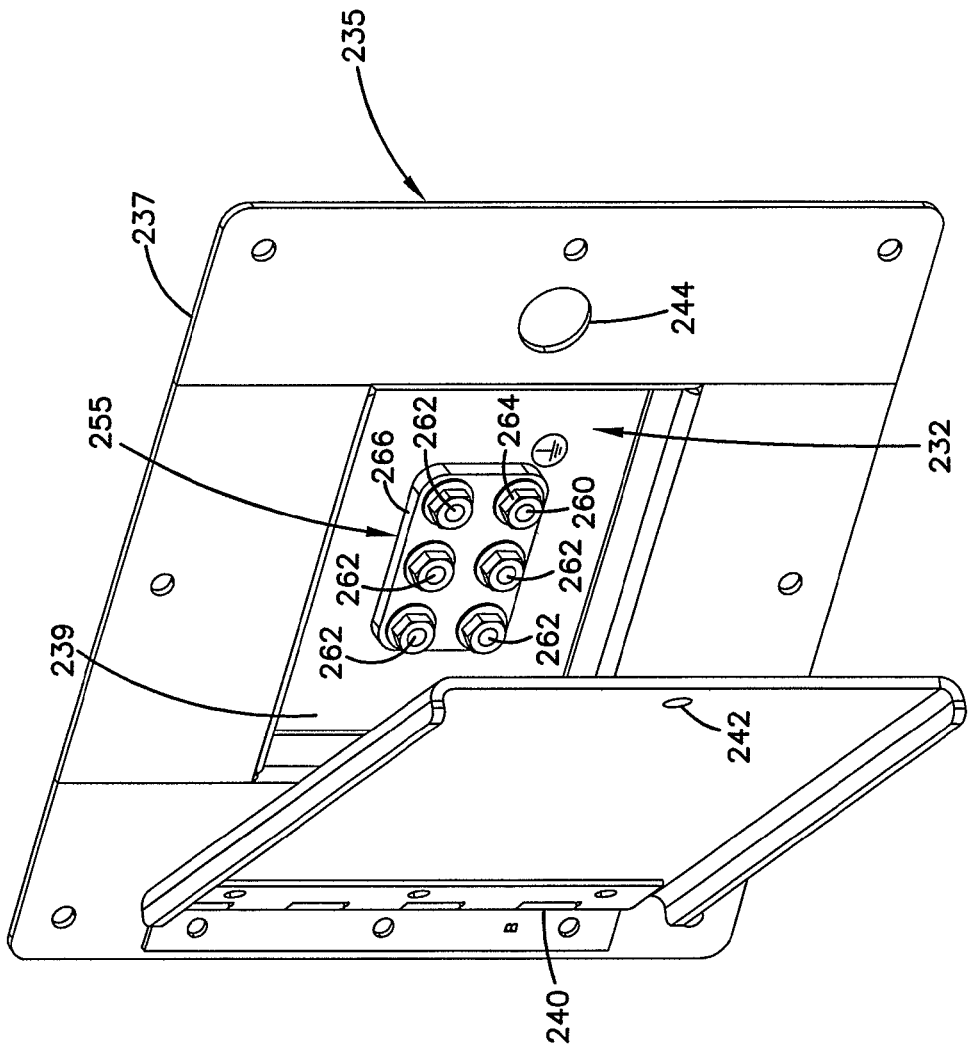
FIG. 22 is a perspective view of the secondary compartment of FIG. 20 in isolation from the main cabinet of the fiber distribution hub.

Referring to FIG. 22, the secondary compartment 232 is defined by a plate 235 having a mounting flange portion 237 and an enclosure portion 239. The mounting flange portion 237 extends around the perimeter of the enclosure portion 239. The enclosure portion 239 projects rearwardly from the mounting flange portion 237 and defines a generally rectangular recess that forms the secondary compartment 232. The secondary door 234 is shown pivotally connected to the plate 235 by a hinge 240. The secondary door 234 can be secured in a closed position by any conventional latching arrangement. In one embodiment, the secondary door 234 can be held in a closed position by a bolt (not shown) that extends through opening 242 and threads into a fixed nut (not shown) secured with an opening 244 of the plate 235.

Figure 20:
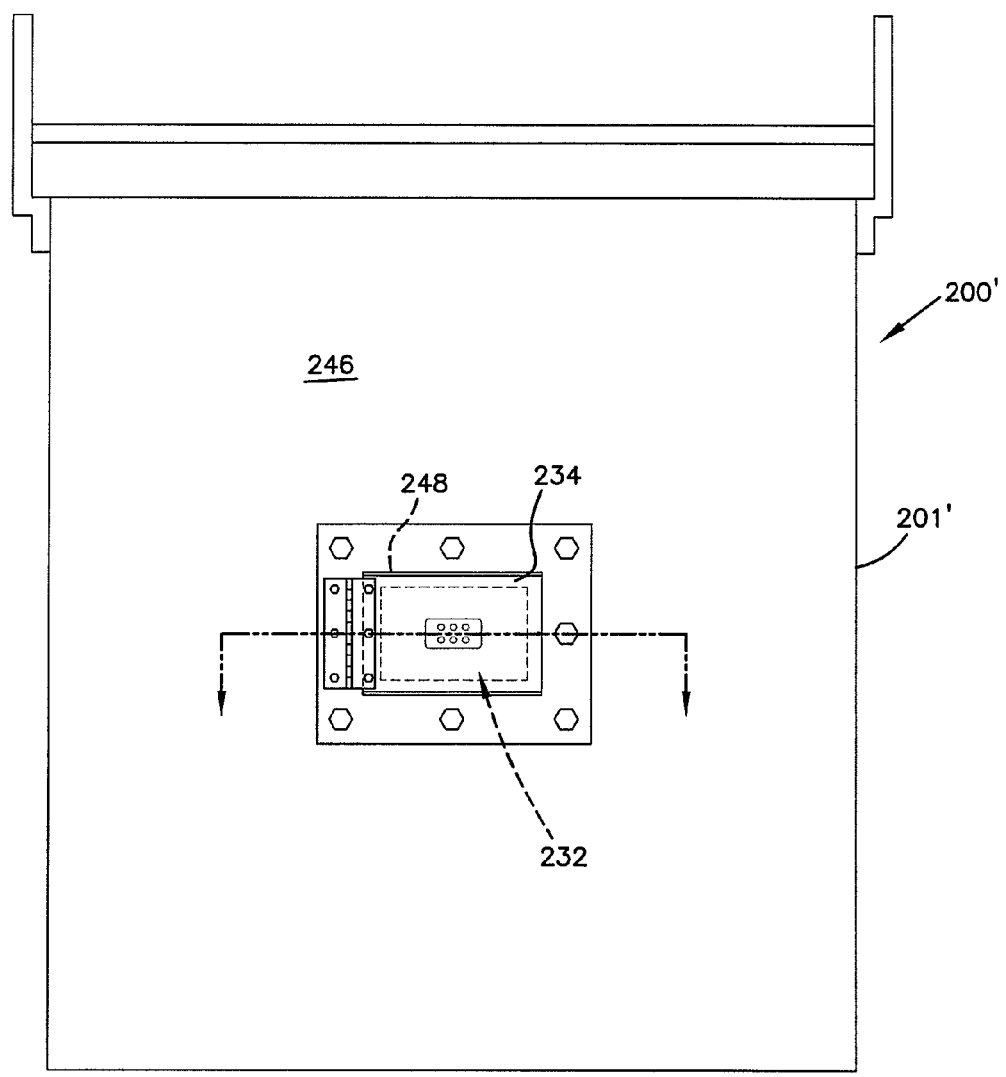
FIG. 20 is a rear view of a fiber distribution hub cabinet having a secondary compartment or pocket for housing a cable grounding interface.
Figure 21:
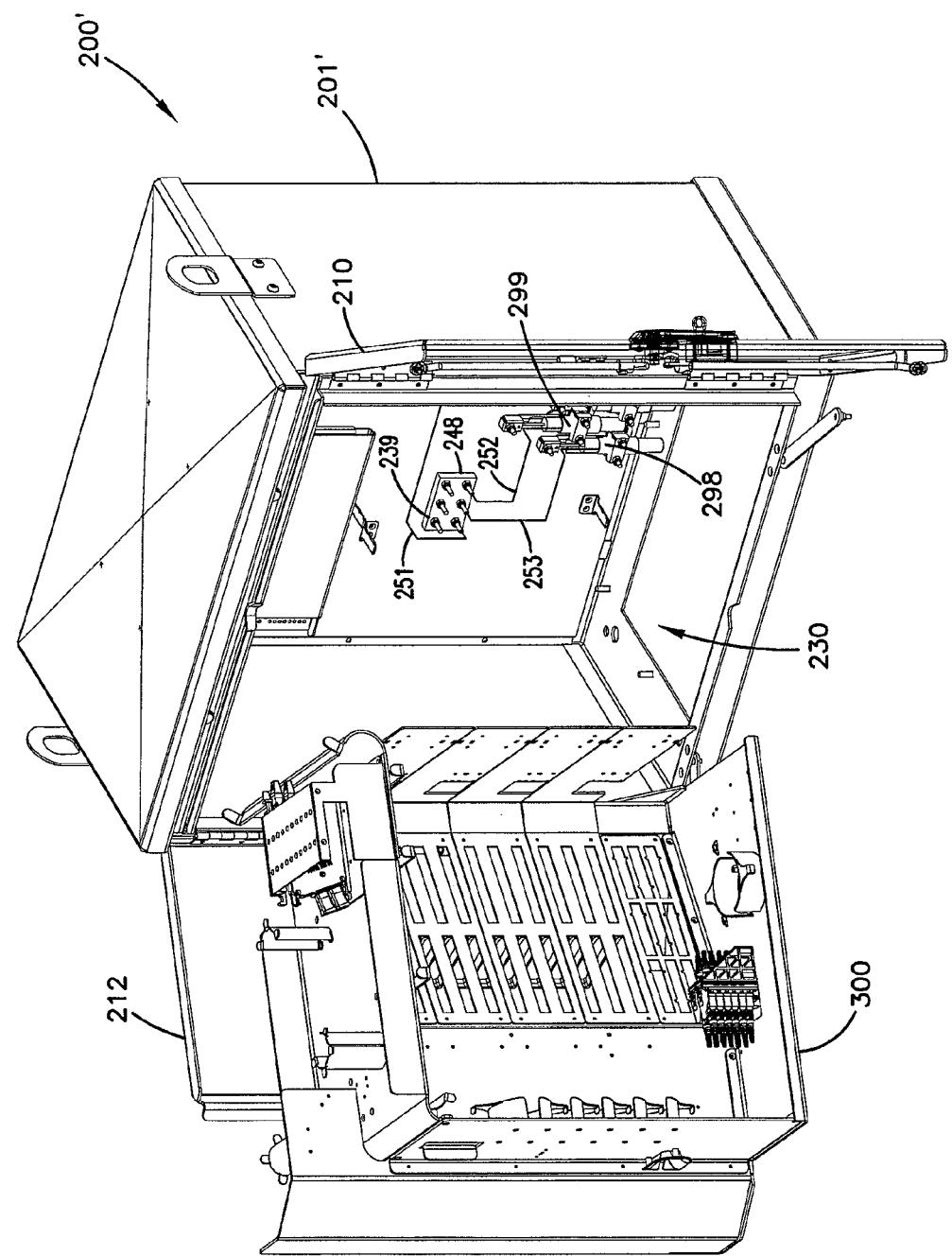
FIG. 21 is a front view of the fiber distribution hub of FIG. 20 with the cabinet open and the swing frame pivoted out to show that the grounding pins of the grounding interface project into the interior of a main compartment of the cabinet.

As shown best at FIG. 20, the plate 235 mounts to a back wall 246 of the cabinet 201'. The back wall 246 of the cabinet 201' has an opening 248 for receiving the enclosure portion 239 of the plate 235. To mount the plate 235 to the back wall 246, the enclosure portion 239 is inserted through the opening 248 and the mounting flange portion 237 of the plate 235 is fastened (e.g., with bolts or other fasteners) to the back wall 246. A sealing gasket 250 (shown at FIG. 23) can be provided between the mounting flange portion 237 and the back wall 246 to prevent moisture from entering the primary compartment 230 of the cabinet 201'. When the plate 235 is mounted to the back wall 246, the enclosure portion 239 projects slightly into the primary compartment 230 as shown at FIG. 21.

The secondary compartment 232 is configured to protect and provide ready access to a grounding interface 255 used to interconnect the cabinet 201' and shielded cables entering/exiting the cabinet 201' to ground. As shown at FIG. 22, the grounding interface 255 includes terminals such as a chassis grounding post 260 and five cable grounding posts 262. In a preferred embodiment, the posts 260, 262 are all externally threaded along their lengths. The posts 260, 262 all pass through openings defined by an electrically conductive bus plate 266. In one embodiment, the bus plate is metal such as copper. Plate contact members such as flanged nuts 264 are threaded on each of the posts 260, 262. When the flanged nuts 264 are threaded down in contact with the bus plate 266, the bus plate 266 functions as an electrical bus that electrically connects all of the grounding posts 260, 262 to one another. The chassis grounding post 260 is preferably electrically connected to ground. Therefore, when all of the posts 260, 262 are electrically connected to one another by the bus plate 266, the posts 260, 262 are all commonly grounded.

When a field technician needs to direct a locator signal through the shields of one of the cables grounded through the grounding interface, it is desirable to disconnect the shield of the cable from ground and to isolate the selected cable from the other cables. Preferably, this is done in a easy, non-time consuming manner. In the depicted embodiment, a given cable can be disconnected from ground by merely backing off the flanged nut 264 corresponding to the cable a sufficient amount so that the flanged nut 364 no longer contacts the bus plate 266. With the flanged nut backed off, the selected cable grounding post 262 is disconnected from the chassis grounding post 260. This allows a locator signal to be easily directed through the selected cable grounding post 262 to the shield of the cable desired to be located.

Figure 23:
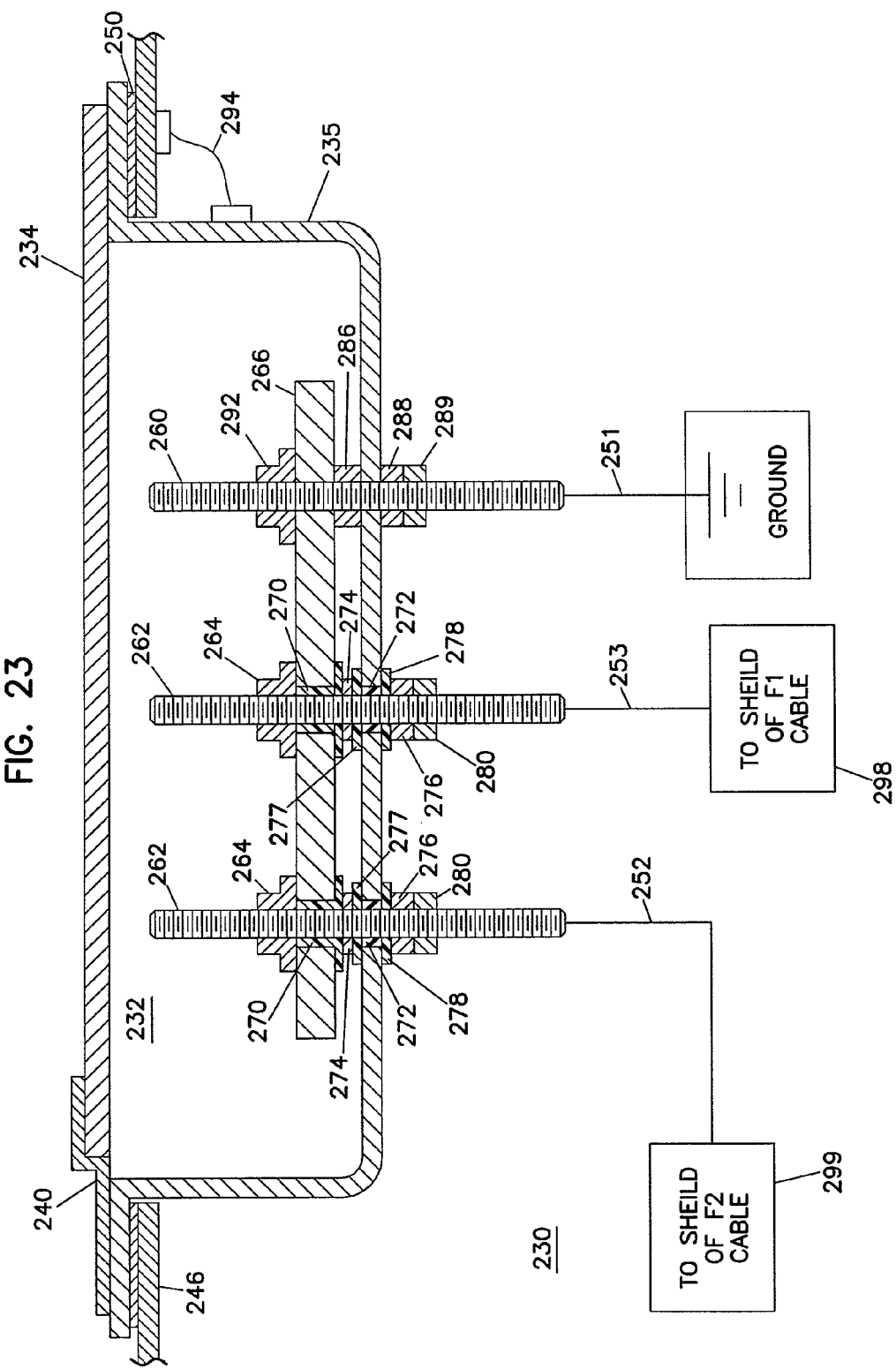
FIG. 23 is a cross sectional view taken along section line 23-23 of FIG. 20.

FIG. 23 shows an example mounting configuration for the bus plate 266. As shown at FIG. 23, each cable grounding post 262 is electrically isolated from the bus plate 266 by a first dielectric bushing 270 and is electrically isolated from the plate 235 by a second dielectric bushing 272. The dielectric bushings 270, 272 are preferably generally cylindrical sleeves that fit over the cable grounding posts 262 and fit within openings defined by the bus plate 266 and the plate 235, respectively. The first and second post retention nuts 274, 276 are threaded on the cable grounding posts 262 to lock the posts 262 in place and prevent axial movement of the posts 262. For example, the post retention nuts 274, 276 are threaded toward one another on the posts 262 until the plate 235 is clamped between the nuts 274, 276. Dielectric insulating washers 277, 278 are mounted between the post retention nuts 274, 276 and the plate 235 such that the nuts 274, 276 are electrically isolated from the plate 235. Additional nuts 280 can be provided on the cable grounding posts 262 for use in connecting wires to the posts. For example, one end of a wire can be clamped between nuts 280, 276 while the other end is electrically connected (e.g., by a clip) to the metal shield of a cable routed to the fiber distribution hub 200'.

The chassis grounding post 260 is mounted in a slightly different configuration because it is typically not desired to isolate the chassis grounding post 260 from the bus plate 266 or the plate 235. In the depicted embodiment, nuts 286, 288 are used to clamp the chassis grounding posts 260 to the plate 235. No bushings or other isolators are provided between the plate 235 and the chassis grounding post 260. Thus, the chassis grounding post 260 is electrically connected to the plate 235, preferably at all times. An additional nut 289 can be used to secure a grounding wire to the chassis grounding post 260. The grounding wire 290 preferably runs from the chassis grounding post 260 to ground. A nut 292 is also provided on the chassis grounding post 260 to improve electrical connection between the bus plate 266 and the chassis grounding post 260.

In alternative embodiments, a dielectric bushing can also be provided between the chassis grounding post 260 and the bus plate 266. In this way, by backing off flange nut 292, all five of the cable grounding post 262 will be disconnected from ground. In this way, a technician may be able to simultaneously direct locating signals through all of the cable shields by directing the signal through one of the cable grounding posts 262.

As described above, the chassis grounding post 260 functions to ground the cabinet 201'. Therefore, an electrical connection preferably exists between the plate 235 and the main body of the cabinet 201'. This may be provided by regions of metal-to-metal contact between the mounting flange portion 237 of the plate 235 and the back wall 246 of the cabinet 201'. Alternatively, a wire 294 can also be used to provide an electrical connection between the main back wall 246 and the plate 235. Similar wires can be used to provide electrical connections between the front doors 210, 212 and the main body of the cabinet 201'.

Referring again to FIGS. 21 and 23, interior ends of the posts 260, 262 are located within the primary compartment 230 of the cabinet 201'. As shown at FIG. 23, the interior end of the chassis grounding post 260 is electrically connected to ground 297 (e.g., a metal post pounded in the ground) by a wire 251 that extends from the interior end of the post 260 through the bottom of the cabinet to ground. Similarly, the interior ends of the two depicted cable grounding posts 262 are electrically connected to the shields of cables 298, 299 routed to the fiber distribution hub 200'. Conventional wires 252, 253 can be used to provide the electrical connections between the interior ends of the posts 262 and the cables 298, 299. Once the wires 251-253 have been connected, there is no need for the wires 251-253 to be later disturbed or disconnected by a field technician. Instead, rather than working inside the main compartment 230, the cables 298, 299 can be individually isolated from outside the primary cabinet 230 within the secondary compartment 232.

In general use, a field technician arriving at the fiber distribution hub 200' merely needs to open the secondary door 234 to access the grounding interface 255. With the secondary door 234 open, the technician identifies the cable grounding post 262 corresponding to the buried cable desired to be located. The field technician then loosens the flanged nut 264 corresponding to the selected cable grounding post 262 such that the post 262 is electrically isolated from the bus plate 266 and disconnected from ground. With the post 262 electrically isolated, a locator signal can be transmitted through the cable grounding post 262 to the shield of the underground cable desired to be located. After the cable has been located and marked, the flanged nut 264 is tightened back down against the bus plate 266 such that the cable is again electrically connected to ground.

FIGS. 24-29 illustrate an alternative secondary compartment 232' that can be accessed from the backside of the cabinet 201'. The secondary compartment 232' can be accessed by opening a secondary door 234' (FIG. 27) located on the outside of the cabinet 200'. The secondary door 234' is substantially similar to the secondary door 234 previously described with respect to FIGS. 20-23. When the secondary door 234' is open (see FIG. 28), access is provided to the secondary compartment 232', but no access is provided to the primary compartment 230 of the cabinet 201' (FIG. 21). Therefore, a field technician can quickly find and enter the secondary compartment 232' without disturbing any of the internal telecommunications components of the fiber distribution hub 200'.

Figure 25:
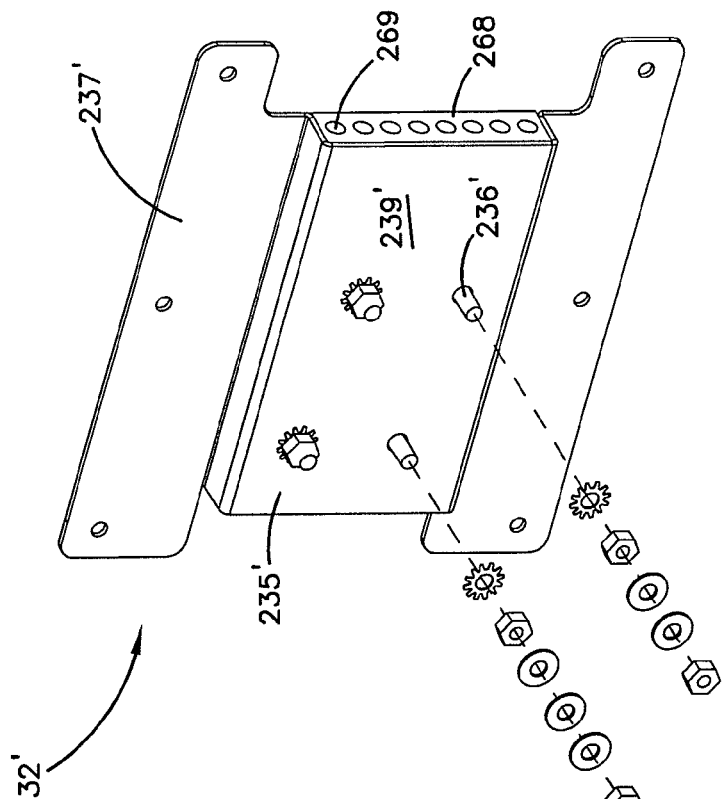
FIG. 25 illustrates an opposite side of the alternative secondary compartment of FIG. 24.

In general, the secondary compartment 232' is defined by a plate 235' (FIG. 24) having a mounting flange portion 237' and an enclosure portion 239' (FIG. 25). The mounting flange portion 237' extends partially around the perimeter of the enclosure portion 239'. The enclosure portion 239' projects from the mounting flange portion 237' towards the primary compartment 230 of the cabinet 200'. The enclosure portion 239' defines a generally rectangular recess that forms the secondary compartment 232'. The plate 235' generally mounts to a panel of the cabinet 201', such as to the back wall 246 (FIG. 20), in substantially the same manner as previously described with respect to the plate 235, for example, with fasteners 238'.

The secondary compartment 232' is configured to protect and provide ready access to a grounding interface 255' used to interconnect the cabinet 201' and shielded cables entering/exiting the cabinet 201' to ground. In general, the shielded cables are grounded by feeding conventional electrical grounding wires 252', 253' from the cables 298, 299 (FIG. 21) into the secondary compartment 232' and coupling electrical contacts 258' on the ends of the electrical grounding wires 252', 253' to the grounding interface 255'.

The electrical grounding wires 252', 253' are fed into the secondary compartment 232' through openings defined between the enclosure portion 239' of the plate 235' and the back wall 246 of the cabinet 201". Support structures 268 typically extend along these openings to enclose the secondary compartment 232' to protect the internal components of the primary compartment 230' and the internal components of the secondary compartment 232'. The support structures 268 also guide the electrical wires 252', 253' into the secondary compartment 232'. For example, foam inserts 268 having one or more apertures 269 through which the electrical wires 252', 253' can be routed can be provided on one or both sides of the secondary compartment 232'.

Figure 24:
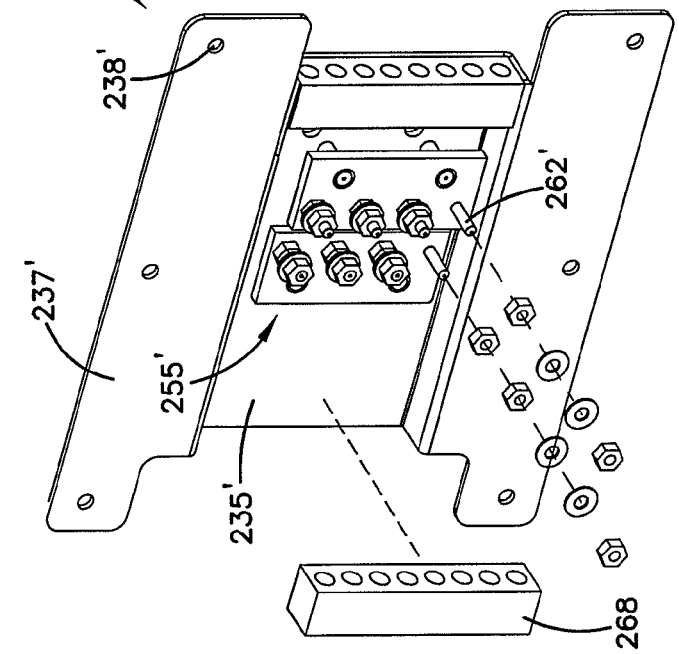
FIG. 24 illustrates one side of an alternative secondary compartment that can be accessed from the backside of a telecommunications cabinet.

As shown at FIG. 24, the grounding interface 255' includes terminals such as grounding posts 262'. In a preferred embodiment, the grounding posts 262' are all externally threaded along their lengths. The posts 262' protrude from one or more electrically conductive bus plates 266' (see FIG. 27). In one embodiment, a bus plate 266' is formed from a metal, such as copper, and the posts 262' are welded to the bus plate 266'. The bus plate 266' functions as an electrical bus that electrically connects the grounding posts 262' to one another. The bus plate 266' is preferably electrically connected to ground, thereby electrically connecting all of the grounding posts 262' to a common ground.

The bus plate 266' can be electrically connected to ground in a variety of ways. For example, one of the grounding posts 262' may serve as a chassis grounding post as discussed above with reference to the grounding interface 255. In other embodiments, the bus plate 266' is mounted to the plate 235', for example using bolts 236', to electrically connect the bus plate 266' and the plate 235'. The plate 235' is mounted to the cabinet 201', which can be electrically connected to ground.

Figure 26:
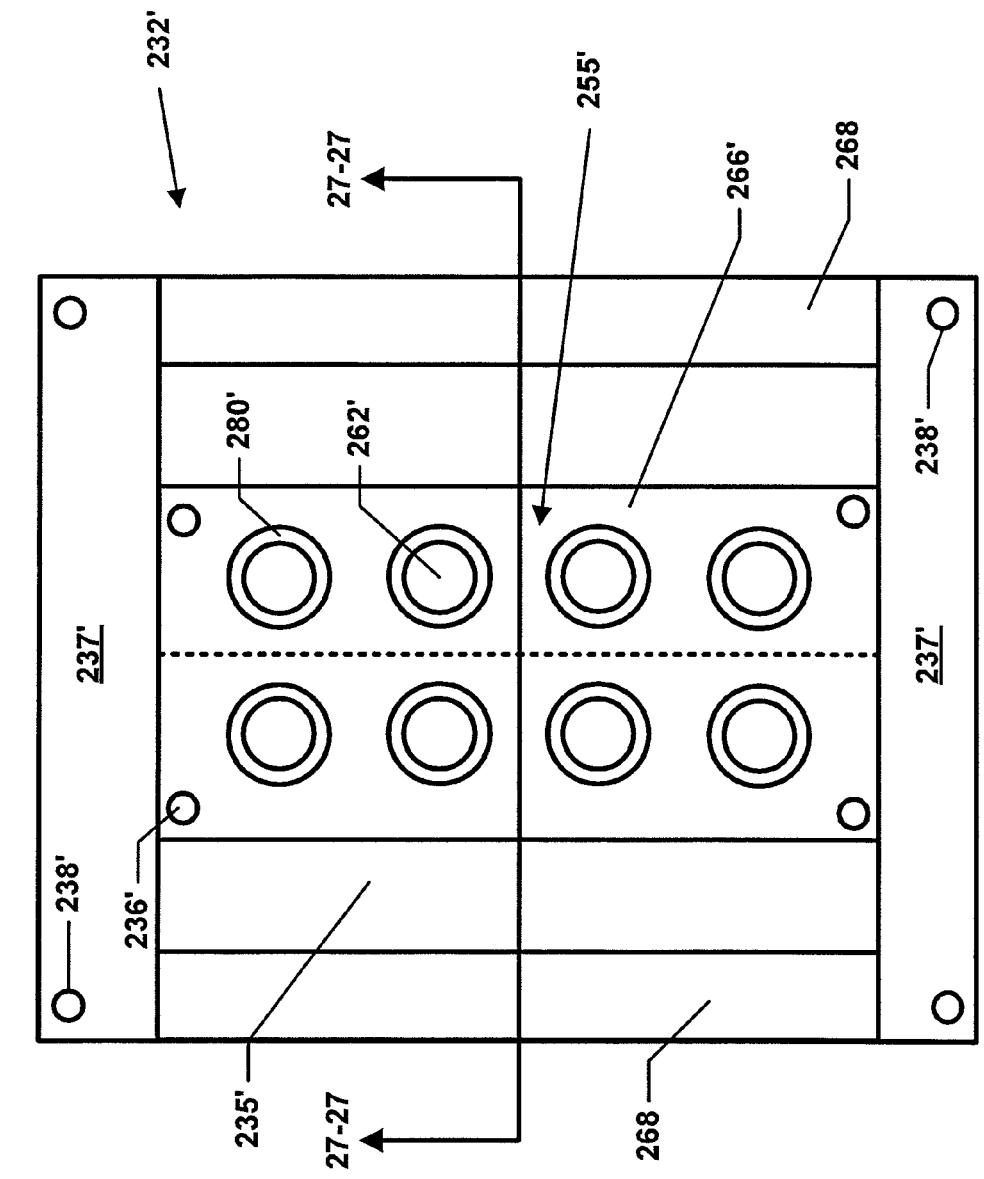
FIG. 26 is a top view of the secondary compartment of FIG. 24.
Figure 27:
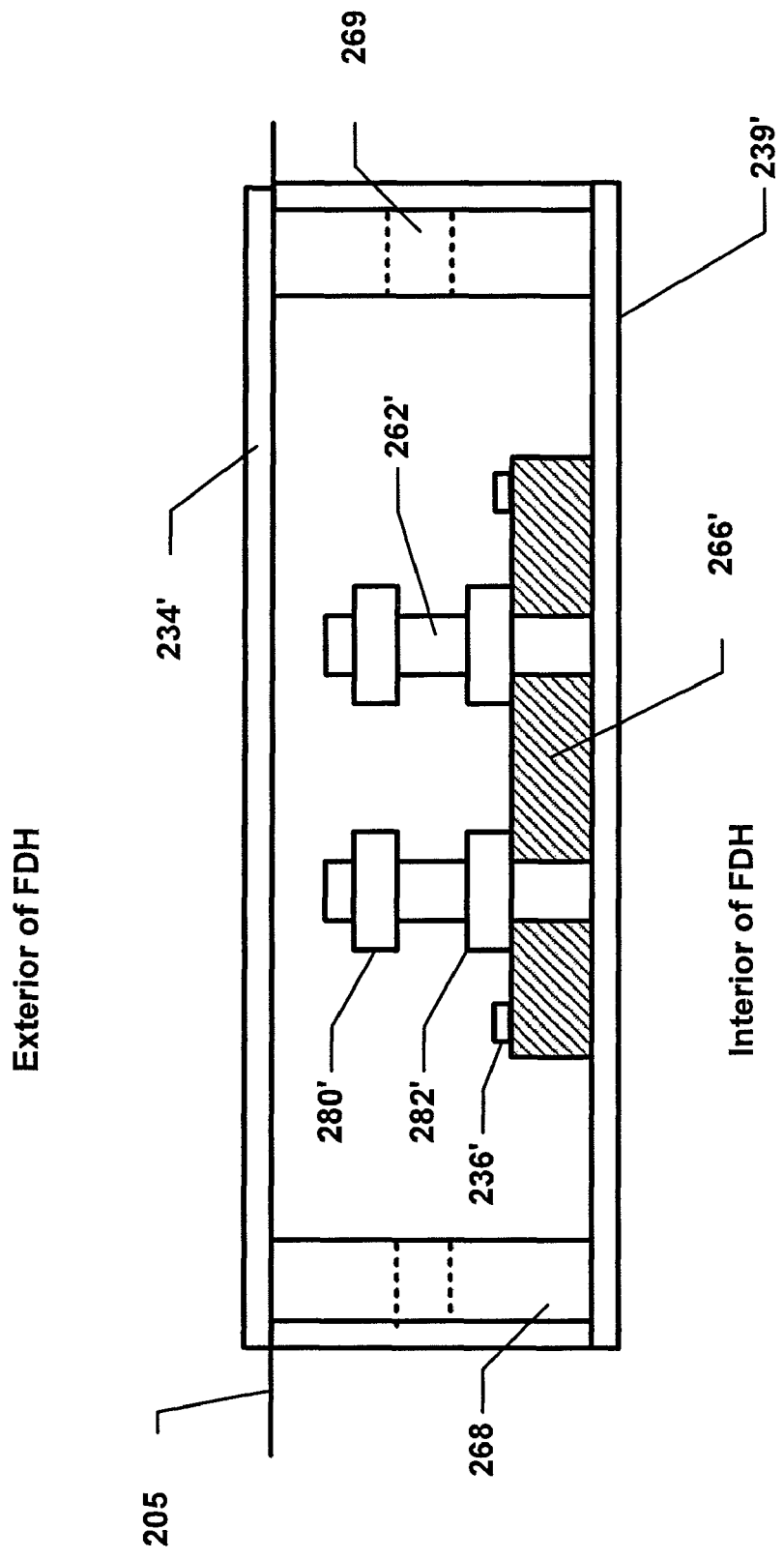
FIG. 27 is a cross-sectional view taken along the 27-27 line of FIG. 26.

FIGS. 26-27 show one example mounting configuration for the bus plate 266'. As shown, each cable grounding post 262' has a base end secured (e.g., welded, press-fit, or otherwise fixed) within an opening defined by the bus plate 266'. First and second nuts 280', 282' are provided on each of the cable grounding posts 262' for use in connecting the wires 252', 253' to the grounding posts 262' (FIG. 28).

Figure 28:
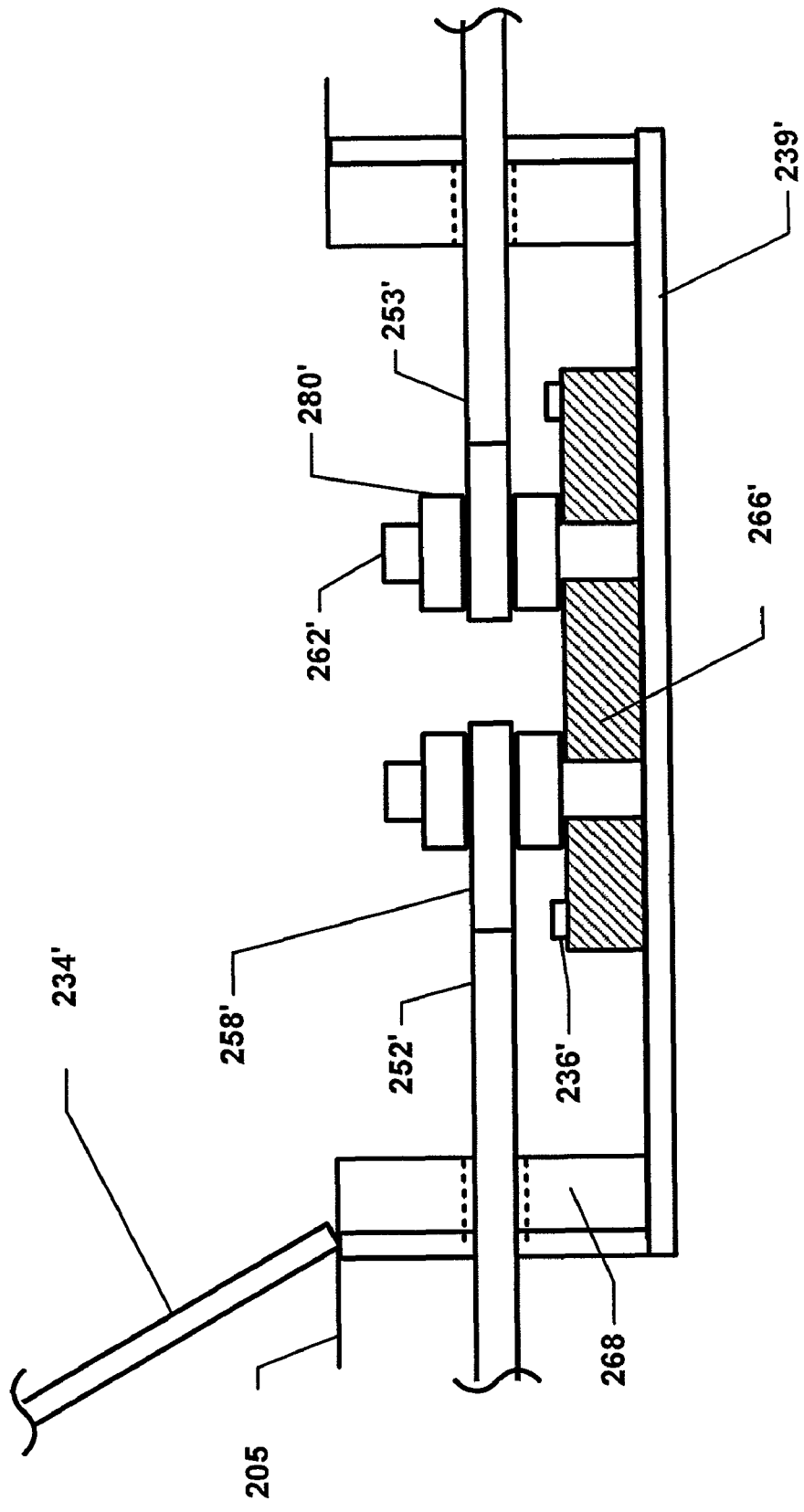
FIG. 28 is the cross-sectional view of FIG. 27 with grounding wires extending into the secondary compartment and coupling to grounding posts within the secondary compartment.
Figure 29:
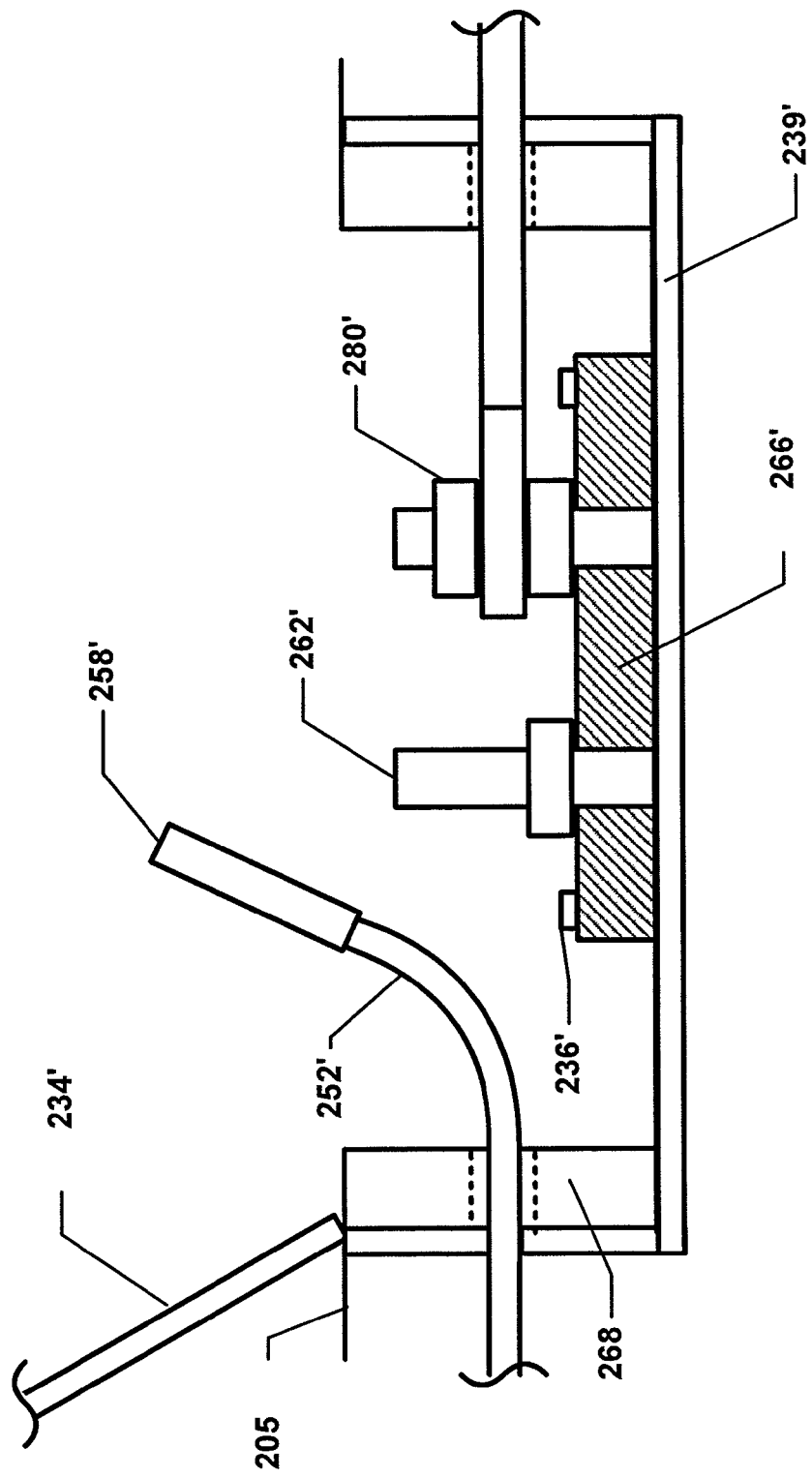
FIG. 29 is the cross-sectional view of FIG. 28, except one of the grounding wires has been disengaged from one of the grounding posts.

For example, an electrical contact 258' on one end of a wire 252' can be clamped between the first and second nuts 280', 282' as shown in FIG. 28. In some embodiments, dielectric insulating washers (not shown) can be mounted between the electrical contact and the first nut 280' and between the electrical contact and the second nut 282' to electrically isolate the electrical contact from the nuts 280', 282'.

When it is desirable to disconnect the shield of a cable from ground and to isolate the selected cable from the other cables, the electrical contact 258' on the wire 252' is removed from the grounding post 262'. The electrical contact 258' is removed by first removing the first nut 280' from the post 262' and then pulling the electrical contact 258' off of the post 262'. With the electrical contact removed, the selected electrical wire 252' is disconnected from ground while the grounding post 262' remains grounded. This allows a locator signal to be easily directed through the electrical wire 252' to the shield of the cable desired to be located.

It will be appreciated that the fiber distribution hub 200 can be manufactured in a variety of different sizes. However, to promote manufacturing efficiency, it is preferred for the splitters to be manufactured with pigtails having uniform lengths. To accommodate the different sizes of fiber distribution hubs, the pigtails are preferably designed long enough to work in the largest fiber distribution hub expected to be used. For the smaller distribution hubs, excess length provided in the pigtails can be taken up by wrapping the excess length around at fiber storage areas. For example, the excess length can be wrapped around spools 252, 254 (see FIG. 7) provided at the top of the swing frame.

Figure 30:
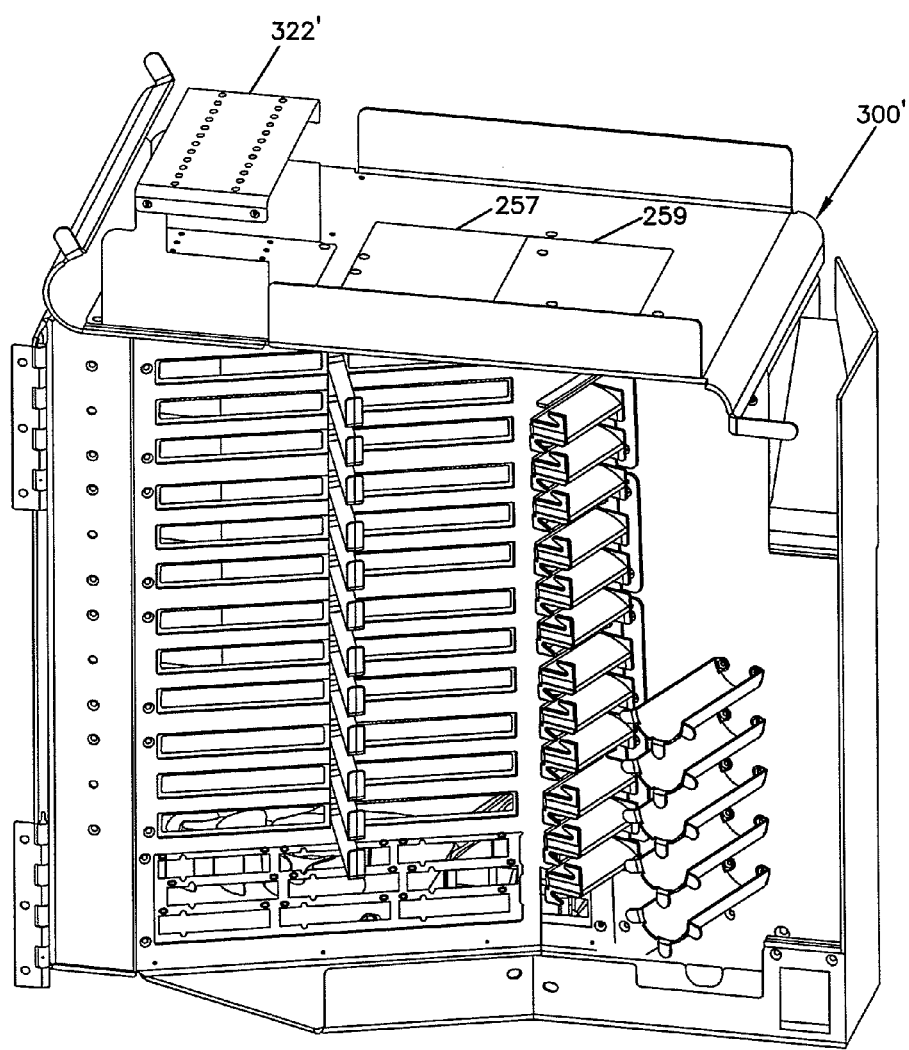
FIG. 30 is a perspective view of an alternative swing frame.
Figure 31:
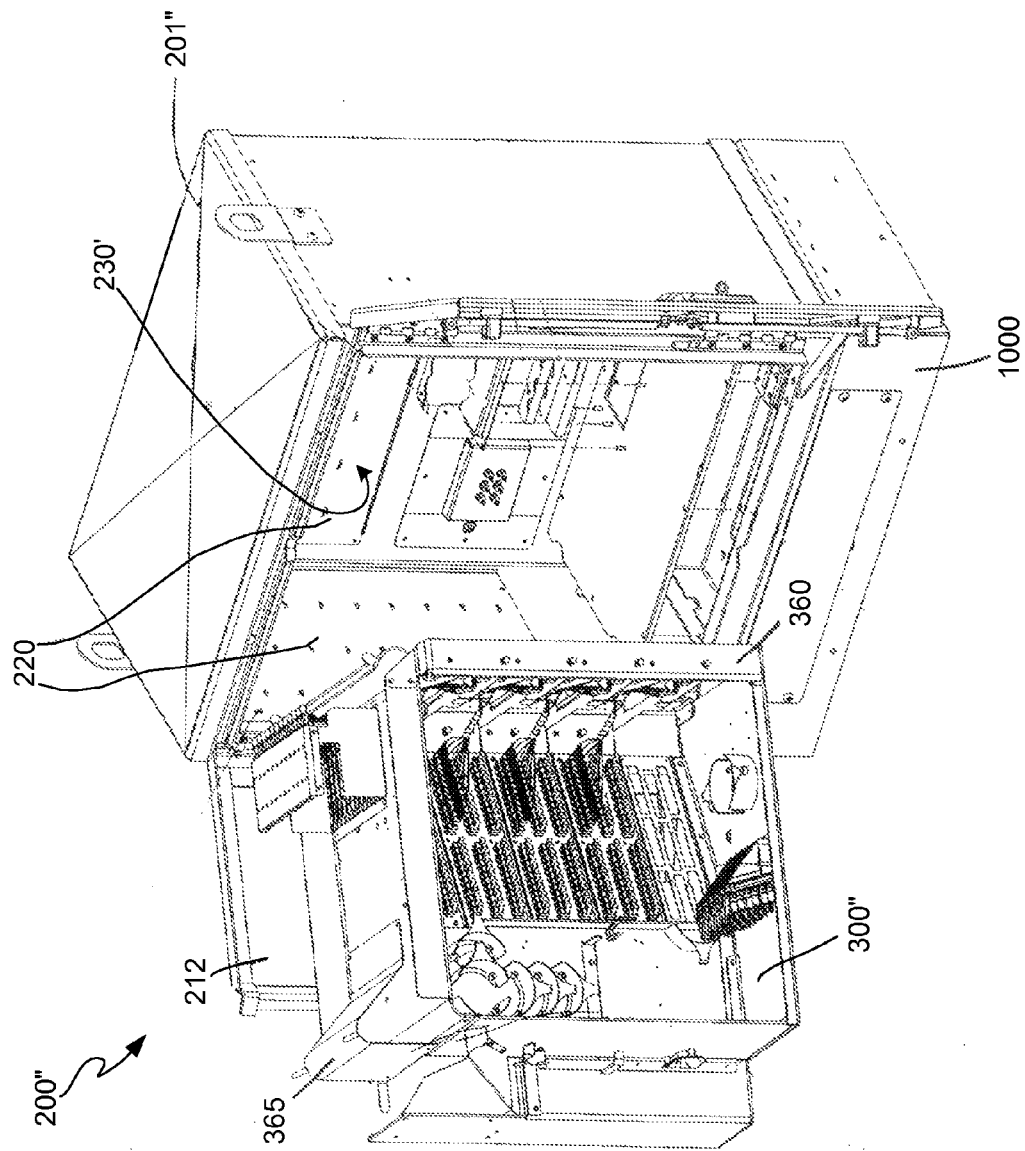
FIG. 31 is a perspective view of yet another fiber distribution hub (FDH) with the swing frame swung out.
Figure 32:
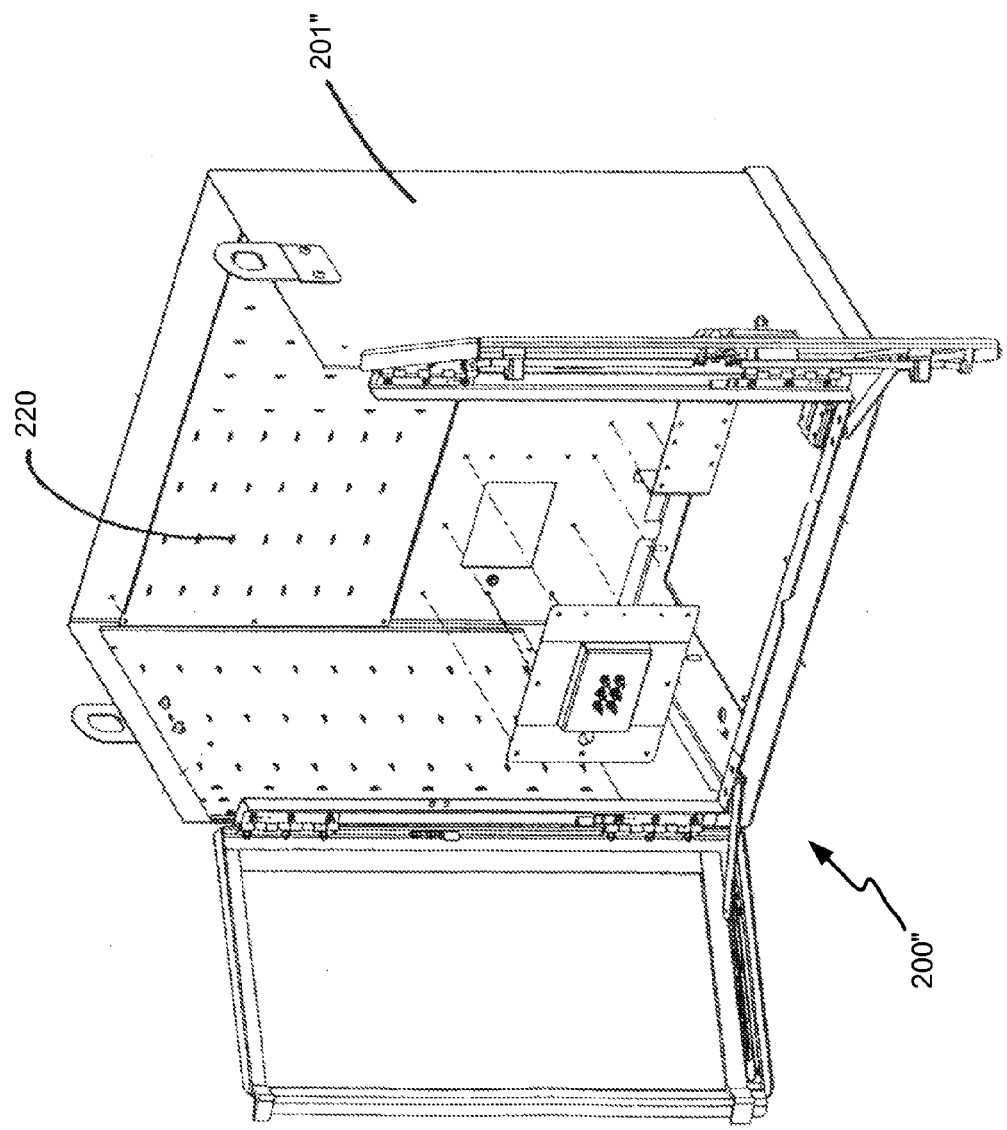
FIG. 32 is a front perspective view of the FHD of FIG. 31 with the top panel and the swing frame removed to enable viewing of the interior of the FDH.

FIG. 30 shows a swing frame 300' that utilizes an alternative technique for using pigtails of uniform length in different sized fiber distribution hubs. The swing frame 300' of FIG. 30 has a splitter module housing 322' mounted at the front, top left side of the swing frame. To account for different dimensions on different size swing frames, the splitter mount can be mounted at different locations on the top side of the swing frame. For example, if the standard size pigtail is too short to reach the termination panel on a given swing frame with the splitter mount located at the far left corner of the top of the swing frame, the splitter mount can be moved to a middle mounting location 257, or a right mounting location 259 so that additional length is provided to the pigtails.

Referring now to FIGS. 31-34, yet another fiber distribution hub (FDH) 200" having features in accordance with the principles of the present disclosure is shown. The fiber distribution hub 200" includes another example cabinet 201". The cabinet 201" has been modified to include cable management panels 220 mounted to the back panel 205 and/or the side panels 204, 206 of the cabinet 201" (see FIGS. 31 and 32). The cable management panels 220 can include tie loops 222 that are punched into the panels 220. The tie loops 222 allow cable ties to be threaded there through to secure one or more cables in a fixed position with respect to the panels 204-206 of the cabinet 201".

Figure 33:
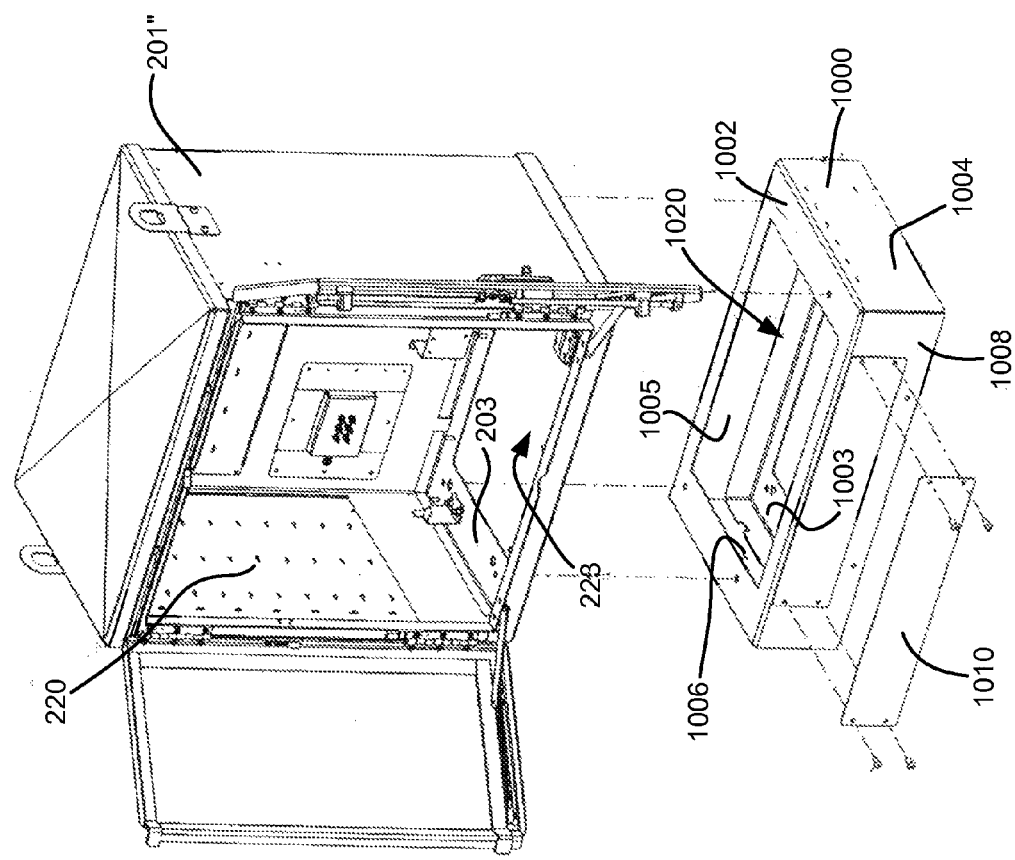
FIG. 33 is an exploded front, perspective view of the FDH of FIG. 31 with the swing frame removed.

Referring now to FIG. 33, the fiber distribution hub 200" can mount to an access compartment 1000. The access compartment 1000 includes a top panel 1002, a bottom panel 1003, a right side panel 1004, a left side panel 1006, a back panel 1005, and a front panel 1008. These panels 1002-1006 and 1008 define an interior 1020. The top panel 1002 defines an opening configured to align with an opening defined in a bottom panel 203' of the cabinet 201" when the cabinet 201" is mounted to the access compartment 1000. The bottom panel 1003 defines a cable access opening.

In some embodiments, the fibers of the feeder cable 700 and the subscriber cable 708 are optically coupled to stub cable fibers from the cabinet 201' within the access compartment 1000. The optical connection can be accessed through an opening defined in the front panel 1008. The opening in the front panel 1008 is normally covered by a removable access panel 1010 or by a door.

Figure 34:
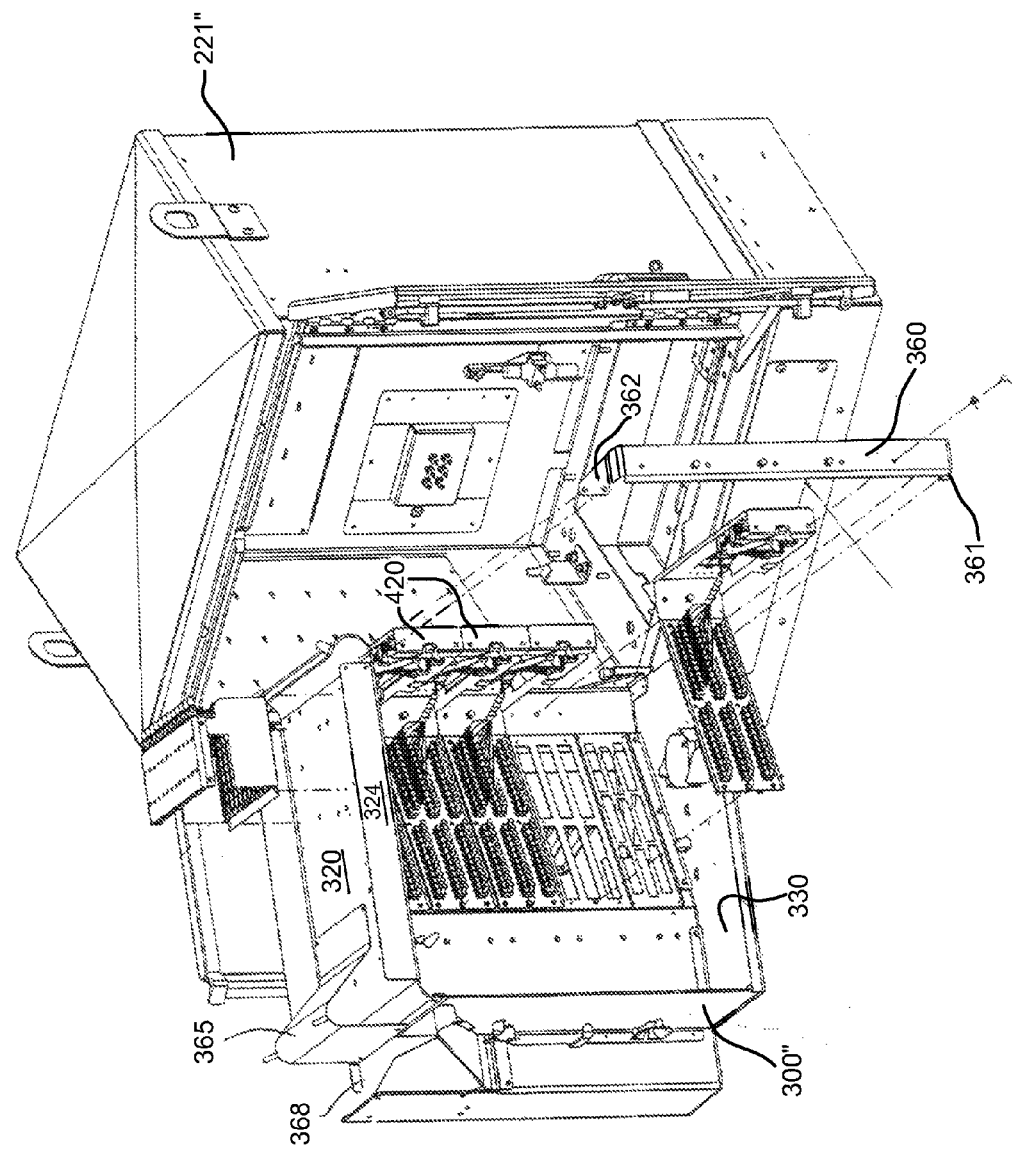
FIG. 34 is a front, perspective view of the FDH of FIG. 31 with one termination module and a frame member exploded from the swing frame.

Referring now to FIG. 34, the cabinet 201" houses another swing frame 300". The swing frame 300" is pivotally mounted within the primary compartment 230' (FIG. 31) of the cabinet 201". In general, the swing frame 300" has substantially the same component regions as swing frame 300 described above. The swing frame 300" has been modified from swing frame 300, however, to include a frame member 360 mounted to the rear of the swing frame 300" to secure the end of the management leg 420 of each termination module 400 opposite the termination leg 410.

The frame member 360 provides support for the termination modules 400 and, in particular, supports the weight of the management legs 420 after cables have been routed through the termination modules 400. The frame member 360 generally extends between the top panel 320 and the bottom panel 330 of the swing frame 300". In a preferred embodiment, one end 361 of the frame member 360 secures to the bottom panel 330 and an opposite end 362 secures to the flange 324 of the top panel 320.

The swing frame 300" also includes a ramp 365 coupled to the top panel 320 of the swing frame 300". The ramp 365 is positioned adjacent the end 329 of the top panel in place of the partial fiber spool 966 and bend limiter 968 (compare FIG. 34 with FIG. 7). The ramp 365 inhibits the fibers from bending beyond a minimum bend radius when the fibers transition from the top panel 320 to the front 302 of the swing frame 300". The ramp 365 can also take up (i.e., store) excess slack in the fiber. The ramp 365 can include tabs 368 to inhibit fiber from spilling off the sides of the ramp 365. In a preferred embodiment, the ramp 365 is removable.

The above specification, examples and data provide a complete description of the manufacture and use of the invention. Since many embodiments of the invention can be made without departing from the spirit and scope of the invention, the invention resides in the claims hereinafter appended.

We claim:

1. A telecommunications distribution hub comprising:
a cabinet defining a primary compartment, the cabinet also including one or more main doors for accessing the primary compartment;
telecommunications equipment mounted within the primary compartment;
a secondary compartment that can be accessed from an exterior of the cabinet without accessing the primary compartment;
a plurality of cable grounding terminals having first ends accessible from the primary compartment and second ends accessible from the secondary compartment, the first ends being adapted to be electrically connected to shields of shielded cables routed to the cabinet; and
a cabinet grounding terminal electrically connected to the cabinet, the cabinet grounding terminal being adapted to be electrically connected to ground and to the cable grounding terminals.

2. The telecommunications distribution hub of claim 1, wherein the cable grounding terminals can be isolated from one another from the secondary compartment.

3. The telecommunications distribution hub of claim 1, wherein the cable grounding terminals can be disconnected from ground from the secondary compartment.

4. The telecommunications distribution hub of claim 1, wherein the telecommunications equipment includes a termination region including a plurality of optical adapters.

5. The telecommunications distribution hub of claim 4, wherein the termination region is located on a swing frame disposed in the primary compartment.

6. The telecommunications distribution hub of claim 4, wherein the telecommunications equipment also includes a storage region including at least one storage module.

7. The telecommunications distribution hub of claim 6, wherein the storage region is located on a swing frame disposed in the primary compartment.

8. The telecommunications distribution hub of claim 4, wherein the telecommunications equipment also includes a splitter region including at least one optical splitter module.

9. The telecommunications distribution hub of claim 8, wherein the splitter region is located on a swing frame disposed in the primary compartment.

10. The telecommunications distribution hub of claim 1, wherein the cabinet includes a secondary door that covers the secondary compartment when closed and provides access to the secondary compartment when open, the secondary door not providing access to the primary compartment when the secondary door is open.

11. A telecommunications distribution hub comprising:
a cabinet defining a primary compartment, the cabinet also including one or more main doors for accessing the primary compartment;
telecommunications equipment mounted within the primary compartment;
a secondary compartment that can be accessed from an exterior of the cabinet without accessing the primary compartment; and
a cable grounding interface accessible from within the secondary compartment, wherein cables routed inside the primary compartment have shields electrically connected to the grounding interface, and wherein by accessing the cable grounding interface at the secondary compartment the cables shields can be electrically disconnected from ground without entering the primary compartment.

12. The telecommunications distribution hub of claim 11, wherein by accessing the cable grounding interface at the secondary compartment from the exterior of the cabinet, a locate signal can be sent through the cable shields from the exterior of the cabinet.

13. The telecommunications distribution hub of claim 12, wherein by accessing the cable grounding interface at the secondary compartment from the exterior of the cabinet, the cable shields can be electrically isolated from one another.

14. The telecommunications distribution hub of claim 11, wherein the telecommunications equipment includes a termination region including a plurality of optical adapters.

15. The telecommunications distribution hub of claim 14, wherein the termination region is located on a swing frame disposed in the primary compartment.

16. The telecommunications distribution hub of claim 14, wherein the telecommunications equipment also includes a storage region including at least one storage module.

17. The telecommunications distribution hub of claim 16, wherein the storage region is located on a swing frame disposed in the primary compartment.

18. The telecommunications distribution hub of claim 14, wherein the telecommunications equipment also includes a splitter region including at least one splitter module.

19. The telecommunications distribution hub of claim 18, wherein the splitter region is located on a swing frame disposed in the primary compartment.

20. The telecommunications distribution hub of claim 11, wherein the cabinet includes a secondary door that covers the secondary compartment when closed and provides access to the secondary compartment when open, the secondary door not providing access to the primary compartment when the secondary door is open.

* * * * *